United States Patent
Liu et al.

(10) Patent No.: US 11,429,021 B2
(45) Date of Patent: Aug. 30, 2022

(54) DNA NANOSTRUCTURE PATTERNED TEMPLATES

(71) Applicant: University of Pittsburgh—Of the Commonwealth System of Higher Education, Pittsburgh, PA (US)

(72) Inventors: Haitao Liu, Pittsburgh, PA (US); Cheng Tian, Shanghai (CN); Hyo Jeong Kim, Pittsburgh, PA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 676 days.

(21) Appl. No.: 15/993,579

(22) Filed: May 30, 2018

(65) Prior Publication Data

US 2018/0348629 A1    Dec. 6, 2018

Related U.S. Application Data

(60) Provisional application No. 62/513,154, filed on May 31, 2017.

(51) Int. Cl.
| | |
|---|---|
| G03F 7/00 | (2006.01) |
| B29C 33/38 | (2006.01) |
| B32B 3/00 | (2006.01) |
| B05D 1/00 | (2006.01) |
| B32B 13/00 | (2006.01) |
| B32B 11/02 | (2006.01) |
| B05D 5/00 | (2006.01) |

(52) U.S. Cl.
CPC ........ *G03F 7/0002* (2013.01); *B29C 33/3842* (2013.01); *B05D 1/60* (2013.01); *B05D 5/00* (2013.01); *B32B 3/00* (2013.01); *B32B 11/02* (2013.01); *B32B 13/00* (2013.01)

(58) Field of Classification Search
CPC ..... G03F 7/0002; B29C 33/3842; B32B 3/00; B32B 13/00; B32B 11/02; B05D 1/60; B05D 5/00
See application file for complete search history.

(56) References Cited

U.S. PATENT DOCUMENTS

2013/0340929 A1* 12/2013 Lee ........................ G03F 7/2004
156/233

OTHER PUBLICATIONS

Qu, JieHao, et al. "Scalable lithography from Natural DNA Patterns via polyacrylamide gel." Scientific reports 5.1 (2015): 1-8. (Year: 2015).*

(Continued)

*Primary Examiner* — Leith S Shafi
(74) *Attorney, Agent, or Firm* — Bartony & Associates, LLC

(57) ABSTRACT

A method of forming a patterned device includes depositing at least one nanostructure comprising self-assembled nucleic acids formed into a predetermined conformation upon a surface of a substrate, depositing a stabilizing layer of material mechanically stronger than the at least one nanostructure over the at least one nanostructure and the surface of the substrate to form a positive pattern template, depositing a layer of a first polymer over the positive pattern template, and removing the layer of the first polymer from connection with the positive pattern template, wherein the layer of the first polymer includes a surface having a negative imprint of the positive pattern template.

20 Claims, 35 Drawing Sheets

(56) References Cited

OTHER PUBLICATIONS

Surwade, Sumedh P., et al. "Nanoscale growth and patterning of inorganic oxides using DNA nanostructure templates." Journal of the American Chemical Society 135.18 (2013): 6778-6781. (Year: 2013).*

Zhou, Feng, et al. "Programmably shaped carbon nanostructure from shape-conserving carbonization of DNA." ACS nano 10.3 (2016): 3069-3077. (Year: 2016).*

Li, Hai, et al. "A universal, rapid method for clean transfer of nanostructures onto various substrates." ACS nano 8.7 (2014): 6563-6570. (Year: 2014).*

Ke, Y. et al., DNA Brick Crystals with Prescribed Depths. Nat. Chem. 2014, 6, 994-1002.

He, Y. et al.; Self-Assembly of Hexagonal DNA Two-Dimensional (2D) Arrays. J. Am. Chem. Soc. 2005, 127, 12202-12203m.

Lee, J. et al.; Coverage Control of DNA Crystals Grown by Silica Assistance. Angew. Chem., Int. Ed. 2011, 50, 9145-9149.

Sun, X. P. et al.; Surface-Mediated DNA Self-Assembly. J. Am. Chem. Soc. 2009, 131, 13248-13249.

Rothemund, P. W. K. Folding DNA to Create Nanoscale Shapes and Patterns. Nature 2006, 440, 297-302.

Hung, A. M. et al.; Large-Area Spatially Ordered Arrays of Gold Nanoparticles Directed by Lithographically Confined DNA Origami. Nat. Nanotechnol. 2010, 5, 121-126.

Liu, H. P. et al.; Approaching the Limit: Can One DNA Oligonucleotide Assemble into Large Nanostructures? Angew. Chem., Int. Ed. 2006, 45, 1942-1945.

Schneider, C. A. et al.; NIH Image to ImageJ: 25 Years of Image Analysis. Nat. Methods 2012, 9, 671-675.

Truong, Tu T. et al; Soft Lithography Using Acryloxy Perfluoropolyether Composite Stamps; Langmuir 2007, 23, 2898-2905.

Qu, JieHao et al.; Scalable lithography from Natural DNA Patterns via polyacrylamide gel; 2015, Nature.com, 1-8.

Hua, Feng et al.; Polymer Imprint Lithography with Molecular-Scale Resolution; Nano Lett., 2004, vol. 4, No. 12, 2467-2471.

Tian, C. et al.; "DNA Nanostructures Mediated Molecular Imprinting Lithography." 60th International Conference Electron, Ion, and Photon Beam Technology and Nanofabrication (EIPBN). Pittsburgh, PA Jun. 1, 2016 (Poster).

Tian, C. et al.; A DNA-Based Fabrication of Polymer Stamps with Diverse Nanoscale Features., ACS Nano, 2017, 11(1), pp. 227-238.

* cited by examiner

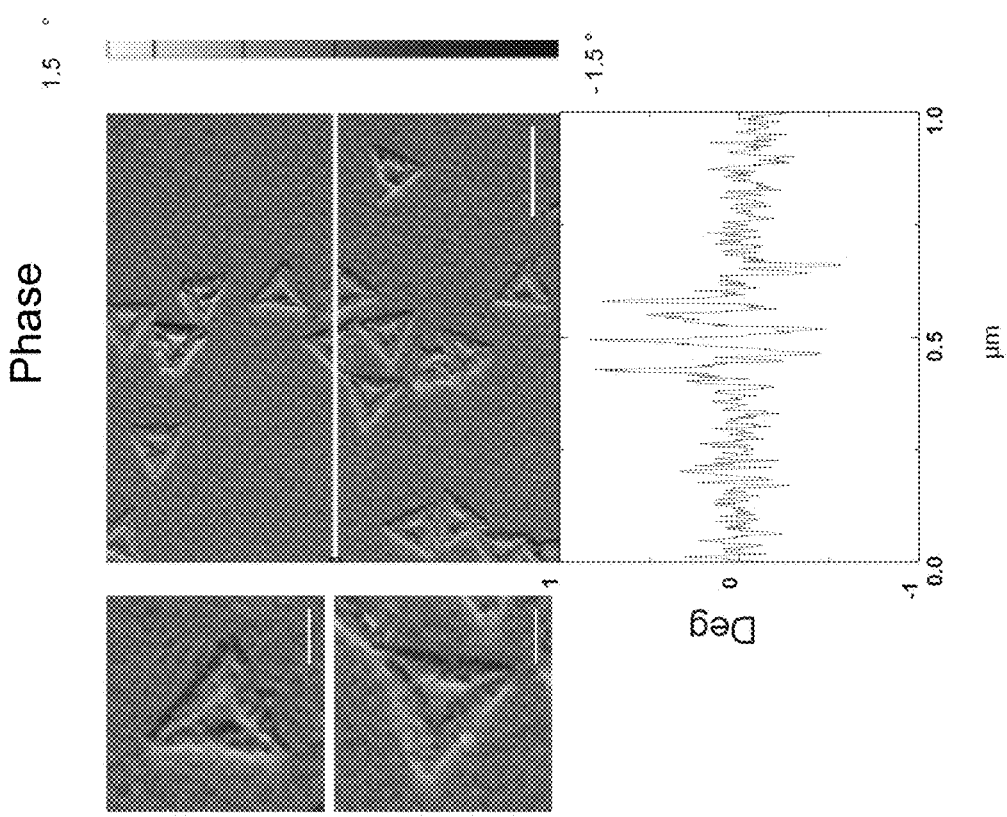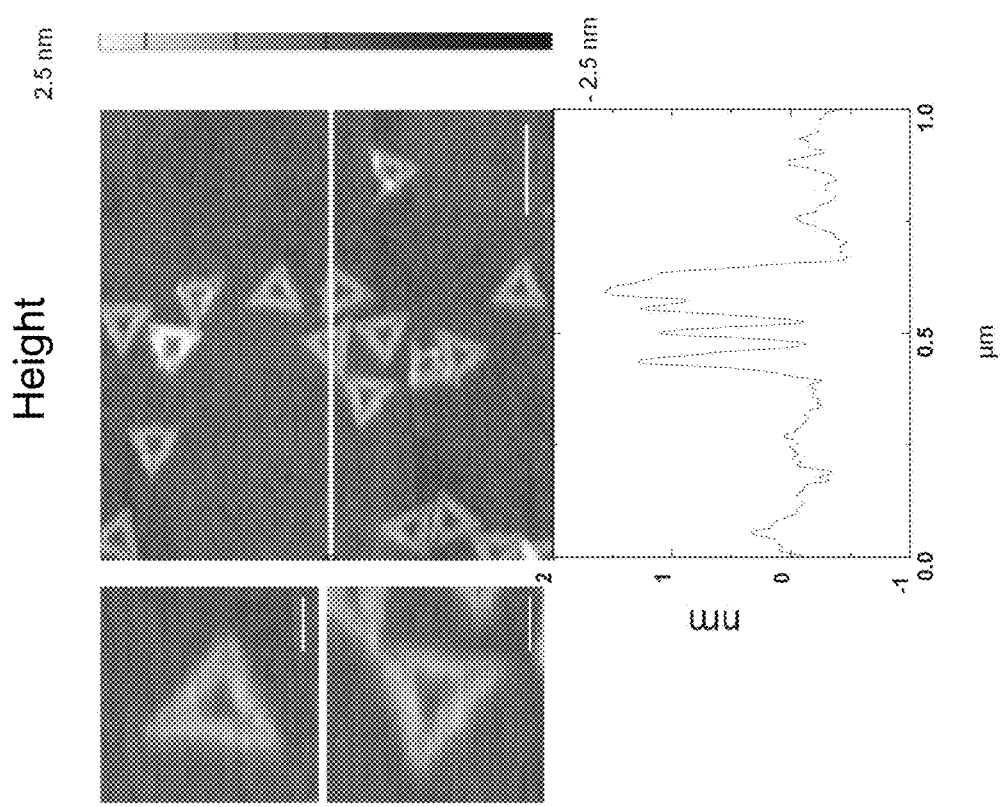
Fig. 7B

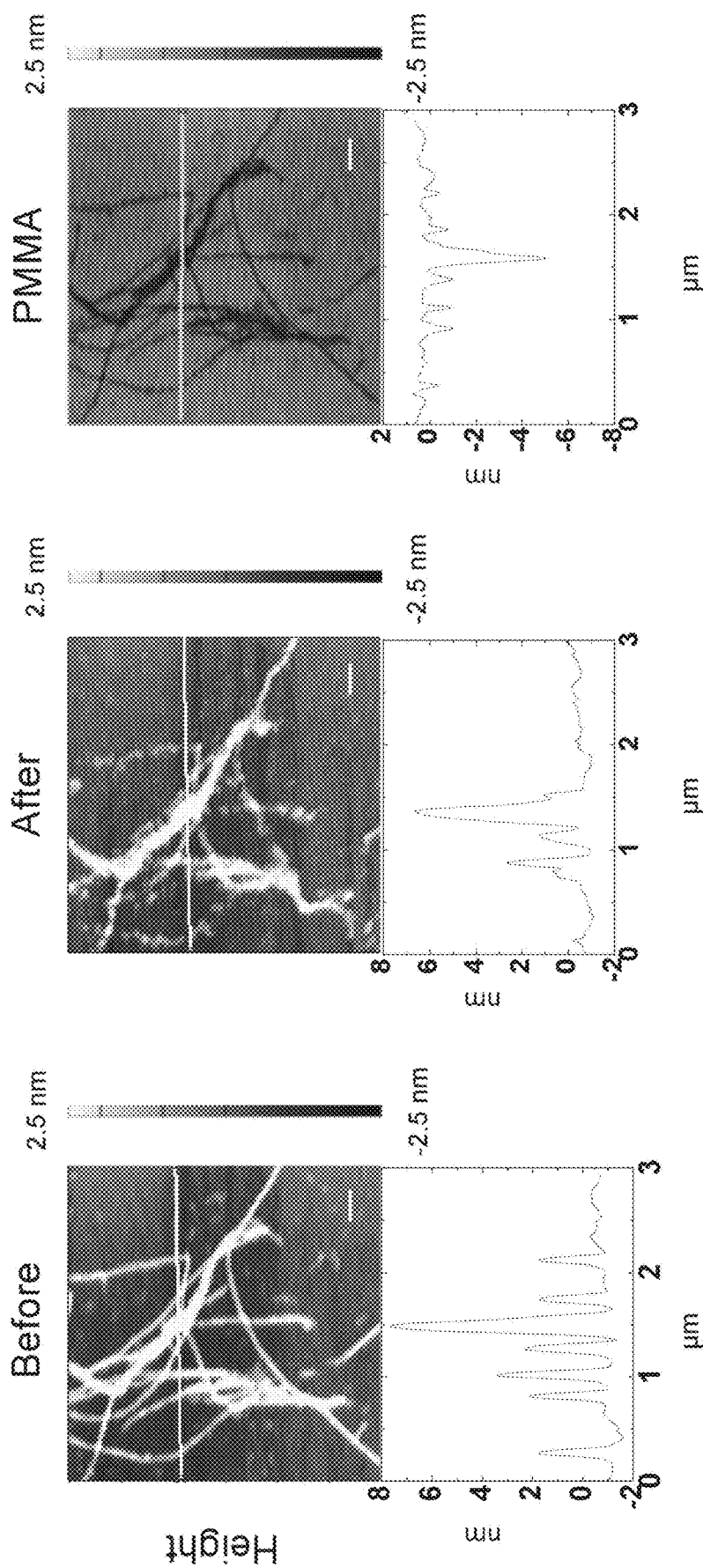

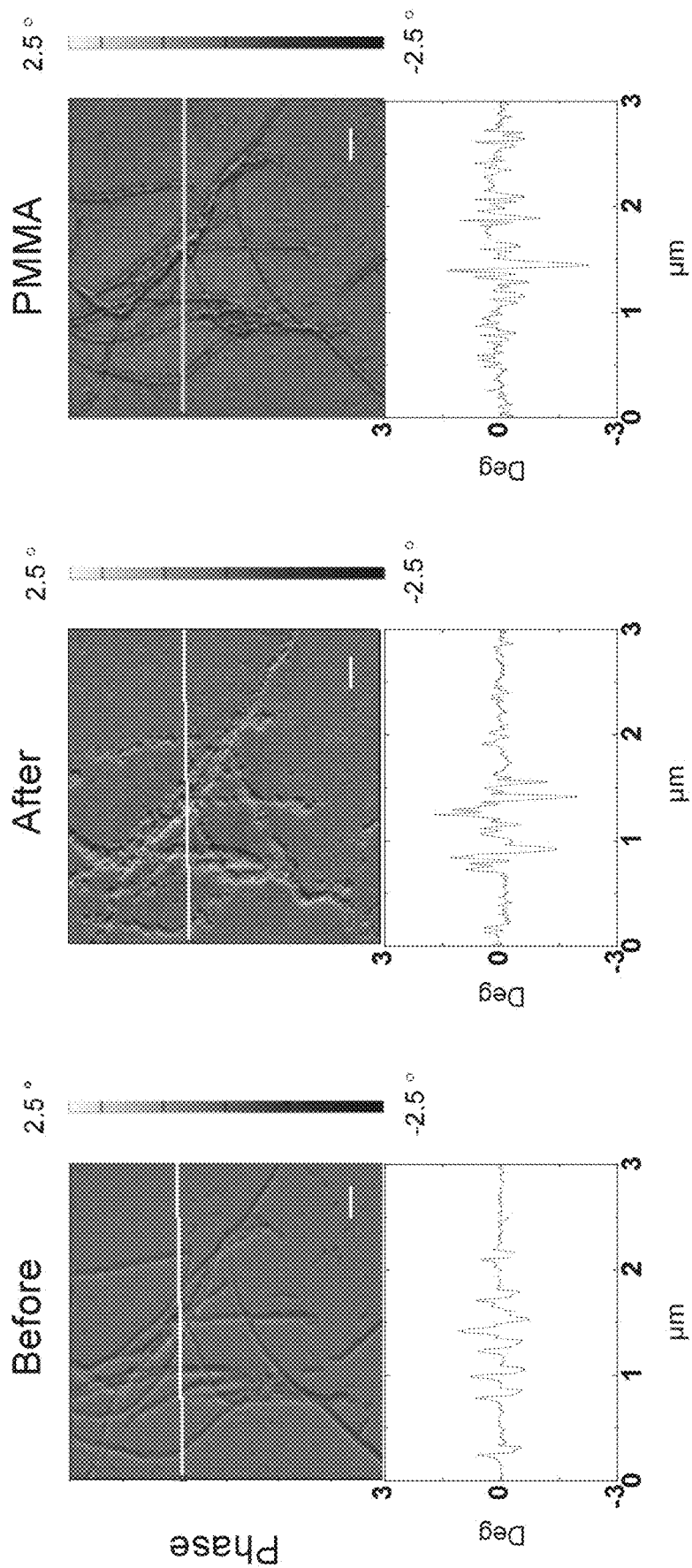

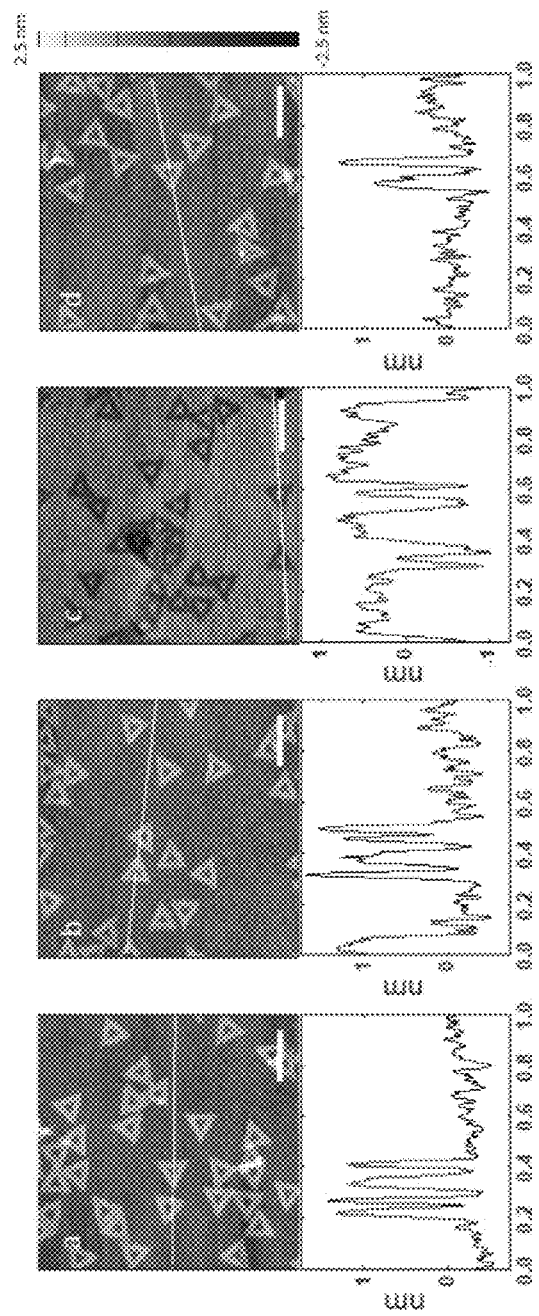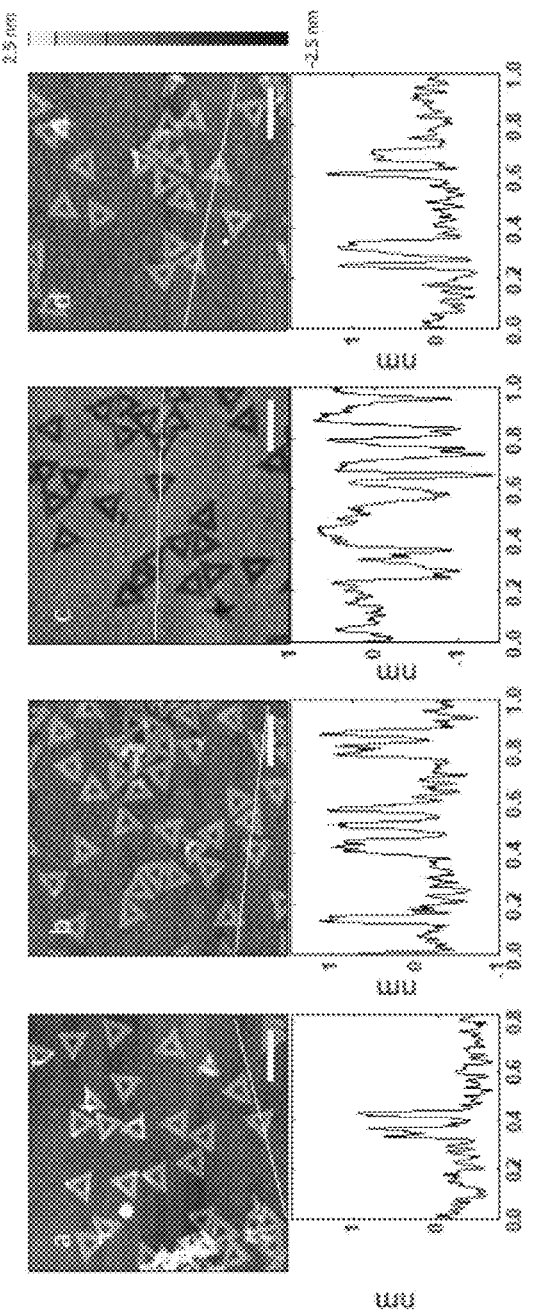
Fig. 16A  Fig. 16B  Fig. 16C  Fig. 16D

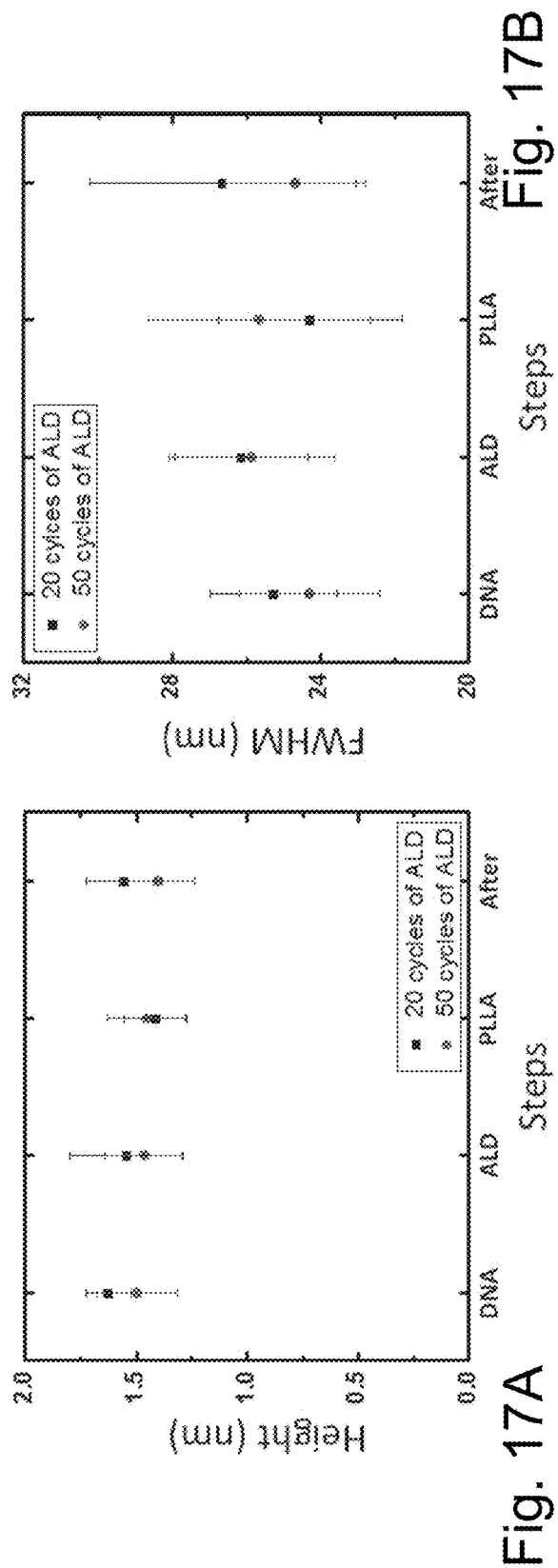
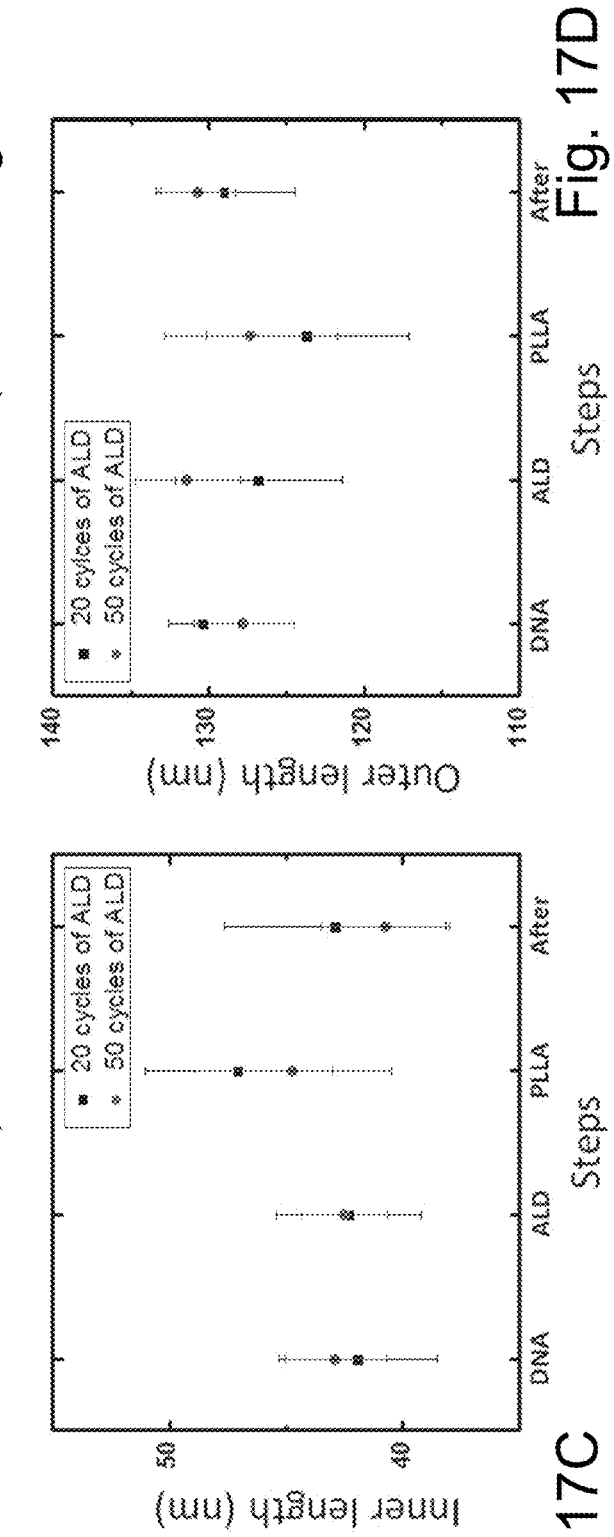
Fig. 17A  Fig. 17B  Fig. 17C  Fig. 17D

DNA NANOSTRUCTURE PATTERNED TEMPLATES

CROSS-REFERENCE TO RELATED APPLICATIONS

This application claims benefit of U.S. Provisional Patent Application Ser. No. 62/513,154, filed May 31, 2017, the disclosure of which is incorporated herein by reference.

GOVERNMENTAL INTEREST

This invention was made with government support under grant nos. N000141310575 and N000141512520 awarded by the Office of Naval Research. The government has certain rights in this invention.

BACKGROUND

The following information is provided to assist the reader in understanding technologies disclosed below and the environment in which such technologies may typically be used. The terms used herein are not intended to be limited to any particular narrow interpretation unless clearly stated otherwise in this document. References set forth herein may facilitate understanding of the technologies or the background thereof. The disclosure of all references cited herein are incorporated by reference.

Soft lithography uses a stamp to transfer micro- and nano-scale patterns. The stamp is usually fabricated by casting a liquid precursor onto a master template with patterned structures. Soft lithography has been well developed and widely used for nanofabrication because of its simplicity, low cost, and compatibility with a wide range of substrates, especially soft materials and nonplanar surfaces. The application of soft lithography, however, is fundamentally limited by the spatial resolution and diversity of the structures on the stamp.

Significant efforts have been put into the preparation of master templates, from which the stamp is derived. Conventional lithography methods, such as photolithography and electron-beam (e-beam) lithography, are the most general approaches to fabricating master templates. One-step, 193-nm photolithography is widely used. However, it is not suitable for the fabrication of nanostructures with spacing less than 40 nm as a result of its diffraction-limited resolution. Although e-beam lithography can provide sub-10-nm resolution, the massive production of the master template is hindered by the high cost of this method. In addition to the conventional lithographic methods, dip-pen nanolithography, indentation lithography, nanosphere lithography, and block copolymer lithography have been applied to offer nanoscale and even sub-10-nm features. Other relief structures such as crystallographic steps, cracks, and single-walled carbon nanotubes have also been used to provide features with sub-nanometer or molecular-scale resolution. However, it remains a challenge to develop a general method of constructing master templates and stamps with diverse nanoscale features and high spatial resolution.

In one stamp fabrication method, a pattern of single-walled carbon nanotubes (SWNTs) was replicated to high-modulus (~10 MPa) polydimethylsiloxane or PDMS as well to an acryloxy perfluoropolyether. In that method, SWNTs were attached to the silicon wafer through relatively weak van der Waals interaction. An anti-adhesion silane layer was deposited on the template substrate (a silicon wafer) when PDMS was used to reduce adhesion of PDMS to the silicon wafer.

In recent years, programmable DNA self-assembly has produced a wide range of one-dimensional (1D), two-dimensional (2D) and three-dimensional (3D) nanostructures with diverse and complex features. Assembled DNA nanostructures can be rationally designed and reliably synthesized. The assembly process is fast and easily implemented. Self-assembled DNA nanostructures may be desirable for use as a nanofabrication template because of the ease of controlling their shapes with nanometer-scale spatial resolution. Indeed, a number of approaches have been developed to transfer the pattern of DNA nanostructures to a range of materials.

For example, DNA nanostructures have been employed as masks to transfer the pattern to evaporated noble metal films. Metallization has also been achieved through wet chemistry, and the resulting metal nanostructures have been used to pattern graphene. By exploiting the difference in adsorption of water between DNA nanostructures and a $SiO_2$ substrate, DNA nanostructures have been used to modulate the rate of HF vapor phase etching to achieve pattern transfer to the $SiO_2$ substrate. Based on the same principle, adsorption of water could control the rate of chemical vapor deposition of $SiO_2$ and $TiO_2$ on the DNA nanostructures and substrate to convert the pattern of DNA nanostructures into that of inorganic oxides. In addition to the 2D pattern transfer, DNA 3D nanostructures have served as molds to synthesize inorganic nanostructures with prescribed 3D shapes.

$Al_2O_3$ protected DNA nanostructures have been converted to carbon nanostructures by thermal annealing. A dense layer of protective layer of $Al_2O_3$ was provided to prevent escape of decomposition gases during a high-temperature carbonization and thereby maintain the original conformation/shape of the underlying DNA nanostructure in the final carbonized composition. No forces were applied to the $Al_2O_3$ or other inorganic oxide protective layer in the process of carbonization. Mechanical strength of the protective layer was not relevant to the process. The $Al_2O_3$ or other inorganic oxide protective layer was removed after carbonization (for example, via selective etching) to provide the carbonized composition product.

Although DNA nanostructures are promising templates for materials as a result of their structural complexity and diversity in the nanoscale, nanofabrication based on DNA nanostructures faces several formidable challenges. First, the high cost of synthetic DNA hinders its application as a master template for large scale patterning. Second, there is a lack of reliable and faithful pattern transfer methods that are compatible with existing fabrication processes because of the low mechanical and chemical stability of DNA nanostructures. Third, deterministic deposition of DNA nanostructures, which is critical to large-area fabrication, is still in its infancy. Existing approaches to controlling the deposition of DNA nanostructures suffer from low fidelity and high error rate.

A potential strategy to partially overcome these problems is to establish a method to transfer complex DNA patterns to a polymer substrate. The resulting polymer stamps can be used as templates for the following patterning process, which reduces the cost, simplifies the fabrication process and potentially overcomes the difficulties of scalable patterning. Recently, a linear DNA bundle with an average height of ca. 90 nm and an average width of ca. 879 nm was employed as a master template for the fabrication of a negative replica on an unsaturated polyester resin, which was further used to pattern a polyacrylamide gel. However, the lateral dimension of the DNA bundle was relatively large (approximately 1 μm). Moreover, the DNA patterned stamp was used only a single time.

SUMMARY

In one aspect, a method of forming a patterned device includes depositing at least one nanostructure comprising self-assembled nucleic acids formed into a predetermined conformation upon a surface of a substrate, depositing a stabilizing layer of material mechanically stronger than the at least one nanostructure over the at least one nanostructure and the surface of the substrate to form a positive pattern template, depositing a layer of a first polymer over the positive pattern template, and removing the layer of the first polymer from connection with the positive pattern template, wherein the layer of the first polymer includes a surface having a negative imprint of the positive pattern template. The method may further include, after removal of the layer of the first polymer, depositing a layer of a second polymer over the surface of the layer of the first polymer having the negative imprint to create a positive copy of the negative imprint upon a surface of the layer of the second polymer. The method may, for example, further include depositing a layer of a third polymer over the layer of the first polymer before removing the layer of the first polymer from connection with the positive pattern. In a number of embodiments, the nucleic acids comprise or consist of deoxyribonucleic acid or DNA.

In a number of embodiments, the stabilizing layer is deposited via a thin film technique. The stabilizing layer may, for example, be deposited via atomic layer deposition, vacuum deposition, sputtering, chemical vapor deposition or laser assisted deposition. The stabilizing layer may, for example, include a metal or an oxide (for example, a metal oxide or a nonmetallic, inorganic oxide—for example, a ceramic material). In a number of embodiments, the stabilizing layer comprises metal oxide or an inorganic oxide. In a number of embodiments, the stabilizing layer may include aluminum oxide ($Al_2O_3$) or silicon oxide. In a number of embodiments, the stabilizing layer includes aluminum oxide. The stabilizing layer of aluminum oxide may, for example, have a thickness in the range of 2 nm to 15 nm or in the range of 3 nm to 10 nm. Even though the thin stabilizing layers hereof are formed upon a relatively mechanically weak foundation of patterned nucleic acid, the stabilizing layers were found to provide sufficient mechanical stability to allow repeated used of pattern templates hereof.

In a number of embodiments, the layer of the first polymer is deposited upon the positive pattern in solution. The layer of the first polymer may, for example, be deposited upon the positive pattern template via spin casting.

In a number of embodiments, the at least one nanostructure has at least one dimension of no greater than 80 nm. The at least one nanostructure may, for example, have at least one dimension in the range of 1 nm to 80 nm.

In another aspect, a method of forming a patterned device includes depositing at least one nanostructure comprising self-assembled nucleic acids formed into a predetermined conformation upon a surface of a substrate to form a positive pattern template, the at least one nanostructure having at least one dimension of no greater than 80 nm, depositing a layer of a first polymer over the positive pattern template, and removing the layer of the first polymer from connection with the positive pattern template, wherein the layer of the first polymer includes a surface having a negative imprint of the positive pattern template. The at least one nanostructure may, for example, at least one dimension in the range of 1 nm to 80 nm. In a number of embodiments, the method further includes depositing a stabilizing layer of material mechanically stronger than the at least one nanostructure over the at least one nanostructure and the surface of the substrate in forming the positive pattern template. In a number of embodiments, the method further includes, after removal of the layer of the first polymer, depositing a layer of a second polymer over the surface of the layer of the first polymer having the negative imprint to create a positive copy of the negative imprint upon a surface of the layer of the second polymer. The method may, for example, further include depositing a layer of a third polymer over the layer of the first polymer before removing the layer of the first polymer from connection with the positive pattern. In a number of embodiments, the nucleic acids comprise or consist of deoxyribonucleic acid or DNA.

As described above, the stabilizing layer may, for example, be deposited via a thin film technique. The stabilizing layer may, for example, be deposited via atomic layer deposition, vacuum deposition, sputtering, chemical vapor deposition or laser assisted deposition. The stabilizing layer may, for example, include a metal or an inorganic oxide. In a number of embodiments, the stabilizing layer comprises a metal or a metal oxide. The stabilizing layer may, for example, include aluminum oxide ($Al_2O_3$) or silicon oxide. In a number of embodiments, the stabilizing layer includes aluminum oxide. The stabilizing layer of aluminum oxide may, for example, have a thickness in the range of 2 nm to 15 nm or in the range of 3 nm to 10 nm.

In a number of embodiments, the layer of the first polymer is deposited upon the positive pattern in solution. The layer of the first polymer may, for example, be deposited upon the positive pattern template via spin casting.

In a further aspect, a patterned device includes at least one nanostructure comprising self-assembled nucleic acids formed into a predetermined conformation upon a surface of a substrate, and a stabilizing layer of material mechanically stronger than the at least one nanostructure over the at least one template structure and the surface of the substrate to form a positive pattern template. The patterned device may be further formed as described above.

The patterned device may, for example, further include a layer of a first polymer deposited over the positive pattern template, wherein the layer of the first polymer is removable from connection with the positive pattern template, and wherein a removed layer of the first polymer includes a surface having a negative imprint of the positive pattern template.

In still a further aspect, a patterned device includes at least one nanostructure including self-assembled nucleic acids formed into a predetermined conformation immobilized upon a surface of a substrate to form a positive pattern template, the at least one nanostructure having at least one dimension of no greater than 80 nm. The patterned device may, for example, further include a layer of a first polymer deposited over the positive pattern template, wherein the layer of the first polymer is removable from connection with the positive pattern template, and wherein a removed layer of the first polymer includes a surface having a negative imprint of the positive pattern template.

The present devices, systems, and methods, along with the attributes and attendant advantages thereof, will best be appreciated and understood in view of the following detailed description taken in conjunction with the accompanying drawings.

BRIEF DESCRIPTION OF THE DRAWINGS

FIG. 7B illustrates AFM height (left) and phase (right) images of the DNA triangles deposited on a silicon wafer (top) and the corresponding cross-sections (bottom), wherein zoomed-in images are on the left of the corresponding images, and scale bars represent 200 nm in the zoomed-out images and 50 nm in the zoomed-in images.

FIG. 9A illustrates AFM height images (top) and corresponding cross-section (bottom) of DNA nanotubes deposited on a silicon wafer before replication to PMMA stamps, wherein the scale bar represents 300 nm.

FIG. 9B illustrates AFM height images (top) and corresponding cross-section (bottom) of the DNA of FIG. 9A at the same location on the DNA master template as FIG. 9A after the replication to PMMA stamps, wherein the scale bar represents 300 nm.

FIG. 9C illustrates AFM height images (top) and corresponding cross-section (bottom) of a PMMA replica of the same area as illustrated in FIGS. 9A and 9B, wherein the scale bar represents 300 nm, and the image was flipped horizontally to match the orientation of the DNA master template.

FIG. 9D illustrates a phase images (top) and corresponding cross-section (bottom) corresponding to FIG. 9A, wherein the scale bar represents 300 nm.

FIG. 9E illustrates a phase images (top) and corresponding cross-section (bottom) corresponding to FIG. 9B, wherein the scale bar represents 300 nm.

FIG. 9F illustrates a phase images (top) and corresponding cross-section (bottom) corresponding to FIG. 9C, wherein the scale bar represents 300 nm, and the image was flipped horizontally to match the orientation of the DNA master template.

FIG. 16A illustrates an AFM height images an corresponding cross-sectional analysis of origami triangles after deposition on a silicon wafers, wherein the scale bars represent 200 nm.

FIG. 16B illustrates an AFM height image (top) and corresponding cross-sectional analysis (bottom) of the DNA nanotubes after 20 cycles of ALD of $Al_2O_3$ (approximately 2 nm of $Al_2O_3$ film; upper) and after 50 cycles of ALD of $Al_2O_3$ (approximately 5 nm of $Al_2O_3$ film; lower), wherein the scale bars represent 200 nm.

FIG. 16C illustrates negative replicas on the PLLA stamps from the master template including an approximately 2 nm film of $Al_2O_3$ (upper) and from the master template including an approximately 5 nm film of $Al_2O_3$ film (lower), wherein the scale bars represent 200 nm.

FIG. 16D illustrates an AFM height image (top) and corresponding cross-sectional analysis (bottom) of the DNA nanotubes after 20 cycles of ALD of $Al_2O_3$ (approximately 2 nm of $Al_2O_3$ film; upper) and after 50 cycles of ALD of $Al_2O_3$ (approximately 5 nm of $Al_2O_3$ film; lower), wherein the scale bar represents 200 nm.

FIG. 17A illustrates average height (n=10) of features on DNA origami triangle master templates with an approximately 2 nm or an approximately 5 nm of $Al_2O_3$ layer and PLLA stamps at each step of fabrication process: after (DNA) DNA origami triangles were deposited on a silicon wafers, (ALD) ALD of $Al_2O_3$, and (After) pattern transfer to PLLA stamps, and (PLLA) negative replicas on the PLLA stamps.

FIG. 17B illustrates average FWHM (n=10) of features on DNA origami triangle master templates with an approximately 2 nm or an approximately 5 nm of $Al_2O_3$ layer and PLLA stamps at each step of fabrication process: after (DNA) DNA origami triangles were deposited on a silicon wafers, (ALD) ALD of $Al_2O_3$, and (After) pattern transfer to PLLA stamps, and (PLLA) negative replicas on the PLLA stamps.

FIG. 17C illustrates average inner length (n=10) of features on DNA origami triangle master templates with an approximately 2 nm or an approximately 5 nm of $Al_2O_3$ layer and PLLA stamps at each step of fabrication process: after (DNA) DNA origami triangles were deposited on a silicon wafers, (ALD) ALD of $Al_2O_3$, and (After) pattern transfer to PLLA stamps, and (PLLA) negative replicas on the PLLA stamps.

FIG. 17D illustrates average outer length (n=10) of features on DNA origami triangle master templates with an approximately 2 nm or an approximately 5 nm of $Al_2O_3$ layer and PLLA stamps at each step of fabrication process: after (DNA) DNA origami triangles were deposited on a silicon wafers, (ALD) ALD of $Al_2O_3$, and (After) pattern transfer to PLLA stamps, and (PLLA) negative replicas on the PLLA stamps.

DETAILED DESCRIPTION

Figure 1:
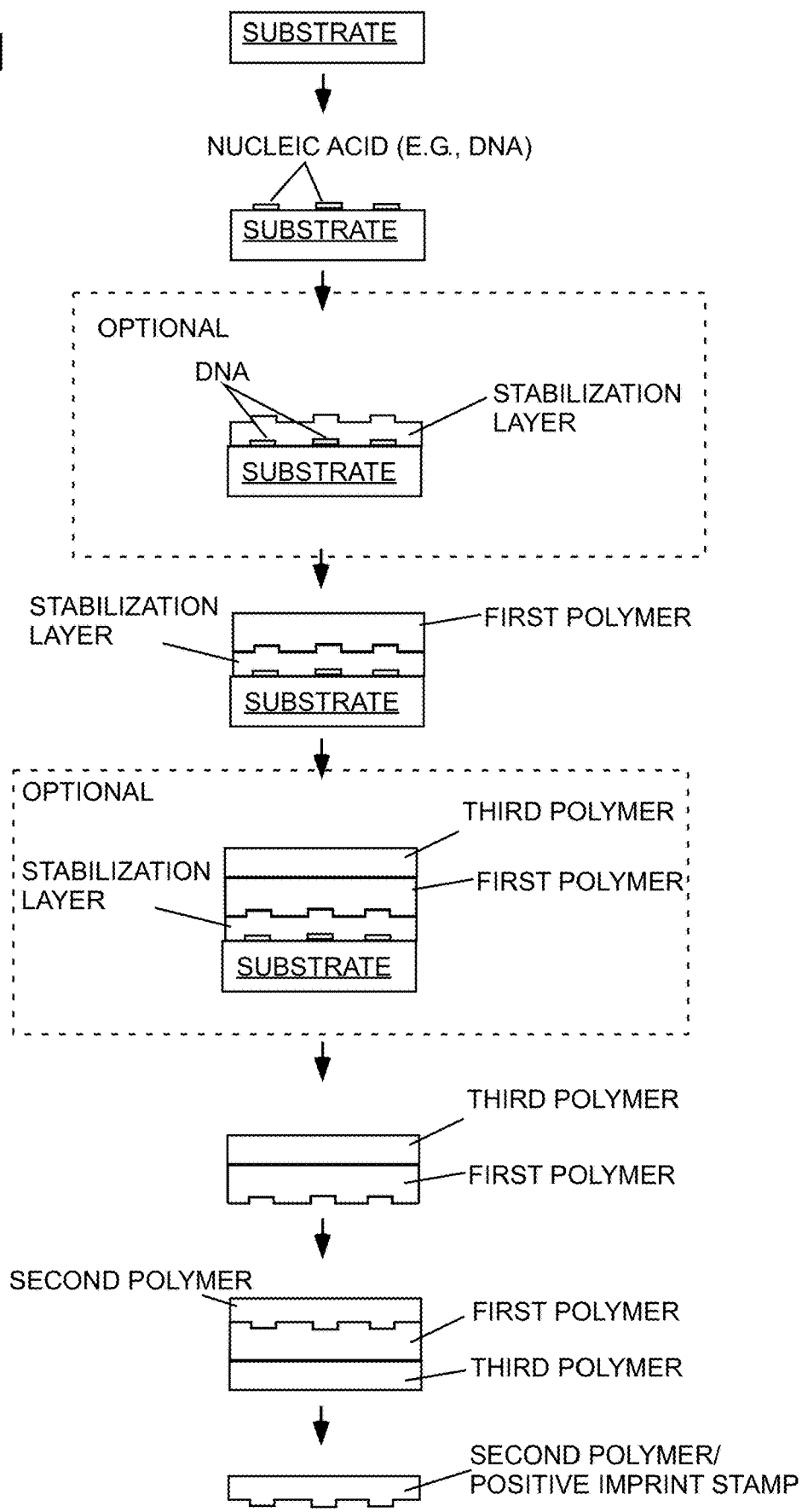
FIG. 1 Illustrates schematically representative embodiments of a methodology and device hereof.

It will be readily understood that the components of the embodiments, as generally described and illustrated in the figures herein, may be arranged and designed in a wide variety of different configurations in addition to the described representative embodiments. Thus, the following more detailed description of the representative embodiments, as illustrated in the figures, is not intended to limit the scope of the embodiments, as claimed, but is merely illustrative of representative embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

As used herein and in the appended claims, the singular forms "a," "an", and "the" include plural references unless the context clearly dictates otherwise. Thus, for example, reference to "a nanostructure" includes a plurality of such nanostructure and equivalents thereof known to those skilled in the art, and so forth, and reference to the "nanostructure" is a reference to one or more such nanostructures and equivalents thereof known to those skilled in the art, and so forth. Recitation of ranges of values herein are merely intended to serve as a shorthand method of referring individually to each separate value falling within the range. Unless otherwise indicated herein, and each separate value, as well as intermediate ranges, are incorporated into the specification as if individually recited herein. All methods described herein can be performed in any suitable order unless otherwise indicated herein or otherwise clearly contraindicated by the text.

Herein we demonstrate an approach to using nucleic acid nanostructures, with the representative example of DNA nanostructures, as master templates in a direct pattern transfer from DNA to polymers with high fidelity. The nanoscale features of the polymer may be rationally controlled by the design of the DNA nanostructures. A unlimited variety of DNA nanostructures (for example, including DNA nanotubes, 1D λ-DNA, 2D DNA brick crystals with 3D features, hexagonal DNA 2D arrays, triangular DNA origami etc.) may be used to pattern (that is, create a negative pattern in) virtually any first polymer. The resulting polymer stamp may, for example, serve as a mold to transfer the pattern (creating a positive pattern) to a wide variety of second polymers. In a number of representative examples hereof, the first polymer is poly(methyl methacrylate) (PMMA), poly(L-lactic acid) (PLLA) or an acryloxy perfluoropolyether (a-PFPE) polymer substrate. A wide variety of second polymers may be used. In general, the first polymer and the second polymer may be chosen such that the second polymer is readily separable from the first polymer. The second polymer may, for example, have a low surface energy.

The present inventors has discovered that nucleic acid/DNA nanostructures having at least one dimension less than 90 nm or less than 80 nm which are deposited on a substrate provide suitable mechanical stability use as a template or master template for use in creating one or more negative patterns via application and subsequent removal of a first polymer layer. The stability of the DNA master template may be increased by application of a stabilizing layer of a material having a mechanical strength greater than the DNA nanostructures immobilized upon the substrate. The stabilizing layer may, for example, be deposited via a thin film depositions technique such as atomic layer deposition, vacuum deposition, sputtering, chemical vapor deposition or laser assisted deposition. In a number of embodiments, the stabilizing layer material and the deposition technique for the deposition thereof are chosen such that the surface/outer surface of the stabilizing layer (that is, the surface opposite the DNA nanostructures) is generally conformational. In other words, the conformation, structure or outline, as well as the dimensions of the underlying DNA nanostructures are generally maintained in the outer surface of the stabilizing layer.

FIG. 1 illustrates an embodiment of a methodology for forming positive patterned devices or stamp hereof. The structures of FIG. 1 are not necessarily drawn accurately to scale, but are set forth for clarity in describing embodiments hereof. If forming a template or master template, one or more DNA nanostructures, which each independently and in combination have a predetermined conformation (shape, dimensions, arrangement etc.) or surface morphology are first immobilized upon a substrate. Various substrates are suitable for use herein. The substrates can be generally flat or curved over a portion or the entirety thereof. The surface of the substrate may, for example, be relatively smooth. In that regard, surface deviations or irregularities (that is roughness) may, for example, be smaller than the dimension for the feature to be imprinted or smaller than the smallest dimension of the DNA nanostructure(s). In a number of embodiments, the surface roughness is below 250 pm or below 200 pm. The surface of the substrate upon which the DNA is to be immobilized interacts with the DNA such that the DNA nanostructures may be immobilized thereon. The surface may, for example, have an affinity for DNA (for example, through electrostatic or chemical interaction) so that the DNA may be absorbed thereon. The surface of the substrate may, for example, be hydrophilic and/or include charged moieties. The surface of the substrates may be intrinsically interactive with DNA or may be altered via surface modification to be interactive. Examples of suitable substrates materials include, but are not limited to, silicon oxide, mica, glass and polished metal.

In general, the first polymer may be any polymer that retains its shape in post-patterning processes after removal from connection with the master template. In that regard, the first polymer should exhibit a glass transition temperature or $T_g$ that is above a temperature used in processing with the patterned first polymer. The $T_g$ need not be above a temperature used in making the patterned first polymer during application of the layer of the first polymer to the master template. One may, for example, create the pattern in the first polymer at high temperature (that is, above the $T_g$ of the first polymer) and subsequently cool that polymer.

Thus, in addition to spin coating or other solution-based polymer application method, there are many other methods that can be used to produce and pattern the layer of first polymer. For example, a preformed polymer thin film can be prepared on a rigid substrate and brought into contact with the DNA template under pressure and elevated temperature (for example, above the $T_g$ of the first polymer). Further, a liquid photocurable polymer precursor can be drop casted on the DNA template and cured by UV light.

The first polymer may be hydrophilic or hydrophobic. The first polymer must also be separable from the master template. One may, for example, use differences between the hydrophilic/hydrophobic nature of the first polymer and the substrate to limit the adhesion therebetween and facilitate separation. For example, a hydrophobic polymer may be used in connection with a hydrophilic substrates and vice versa. The first polymer may, for example, exhibit low surface energy to facilitate removal from the master template. Additional steps may be desirable or required to manipulate adhesion or surface interaction and/or facilitate separation of the layer of the first polymer from the master template. For example, in a number of representative embodiments described herein, removal of edges of a polymethyl methacrylate (PMMA) and application of water was used to manipulate adhesion and remove PMMA from a hydrophilic silicon oxide substrate. One may also modify the nature of the first polymer and/or the substrate to facilitate removal (for example, via attachment of a monolayer thereto as known in the surface arts).

Similarly, the second polymer may be hydrophilic or hydrophobic. The second polymer must also be separable from the first polymer. One may, for example, use difference between the hydrophilic/hydrophobic nature of the first polymer and the second polymer to limit the adhesion therebetween and facilitate separation. The second polymer may, for example, exhibit low surface energy to facilitate removal from the first polymer. Additional steps may be desirable or required to manipulate adhesion or surface interaction and/or facilitate separation of the layer of the first polymer from the second polymer as described above.

In a number of embodiments, a third polymer layer may be deposited over the layer of the first polymer (that is, upon the surface of the first polymer opposite the surface in contact with the master template) before removing the first polymer from connection with the positive pattern of the master template. The third polymer may, for example, operate as a support or backing. In that regard, the third polymer may, for example, increase mechanical stability and facilitate removal of the assembly of the third polymer and first polymer from the master template as well as subsequent handling thereof.

A number of representative examples of patterned devices or stamps hereof using various DNA nanostructures and hereof are discussed below.

Figure 2:
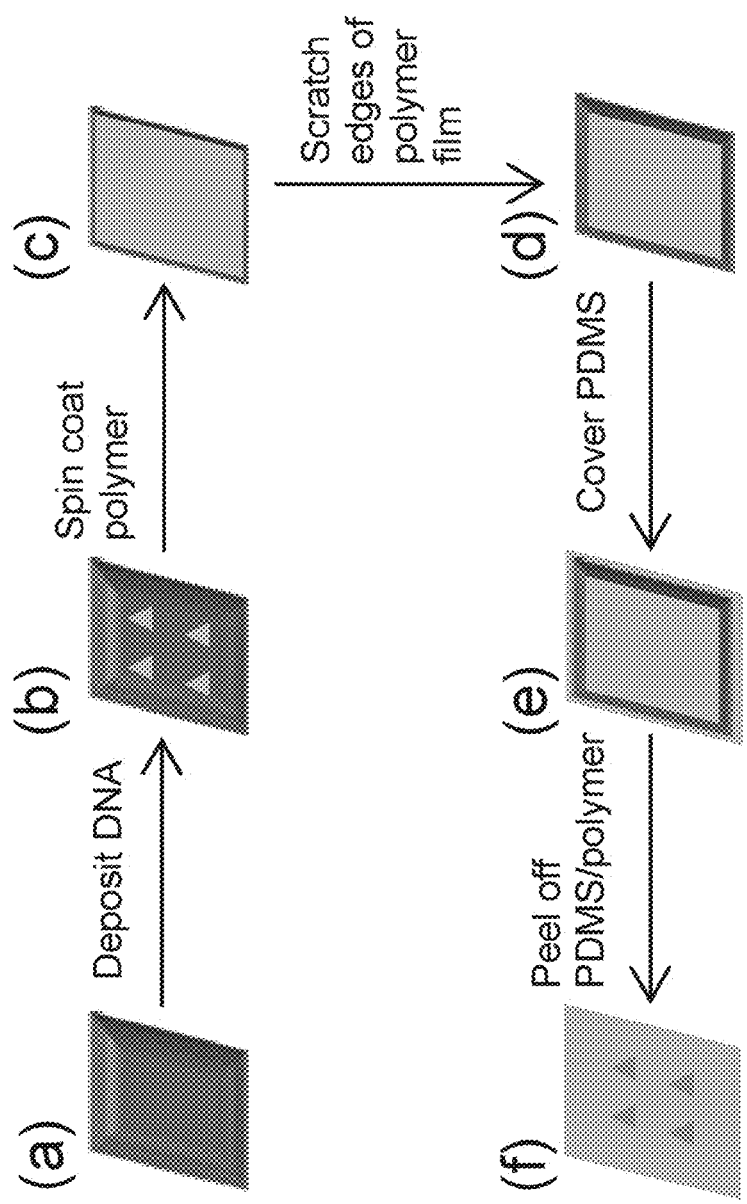
FIG. 2 Illustrates an embodiment of a fabrication technique for polymer stamps using DNA nanostructures as master templates wherein the process includes: (a) Supplying a substrate such as a silicon wafer. (b) DNA is deposited on the silicon wafer. (c) A polymer film (e.g., PMMA) is spin-coated on the silicon wafer. (d) Polymer film (ca. 1 mm wide) is removed from the four edges. (e) A polydimethylsiloxane (PDMS) film adheres to the polymer film as a flexible backing. (f) Drops of water are added to one edge of the exposed silicon wafer and the PDMS/polymer film is peeled off.

The fabrication of polymeric patterned devices or stamps of a number of embodiments hereof includes six steps as illustrated in FIG. 2. In a number of embodiments, a silicon wafer with native oxide was cleaned by piranha solution and served as a substrate for DNA deposition (FIG. 2 actions a to b). After the DNA nanostructure was deposited to form a positive template or master template, a film or layer of a first polymer (for example, PMMA) was spin-coated on the substrate to cover the DNA (FIG. 2 actions b to c). Although the application of the first polymer to the master template is not limited to application from solution (for example, via spin coating), application of the first polymer in solution provides for good conformational contact between the DNA and the first polymer. A negative replica forms on the sub-surface of the first polymer layer which was in contact with the DNA. Four edges of the first polymer layer were scratched to expose the underlying silicon substrate (FIG. 2 actions c to d). Subsequently, a film or layer of a third polymer (for example, polydimethylsiloxane or PDMS) was adhered to the first polymer layer as a flexible backing to assist in removing the first polymer layer from the master template (including the silicon substrate and the immobilized DNA) in the next action, process or step (FIG. 2 actions d to e). Drops of water were added to one edge of the exposed silicon substrate and were allowed to penetrate into the interface between the hydrophobic first polymer and the hydrophilic silicon wafer. In the last step, the PDMS/first polymer layer was peeled off and gently dried by a nitrogen stream (FIG. 2 actions e to f). The whole process may, for example, be completed in several minutes.

Figure 3A:
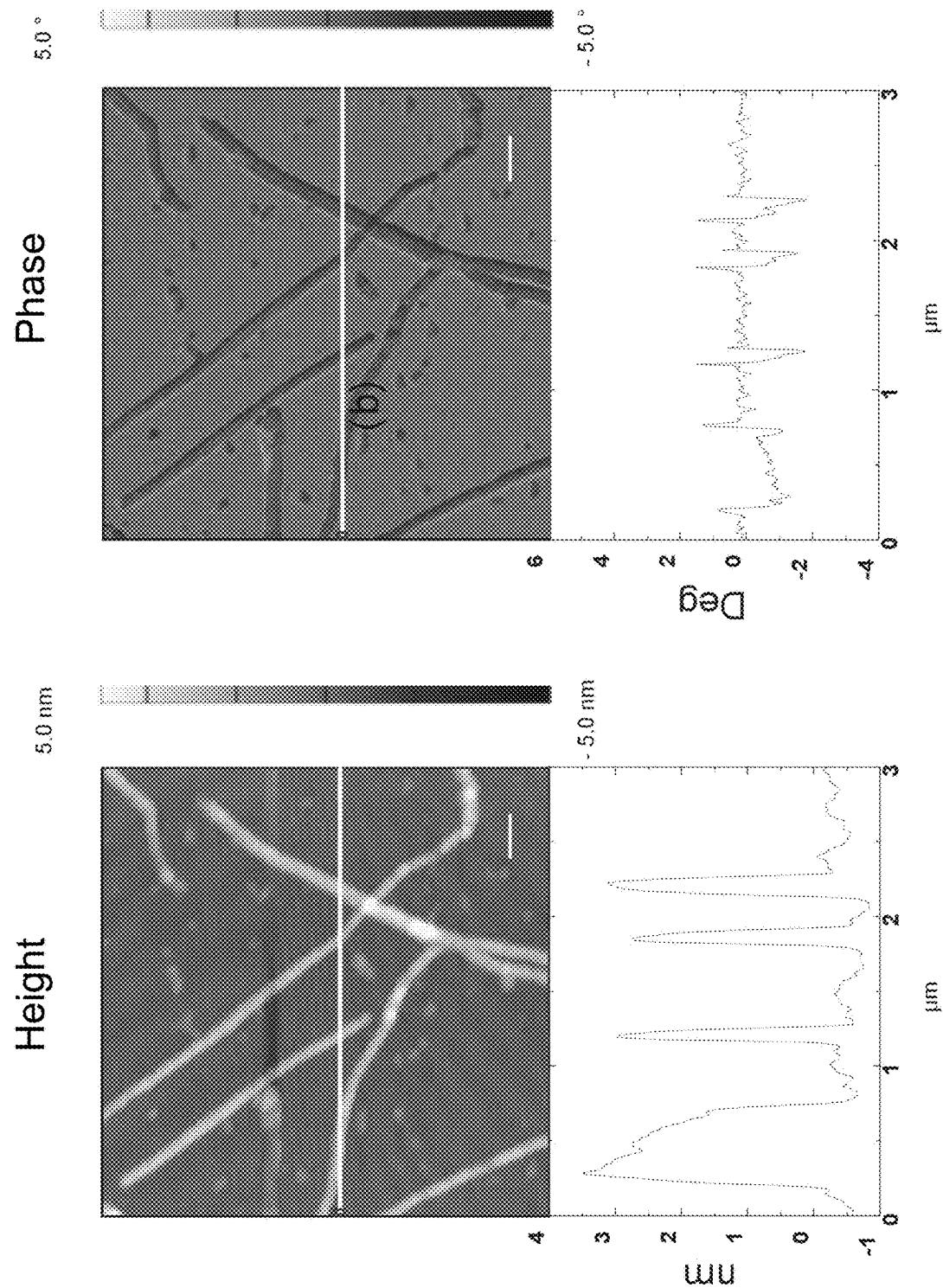
FIG. 3A illustrates atomic force microscopy or AFM height (left) and phase (right) images of DNA nanotubes deposited on the silicon wafer in fabrication of PMMA stamps (top) by replication over DNA nanotubes wherein the scale bars represent 300 nm, corresponding cross-sections are shown at the bottom, and white lines in the top images indicated the position where the cross-section analyses were determined.
Figure 3B:
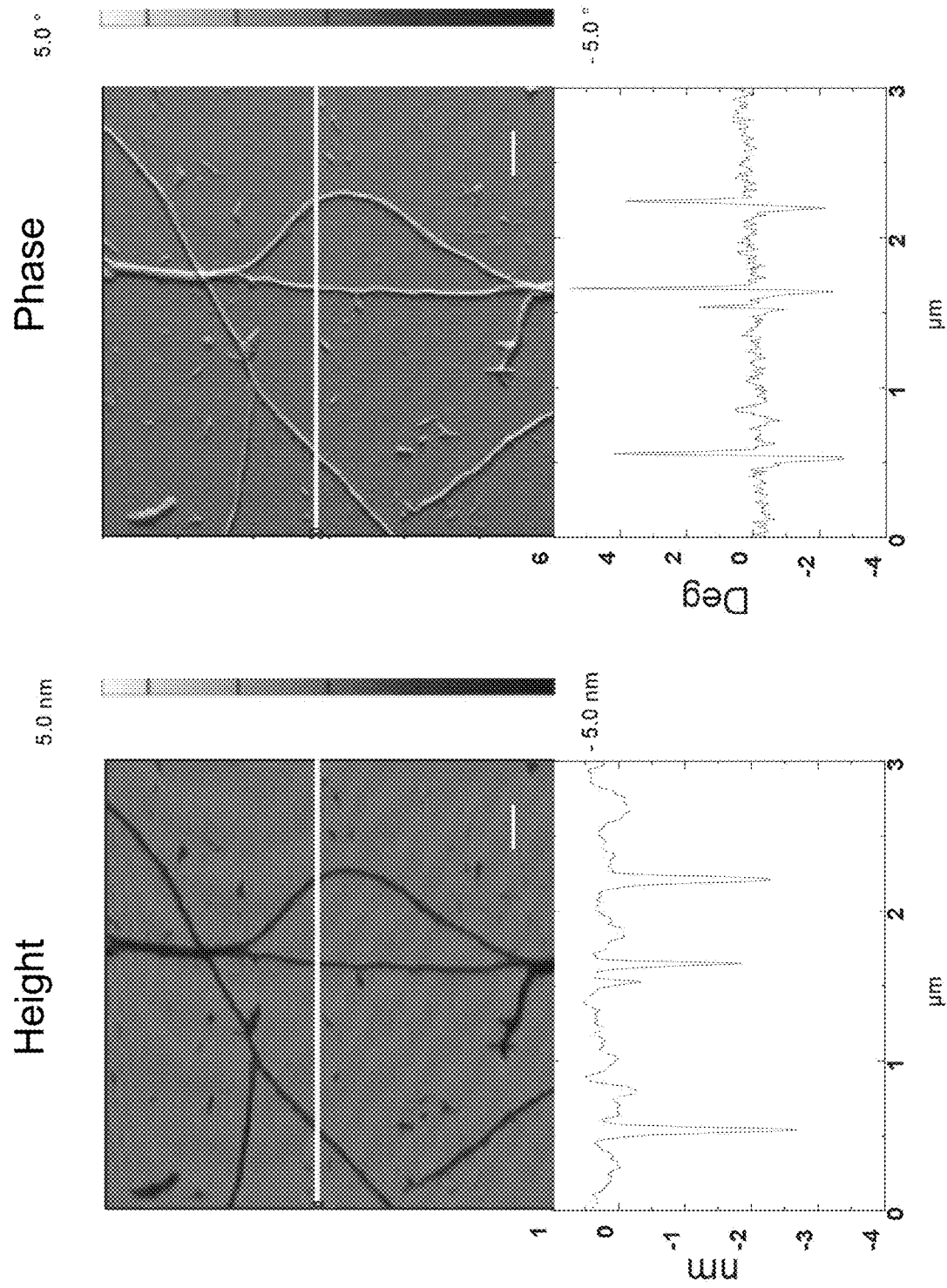
FIG. 3B illustrates AFM height (left) and phase (right) images of the replica of nanotube patterns on PMMA stamps (top) wherein the scale bars represent 300 nm and corresponding cross-sections are shown at the bottom.

We first demonstrated stamp fabrication using self-assembled DNA nanotubes which have a length of up to 60 μm and a width in the range of 30-70 nm.[2] The topography of the DNA master templates and polymer stamps were characterized by atomic force microscopy (AFM). In the AFM images, the height of the DNA nanotubes was measured to be 4.0±0.5 nm. This small height is expected as a result of collapse of the DNA nanotubes during the drying process (FIG. 3A). Bundling of DNA nanotubes, however, was evident in some areas. After the first polymer layer was removed or peeled off the master template, the negative imprints/trenches corresponding to the DNA nanotubes were observed on the PMMA stamp (see, for example, FIGS. 1 and 2). The 1D trenches were 3.2±0.7 nm in depth, in good agreement with the height of the DNA nanotubes of the master templates (see, FIG. 3B). The measured width of the nanotube master template (67.1±5.3 nm) was larger than the expected value, and the measured width of the 1D trenches on the PMMA stamps (39.7±5.1 nm) was smaller than the expected value. Without limitation to any mechanism, we attribute this observation to the AFM probe convolution effect and the removal of the salt residues during the fabrication of the PMMA stamp. The bundling of DNA nanotubes produced wider and deeper 1D trenches. These results confirm a successful replication process from the DNA nanotubes to the PMMA stamp.

Unlike the case of, for example, carbon nanotubes, which have been bound to a silicon wafer via Van der Waals forces, in the present methodology, DNA nanostructures and the silicon wafer are bound via a likely stronger electrostatic interaction (for example, through $Mg^{2+}$). In addition, in a number of embodiments, water can easily separate the hydrophilic silicon wafer from the hydrophobic polymer stamp, and an anti-adhesion silane layer is not required to prevent separation of the DNA nanostructure hereof from the template upon removal of the first polymer layer therefrom. However, an anti-adhesion silane layer or another anti-adhesion layer can be also included to assist in the separation of the first polymer from the master template. Likewise, polymers of low surface energy may be used to facilitate separation. The methodologies hereof can produce widely diverse nanostructure patterns, in addition to simple linear trenches as further described below.

Figure 4A:
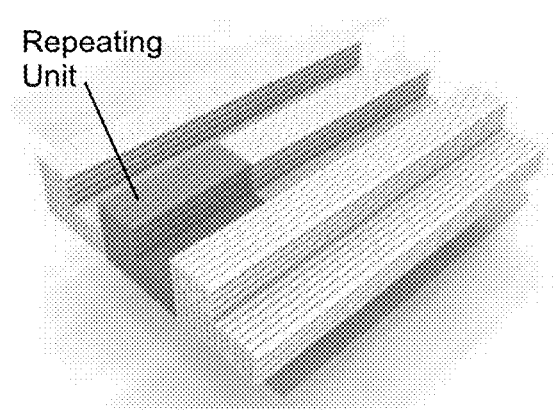
FIG. 4A illustrates a model of 2D DNA brick crystal in the fabrication of PMMA stamps by replication over 2D DNA brick crystals wherein the repeating unit is labeled as the shaded region.
Figure 4B:
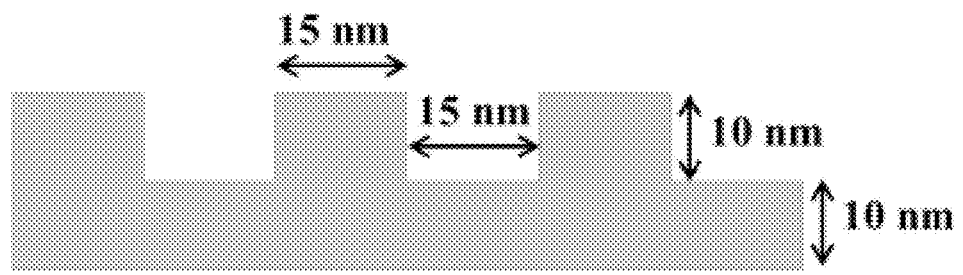
FIG. 4B illustrates a side view of the model of the 2D DNA brick crystal of FIG. 4A.
Figure 4C:
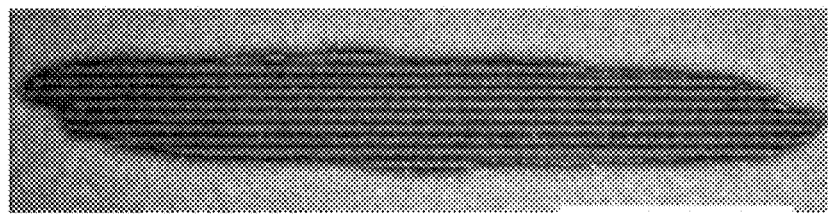
FIG. 4C illustrates a transmission electron microscopy (TEM) image of the 2D DNA brick crystal wherein the scale bar represents 500 nm.
Figure 4D:
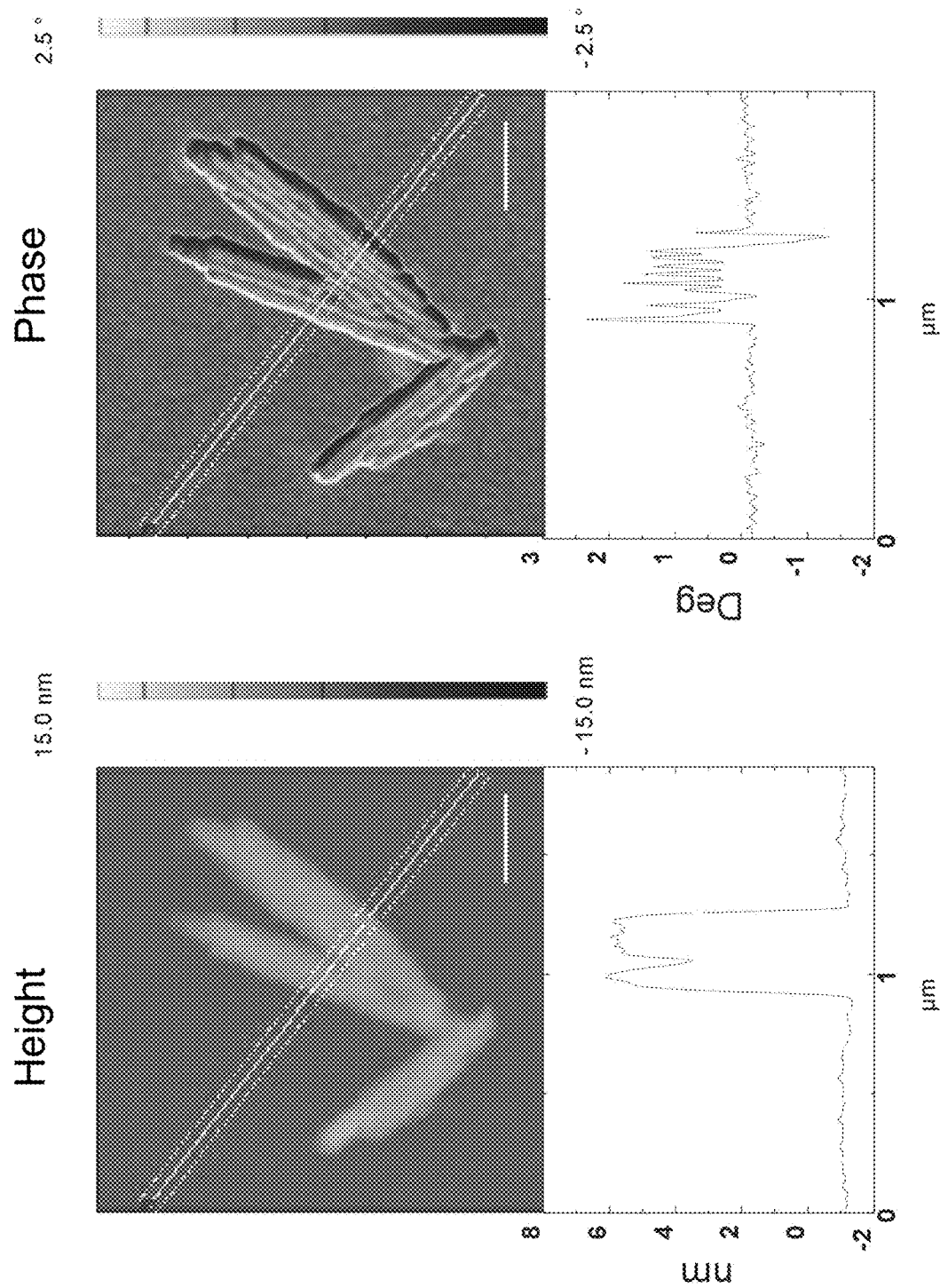
FIG. 4D illustrates AFM height (left) and phase (right) images of 2D DNA brick crystals deposited on a silicon wafer (top) and the corresponding cross-sections (bottom) wherein the scale bar represents 300 nm.

Besides 1D nanostructures, 2D DNA brick crystals with defined 3D features may also serve as master templates to transfer 3D patterns to PMMA. Such 2D DNA brick crystals were prepared through the recently developed "DNA bricks" approach. See, Ke, Y.; Ong, L. L.; Sun, W.; Song, J.; Dong, M.; Shih, W. M.; Yin, P. DNA Brick Crystals with Prescribed Depths. Nat. Chem. 2014, 6, 994-1002, the disclosure of which is incorporate herein by reference. After a one-pot annealing process, 2D DNA brick crystals with parallel channels were assembled (FIG. 4A). The channels are designed to be 10 nm high and 15 nm wide, and are separated by ridges with a height of 10 nm and a width of 15 nm (FIG. 4B), assuming 2.5-nm diameter per hydrated DNA helix. The assembled brick crystals were imaged by transmission electron microscopy (TEM). The parallel channels were clearly visible in the TEM image, and the measured pitch of the brick crystal was 24.9±0.5 nm, smaller than the theoretical value of 30 nm (FIG. 4C). The decreased pitch of the 2D brick crystals may, for example, be attributed to the staining and dehydration of the DNA brick crystals during TEM sample preparation and imaging in vacuum. The AFM images show a consistent shape of the 2D brick crystals (FIG. 4D). The height of the 2D brick crystals in the AFM image was 7.3±0.3 nm, which is much smaller than the theoretical value of 20 nm, and the pitch was 29.9±1.8 nm (expected value: 30 nm). The trenches within the DNA brick crystal were clearly visible in the AFM phase image, However, their full depth was not resolved in the topography image, which may, for example, be a result of the tip convolution effect. In addition, a high concentration of magnesium ions (40 mM) had to be used to stabilize the DNA brick crystals, resulting in the aggregation of DNA brick crystals (FIG. 4D).

Figure 4E:
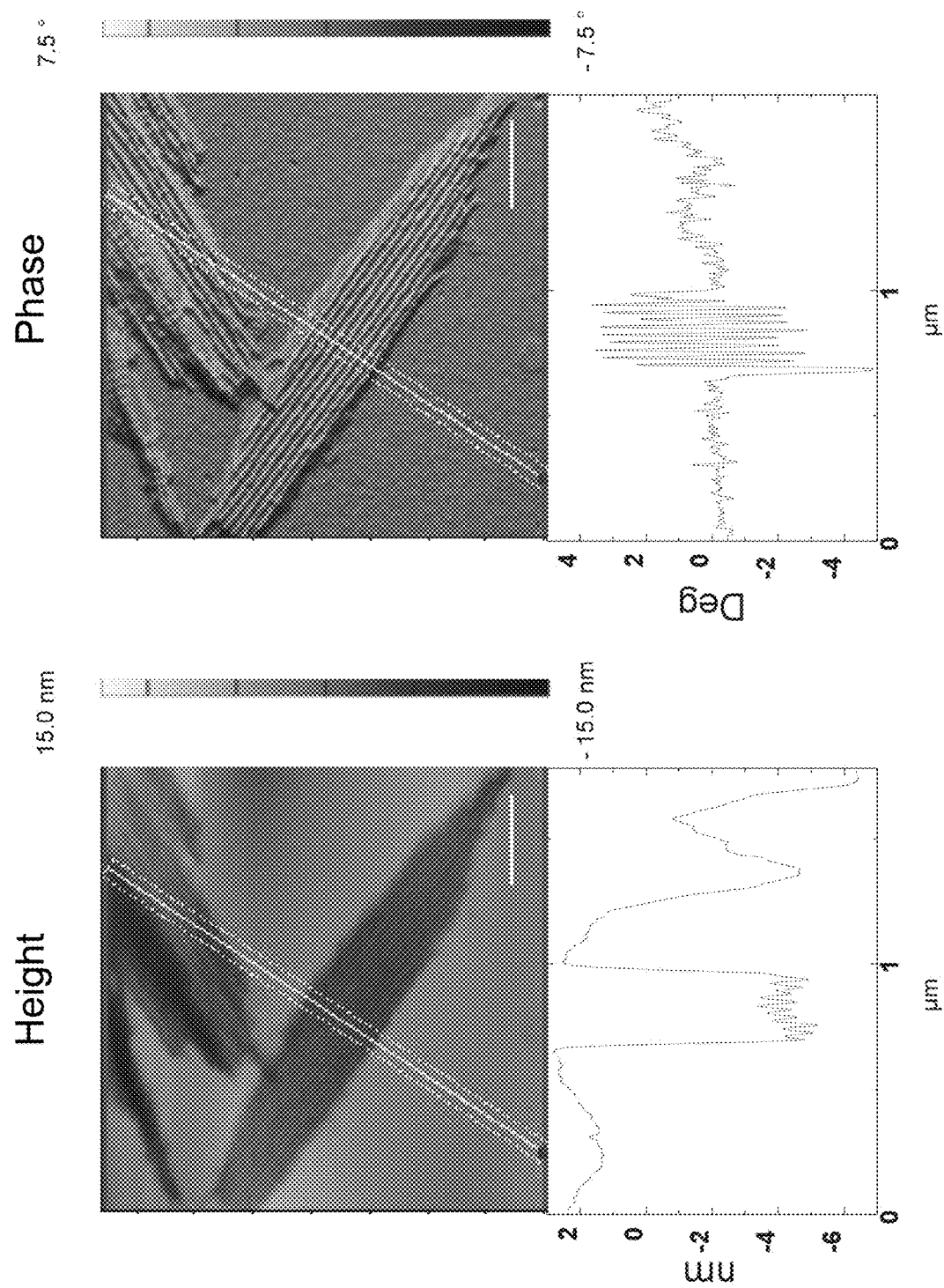
FIG. 4E illustrates AFM height (left) and phase (right) images of the replica of 2D DNA brick crystals on PMMA stamps (top) and the corresponding cross-sections (bottom) wherein the scale bars represents 300 nm.

After the negative replication process as described above, the negative replica or imprint of the DNA brick crystal could be clearly seen on the PMMA (first polymer) film of layer (FIG. 4E). The depth of the negative replica or imprinting pattern was 7.7±0.3 nm, in good agreement with that of the original 2D brick crystal (7.3±0.3 nm) on the silicon wafer (FIG. 4E). The trenches within the negative replica were clearly visible in the phase image and the pitch was 30.3±0.6 nm, which is close to that of the DNA master template (FIG. 4E). Although the trenches were clearly visible in the topography image, their depth was not fully resolved and is smaller than the expected value of 10 nm. This observation is similar to that of the DNA brick crystals. Nevertheless, the consistency of the shape, height, and pitch between 2D DNA brick crystals and their replica on PMMA stamps indicates a relatively faithful replication process.

Figure 5A:
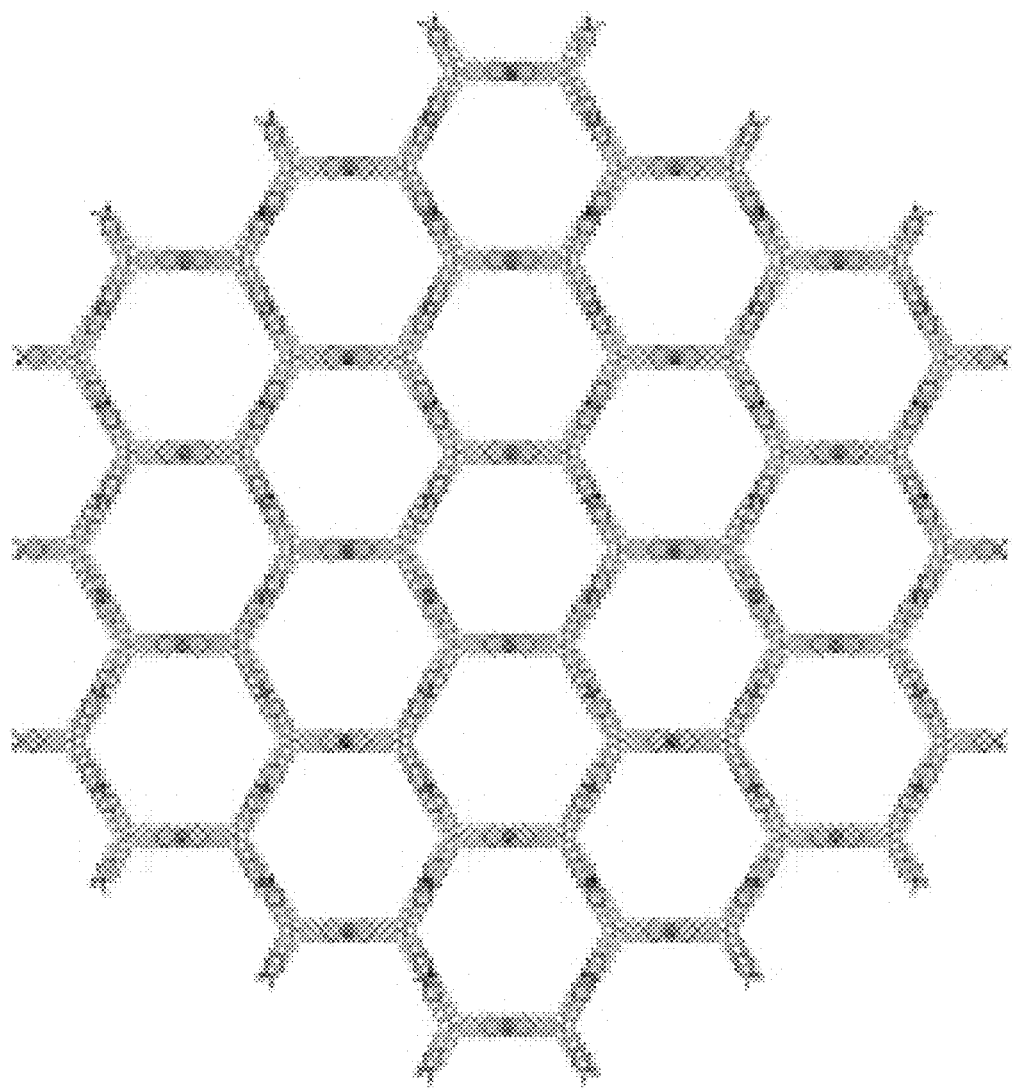
FIG. 5A illustrates an embodiment of a scheme of hexagonal DNA 2D arrays assembled from 3-point-star motifs in the fabrication of PMMA stamps by replication over hexagonal DNA 2D arrays.
Figure 5B:
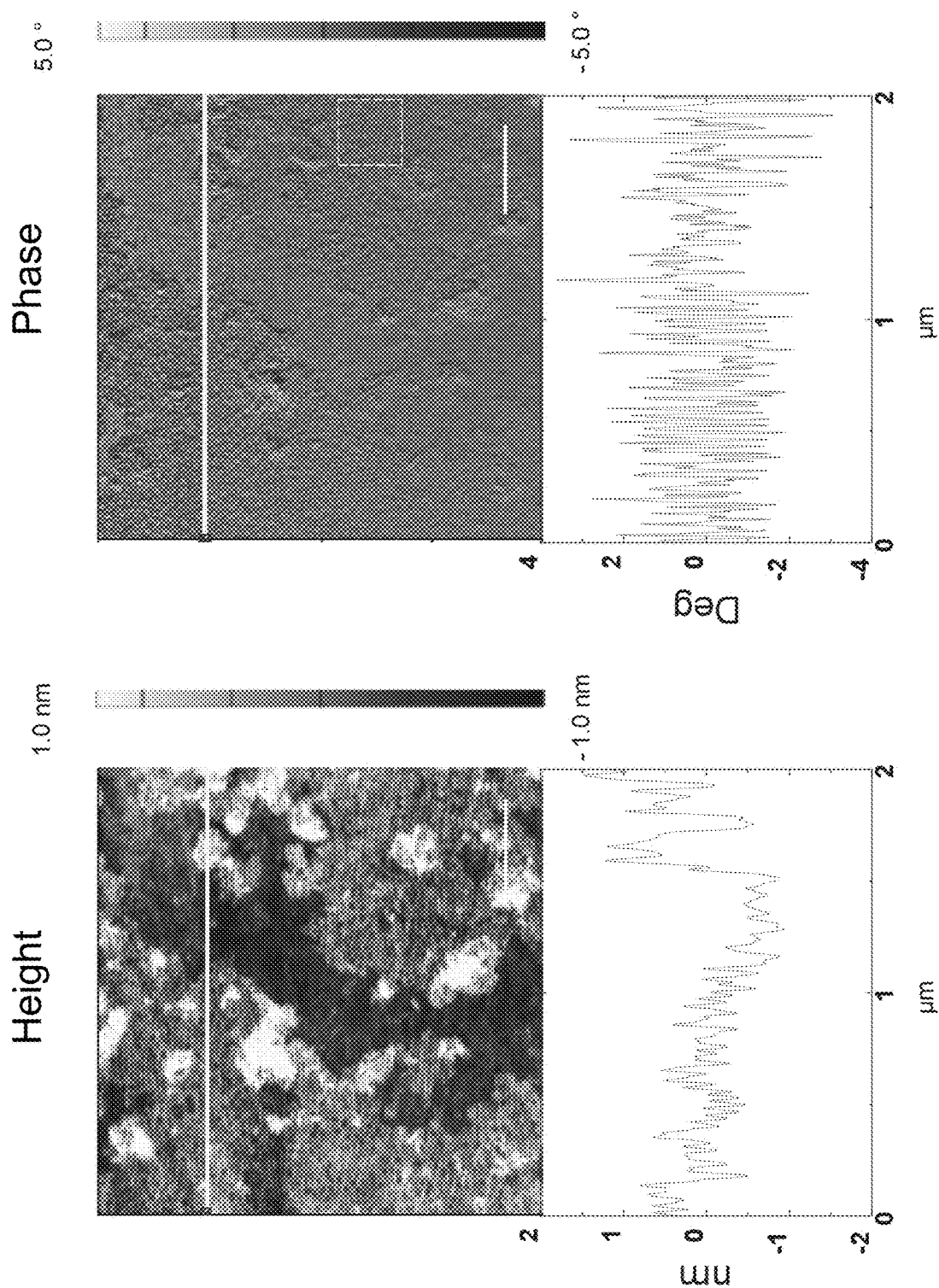
FIG. 5B illustrates AFM height (left) and phase (right) images of DNA 2D arrays assembled on the silicon wafer (top) and the corresponding cross-sections (bottom) wherein the scale bar represents 400 nm.
Figure 5C:
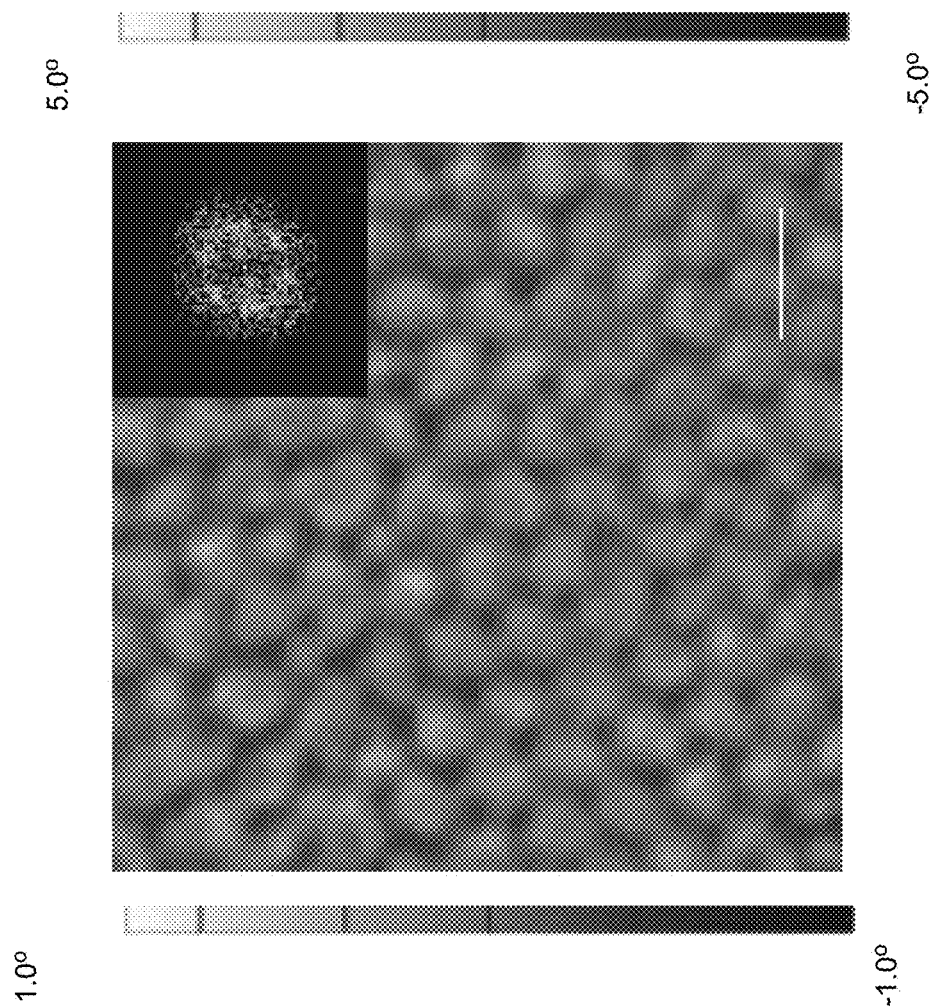
FIG. 5C illustrates a zoomed-in view of the area in the white dashed box in FIG. 5B wherein the inset is the Fourier transform pattern of the image of FIG. 5C and the scale bar represents 50 nm.
Figure 5E:
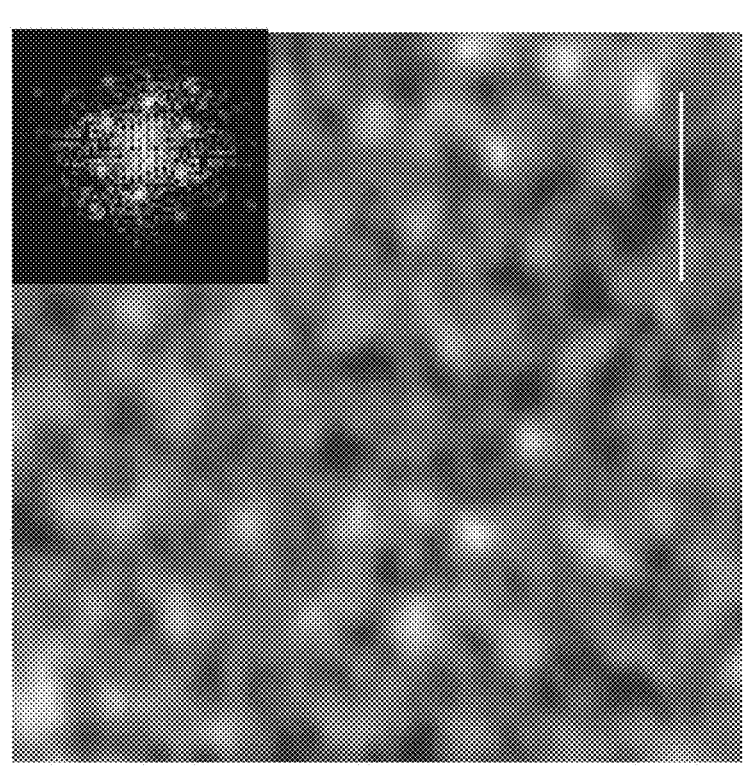
FIG. 5E illustrates a zoomed-in view of the area in the white dashed box in FIG. 5D and the inset is the Fourier transform pattern of the image in FIG. 5E wherein the scale bar represents 50 nm.
Figure 5D:
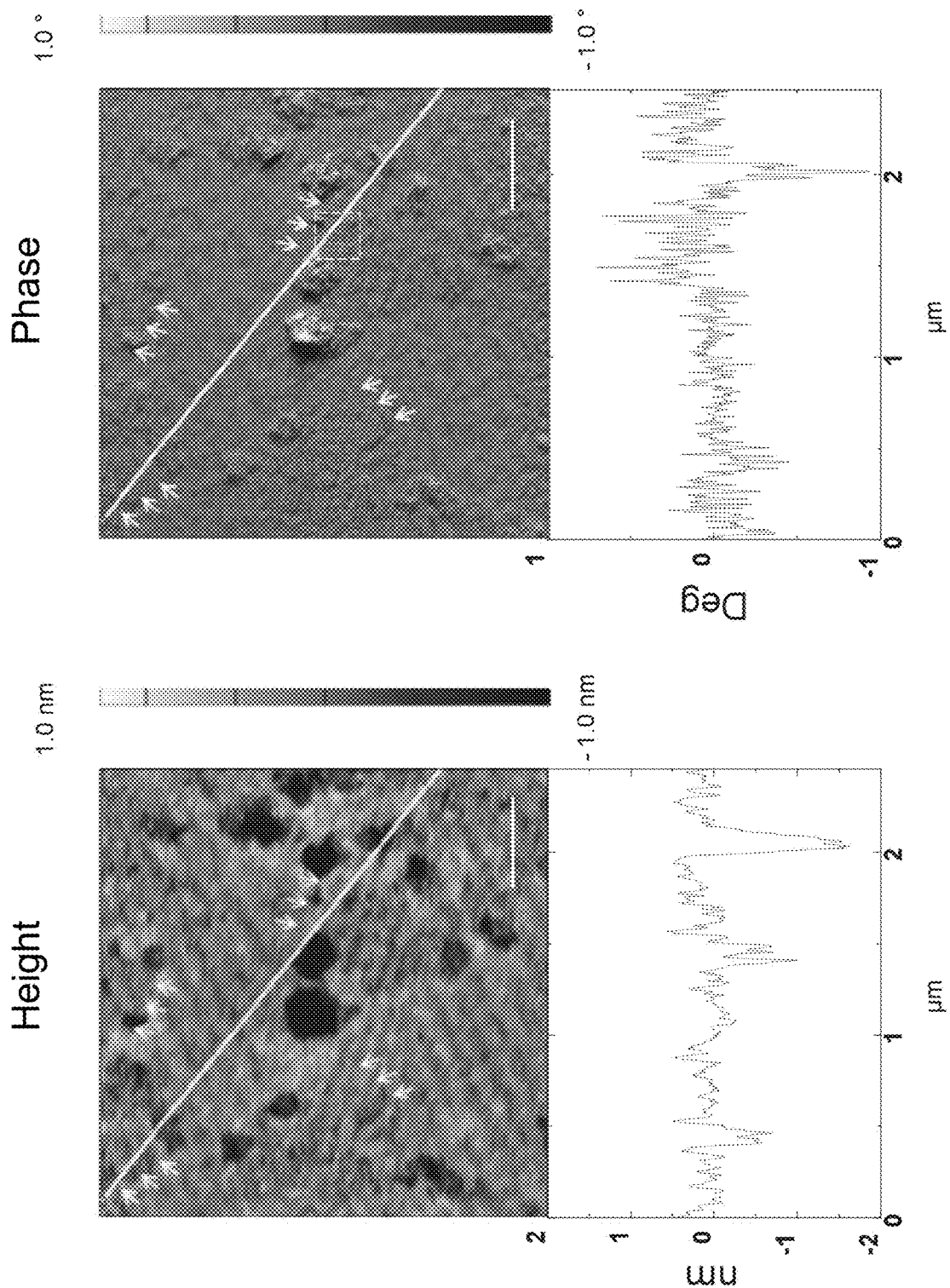
FIG. 5D illustrates AFM height (left) and phase (right) images of the PMMA stamps (top) and the corresponding cross-sections (bottom) wherein the scale bar represents 400 nm, and wherein the white arrows indicate the replicated patterns on PMMA.

In addition to the DNA nanotubes and the 2D DNA brick crystals, DNA nanostructures with smaller feature sizes/dimensions may also be used in creating master templates hereof. A hexagonal DNA 2D array was, for example, tested as a master template for the pattern transfer. The hexagonal DNA 2D array was self-assembled from DNA 3-point-star motifs (FIG. 5A). See, He, Y.; Chen, Y.; Liu, H. P.; Ribbe, A. E.; Mao, C. D. Self-Assembly of Hexagonal DNA Two-Dimensional (2D) Arrays. *J. Am. Chem. Soc.* 2005, 127, 12202-12203 m the disclosure of which is incorporated herein by reference. Each edge of the motif include two DNA double strands with a length of 4.5 turns. To increase the surface coverage of the DNA 2D arrays, silicon substrate mediated annealing was used to directly grow the DNA 2D arrays on the silicon wafer. See, for example, Lee, J.; Kim, S.; Kim, J.; Lee, C. W.; Roh, Y.; Park, S. H. Coverage Control of DNA Crystals Grown by Silica Assistance. *Angew. Chem., Int. Ed.* 2011, 50, 9145-9149 and Sun, X. P.; Ko, S. H.; Zhang, C. A.; Ribbe, A. E.; Mao, C. D. Surface-Mediated DNA Self-Assembly. *J. Am. Chem. Soc.* 2009, 131, 13248-13249, the disclosures of which are incorporated herein by reference. A freshly cleaned silicon wafer was immersed in the DNA solution and annealed with DNA strands from 95° C. to 23° C. in one day. During this process, DNA motifs were adsorbed and confined to the $SiO_2$ surface to facilitate the self-assembly. FIG. 5B shows that after the annealing, most areas of the silicon wafer were covered by a monolayer of DNA 2D arrays with a hexagonal shape. The Fourier transform of the AFM phase image shows the expected six-fold symmetry of the DNA array (FIG. 5C). Big white spots were also observed, which were attributed to DNA aggregates and salt residues attached to the monolayer DNA. The section analysis shows that the repeating distance of the DNA 2D array was 29.7±0.7 nm, in good agreement with the theoretical value of 30.3 nm. On the surface of PMMA, the negative replica of the DNA 2D array appeared as an array of pillars and was highlighted by the white arrows in FIG. 5D. The Fourier transform of the pattern shows six-fold symmetry which is consistent with the pattern of the DNA master template (FIG. 5E). The periodicity of the pattern was measured by the averaged distance between adjacent pillars and found to be 29.7±0.9 nm, almost identical to that of the DNA master template. The pillar-like PMMA pattern of the same symmetry and periodicity confirms the pattern replication from DNA 2D arrays to PMMA stamps.

Figure 6A:
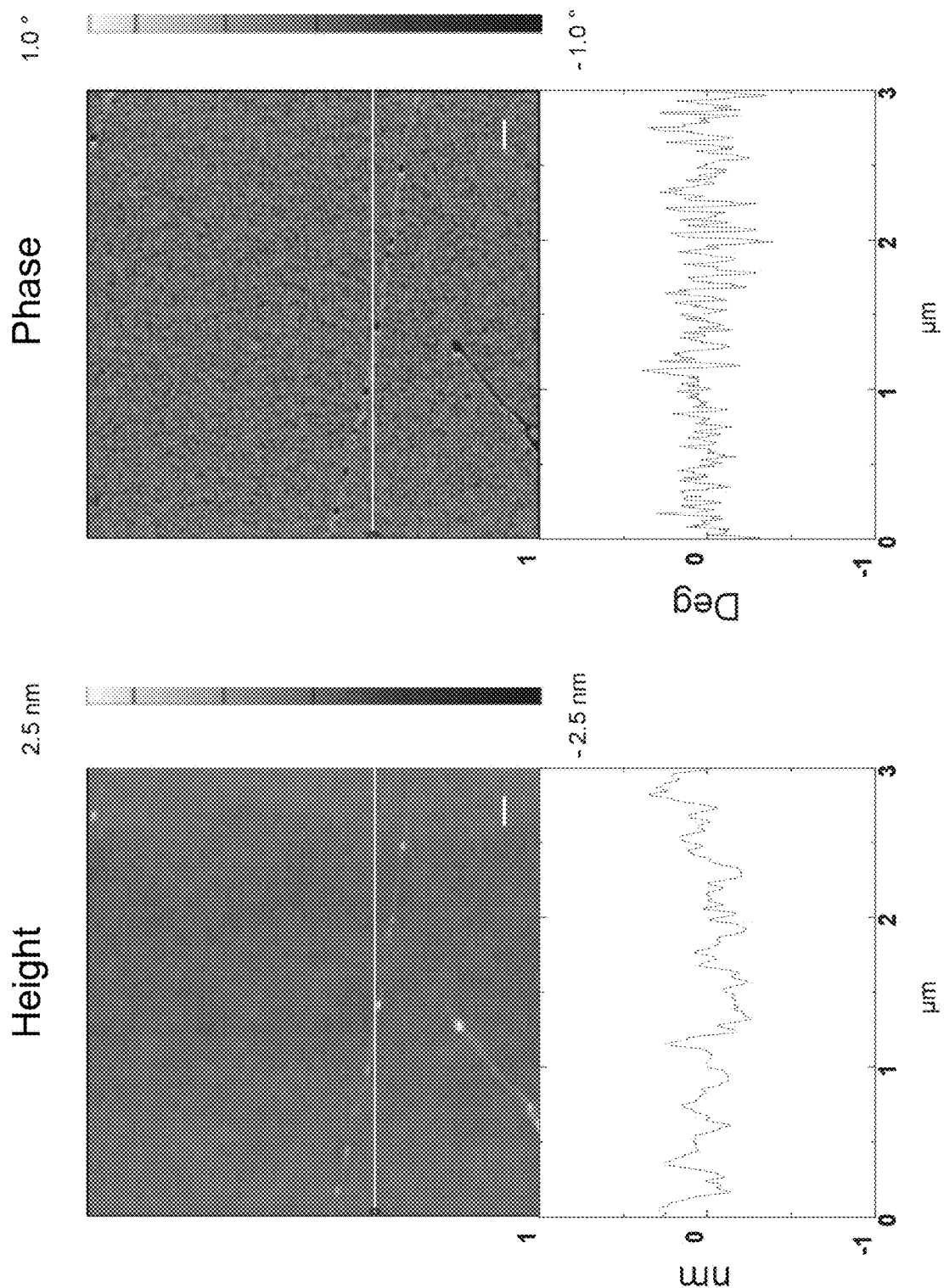
FIG. 6A illustrates AFM height (left) and phase (right) images of $\lambda$-DNA deposited on the silicon wafer in the fabrication of PMMA stamps by replication over the $\lambda$-DNA wherein the corresponding cross-sections are shown at the bottom and the scale bars represent 200 nm.
Figure 6B:
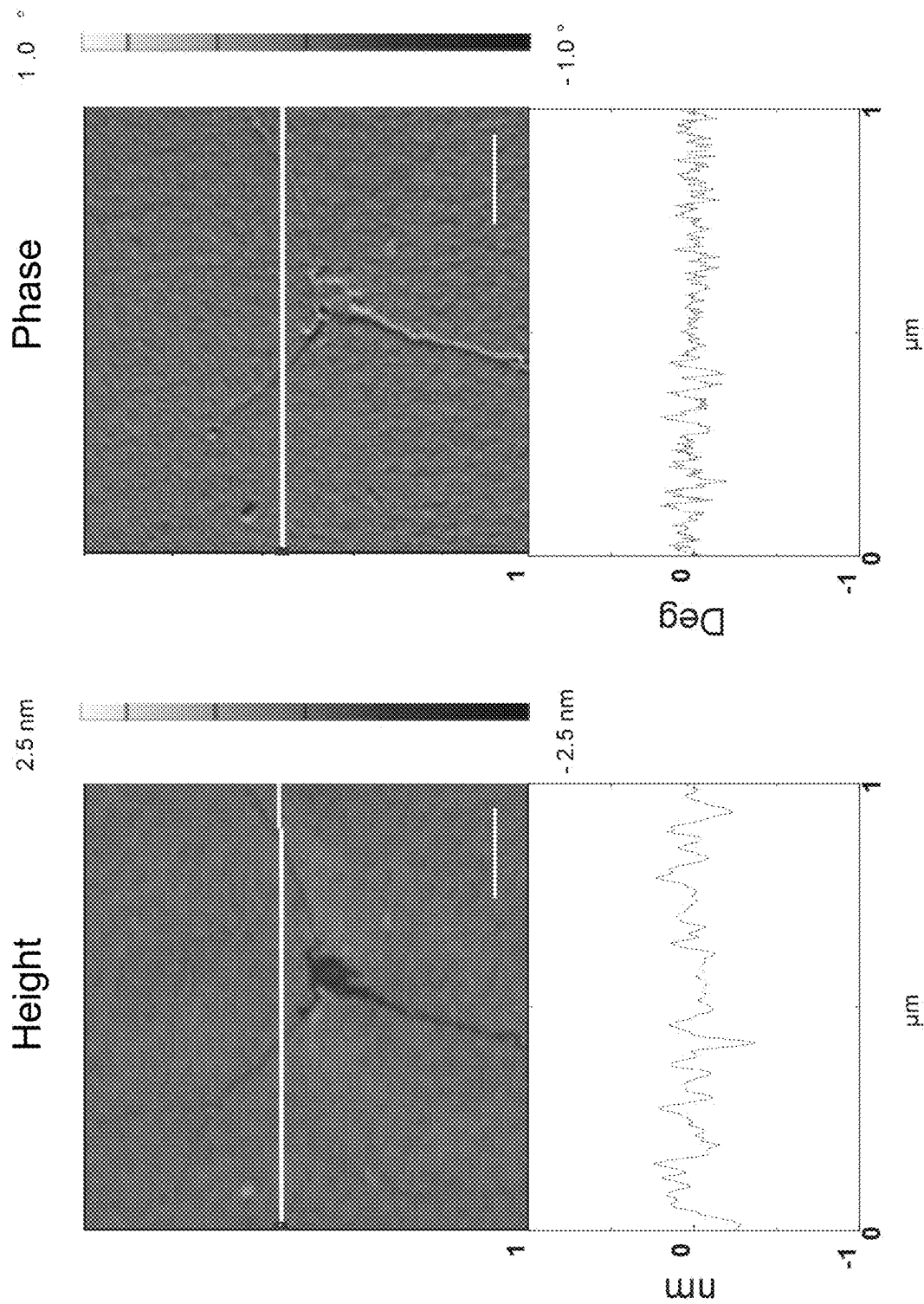
FIG. 6B illustrates AFM height (left) and phase (right) images of the replica of $\lambda$-DNA patterns on PMMA stamps wherein the corresponding cross-sections are shown at the bottom and the scale bars represents 200 nm.

To study the resolution limit of this method, the feature size of the DNA nanostructures is further decreased to an individual DNA double helix. λ-DNA, a double-stranded phage DNA with a length of ca. 16 μm, was employed in forming a master template. The height and width (full width at half maximum or FWHM) of the individual λ-DNA were measured to be 0.3±0.1 nm and 14.7±3.2 nm, respectively (FIG. 6A), although bundling of the λ-DNA was observed as well. After the replication, narrow 1D trenches with a depth of 0.4±0.1 nm and a width (FWHM) of 11.1±1.7 nm were observed on the PMMA stamp (FIG. 6B), which represents the negative replica or imprint of the individual λ-DNA. This result indicates that even a single DNA double strand of a diameter of 2 nm might serve as a master template for the pattern transfer, suggesting the possibility of applying this method to pattern molecular-scale features. Features having a dimension of 1 nm or less (for example, as defined between adjacent strands of DNA) may be produced in the methodologies hereof.

Figure 7A:
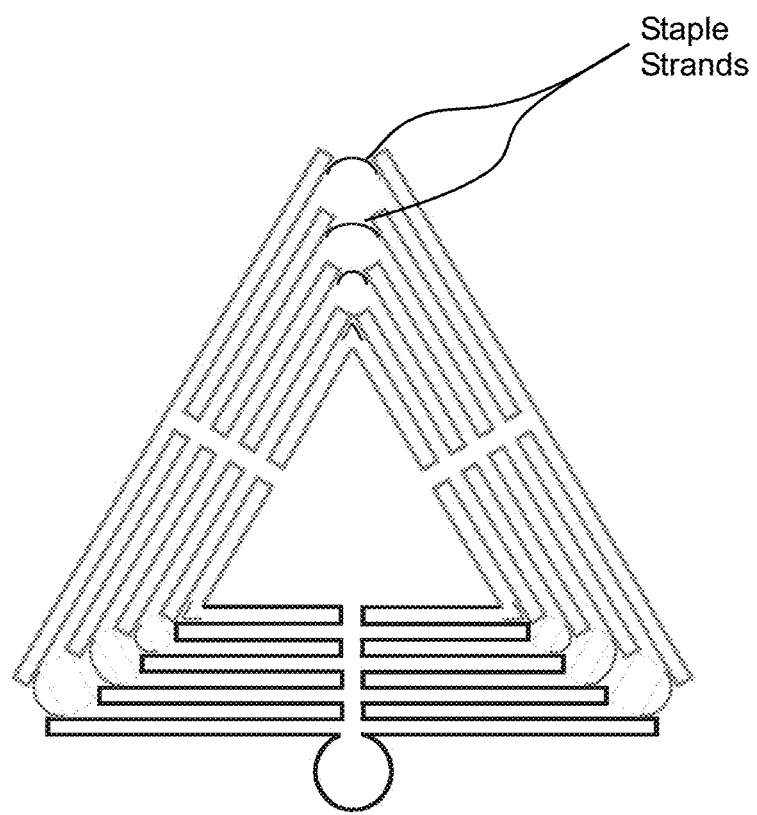
FIG. 7A illustrates a folding path of the DNA scaffold strand in a DNA triangle in the fabrication of PMMA stamps by replication over the triangular DNA origami wherein staple strands bridging the trapezoidal sides are labeled.

All of the nanostructures tested above are either 1D linear structures or 2D nanostructures with periodic patterns. To increase the complexity of the patterns on the stamp, triangular DNA origami nanostructures were employed as master templates for the pattern transfer. See, for example, Rothemund, P. W. K. Folding DNA to Create Nanoscale Shapes and Patterns. *Nature* 2006, 440, 297-302 and Hung, A. M.; Micheel, C. M.; Bozano, L. D.; Osterbur, L. W.; Wallraff, G. M.; Cha, J. N. Large-Area Spatially Ordered Arrays of Gold Nanoparticles Directed by Lithographically Confined DNA Origami. *Nat. Nanotechnol.* 2010, 5, 121-126. The triangular DNA origami includes a single layer of DNA double strands with a theoretical height of 2 nm and contains three trapezoidal domains. The edges of the adjacent trapezoidal domains are connected by the bridging staple strands, forming three small triangular holes at each vertex and one large triangular hole in the center (FIG. 7A). According to the design, the inner length (the length of the sides of the central triangular hole), outer length, and full width at half-maximum (FWHM) of the trapezoidal sides of the DNA triangles are 55.0 nm, 129.6 nm and 27.0 nm, respectively. AFM images show that the DNA triangles were randomly distributed on the silicon wafer and the central, large triangular holes were clearly visible (FIG. 7B). Because of the resolution limitation of the AFM images, the bridging staple strands between the trapezoidal domains were not visible. As a result, the three smaller triangular holes at the vertex were shown as a linear gap. The tangling loop was visible in some DNA triangles. In other structures, the tangling loops might have attached on top of the DNA triangle or beneath the structure so that they were not visible. According to the AFM cross-section analysis, the height, inner length, outer length, and width (FWHM) of the trapezoidal sides of the DNA triangles were 1.6±0.1 nm, 45.6±2.0 nm, 131.2±5.4 nm, and 38.0±3.1 nm, respectively. The measured height of DNA nanostructures in AFM images might vary as a result of the differences in the probe-substrate and probe-sample interactions. As a result of AFM probe convolution, the measured outer length and side width of DNA triangles increased compared with the theoretical value, and the measured inner length of DNA triangles was smaller than the theoretical value.

Figure 7C:
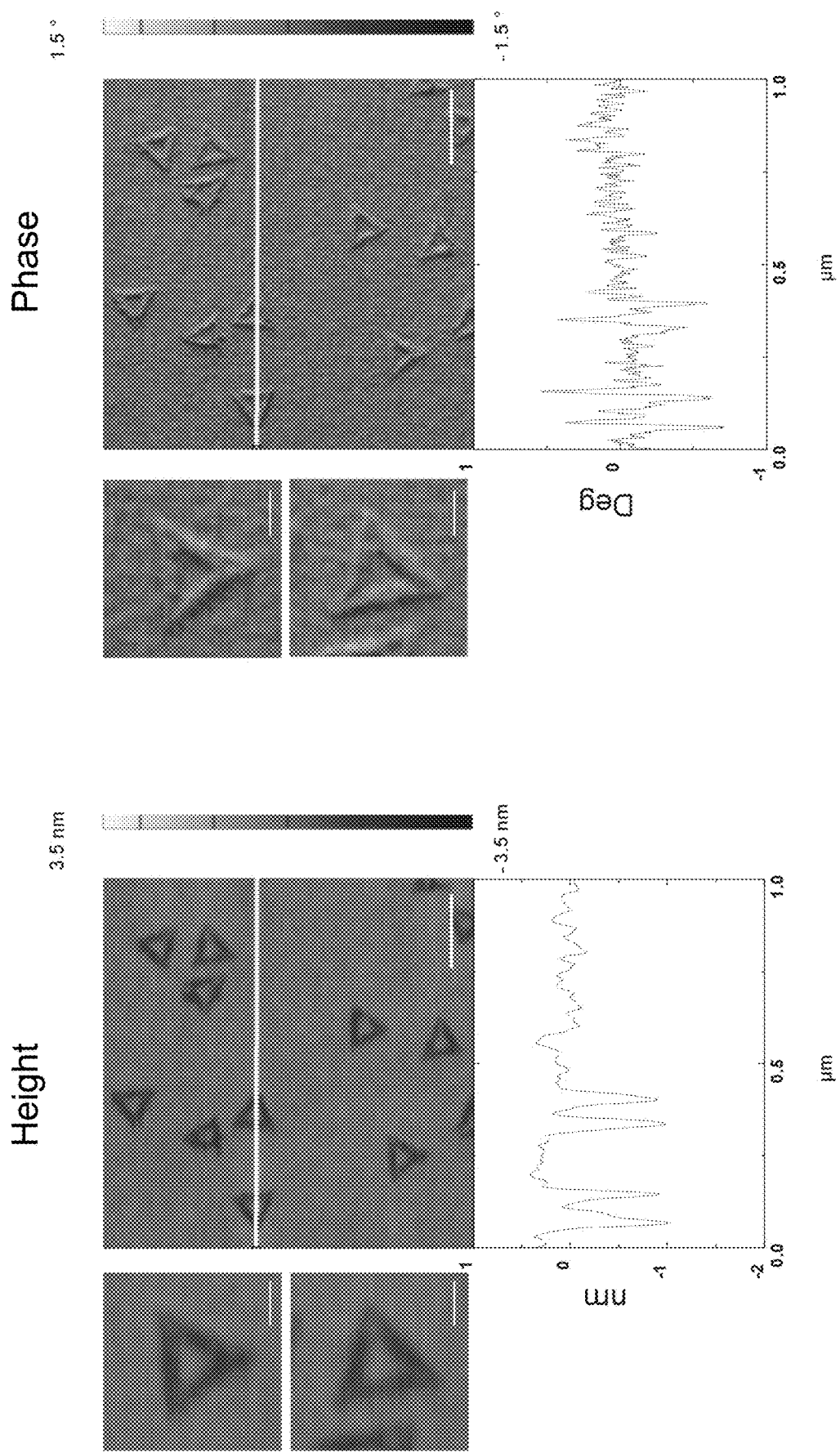
FIG. 7C illustrates AFM height (left) and phase (right) images of triangular patterns on PMMA stamps (top) and the corresponding cross-sections (bottom), wherein zoomed-in images are on the left of the corresponding images, and scale bars represent 200 nm in the zoomed-out images and 50 nm in the zoomed-in images.

After the pattern transfer, triangular trenches appeared on the PMMA first polymer film or layer, resembling the shape of the DNA origami (FIG. 7C). Even the pattern of the tangling loop had been transferred to the PMMA stamp. The averaged depth, inner length, outer length, and width (FWHM) of the triangular trenches were 1.0±0.2 nm, 54.3±2.6 nm, 126.8±3.8 nm, and 26.5±3.1 nm, respectively. The decreased depth of the trenches may be attributed to the removal of the salts during the pattern transfer. The inner length, outer length, and width of the triangular trenches are all consistent with the design. Similar to the DNA master templates, the small triangular holes did not show up on the PMMA stamps. Instead, we observed small bumps at the vertices of the triangular trenches, which is the replica of the gaps between the trapezoidal domains. This bump could be seen in the cross-section of the vertices of the triangular trenches. However, the height of the bump is much smaller than 1 nm, and in some trenches, the bump was not observed at all. Both observations may, for example, be a result of the mechanical instability of the bumps during the AFM imaging and/or inherent limitation(s) of the pattern transfer. As the feature size of the DNA master template decreases, especially when nanometer-sized holes exist in the DNA master template, PMMA might not be able to fully fill the holes during the pattern transfer, resulting in the decreased height and missing features in the PMMA replica. These results demonstrate that the overall features of the triangular DNA origami can be successfully transferred to the PMMA stamps with high fidelity, and the local features (approximately sub-5 nm) can be replicated to some extent.

Figure 8A:
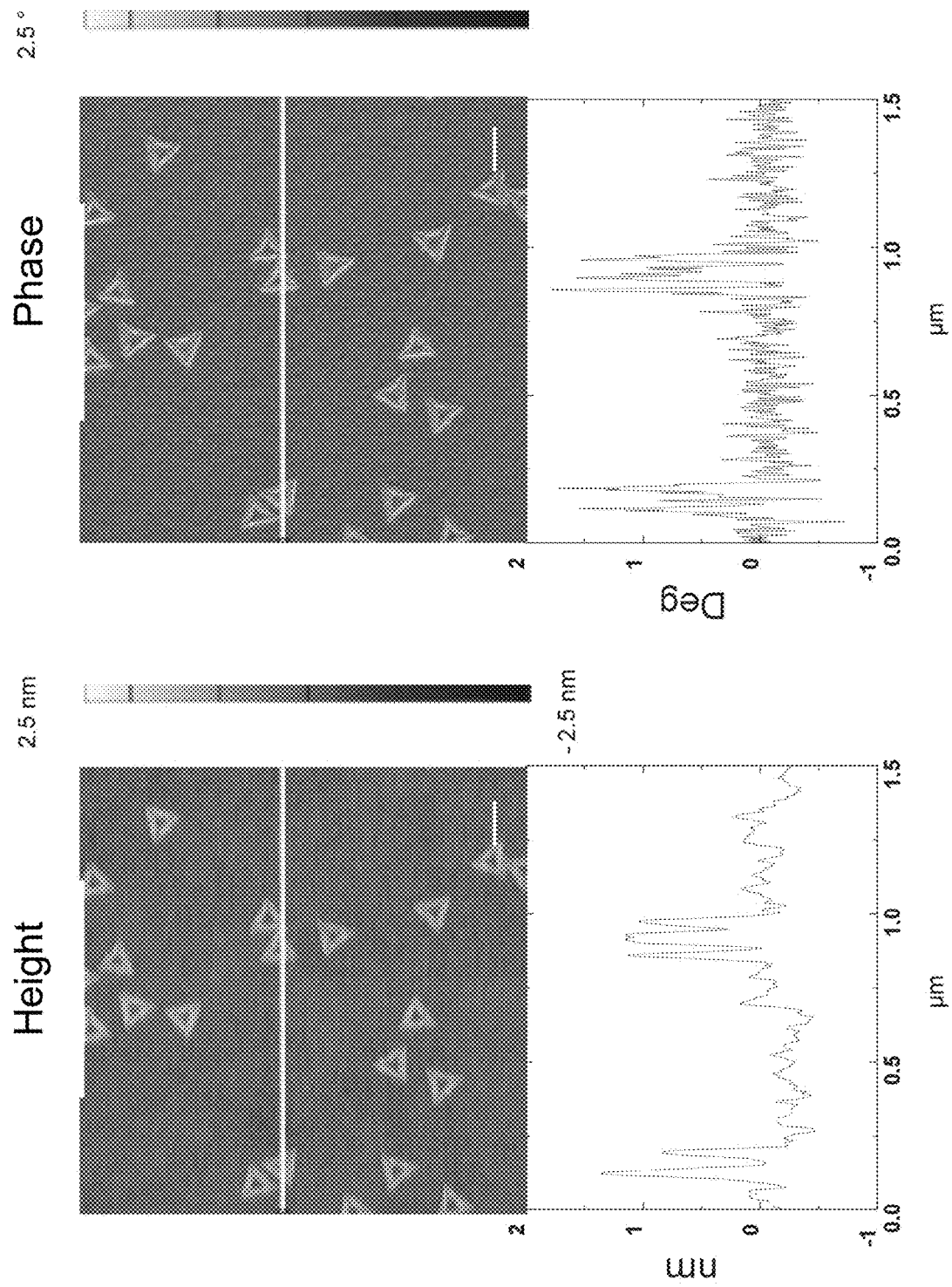
FIG. 8A illustrates AFM height (left) and phase (right) images of DNA triangles deposited on a silicon wafer (top) and the corresponding cross-sections (bottom) in the fabrication of PLLA stamps by replication over the triangular DNA origami, wherein the scale bars represent 150 nm.
Figure 8B:
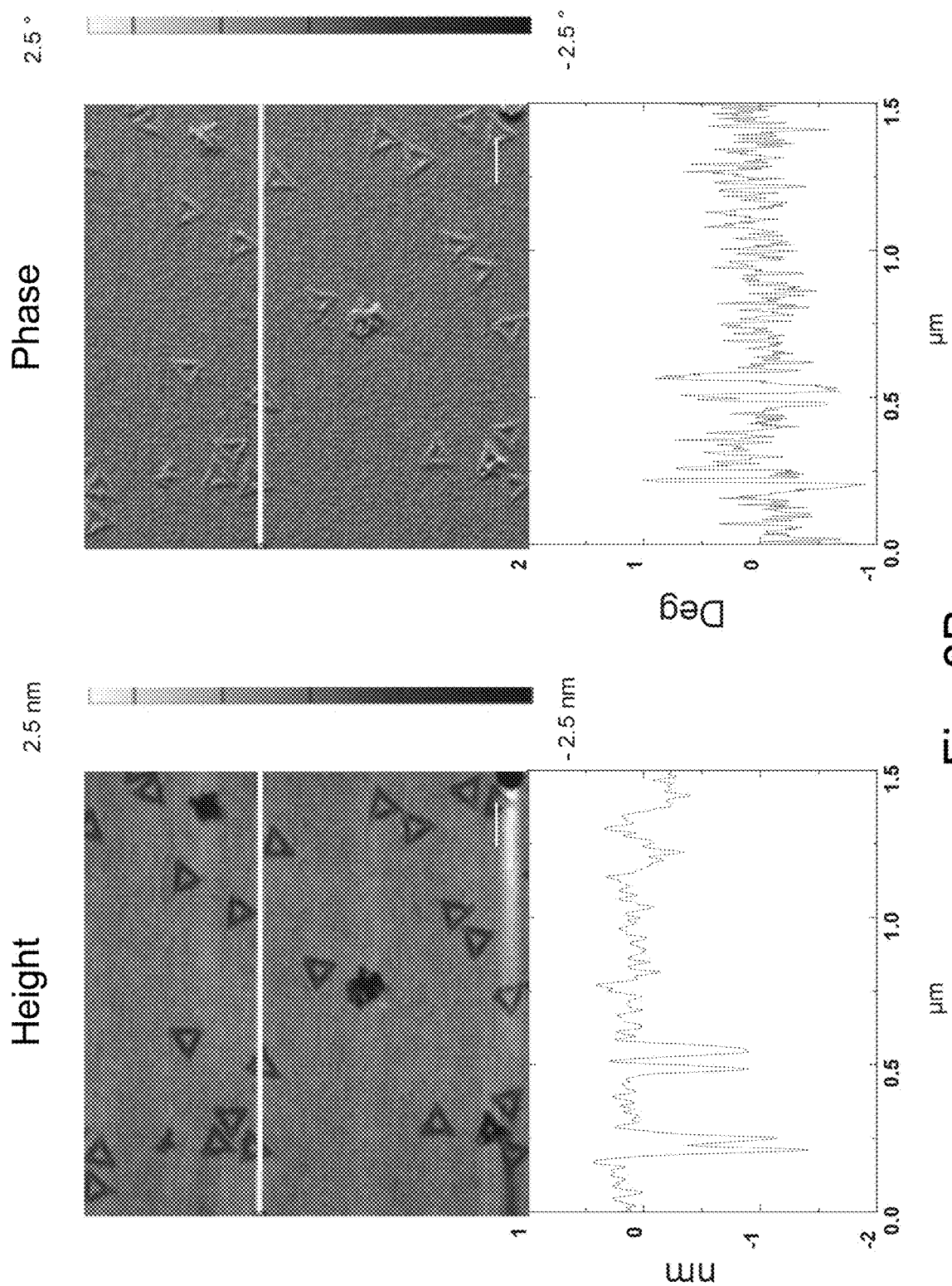
FIG. 8B illustrates AFM height (left) and phase (right) images of DNA triangles deposited on a silicon wafer (top) and the corresponding cross-sections (bottom) of triangular patterns on the PLLA stamps, wherein the scale bars represent 150 nm.
Figures 10A, 10B, 10C:
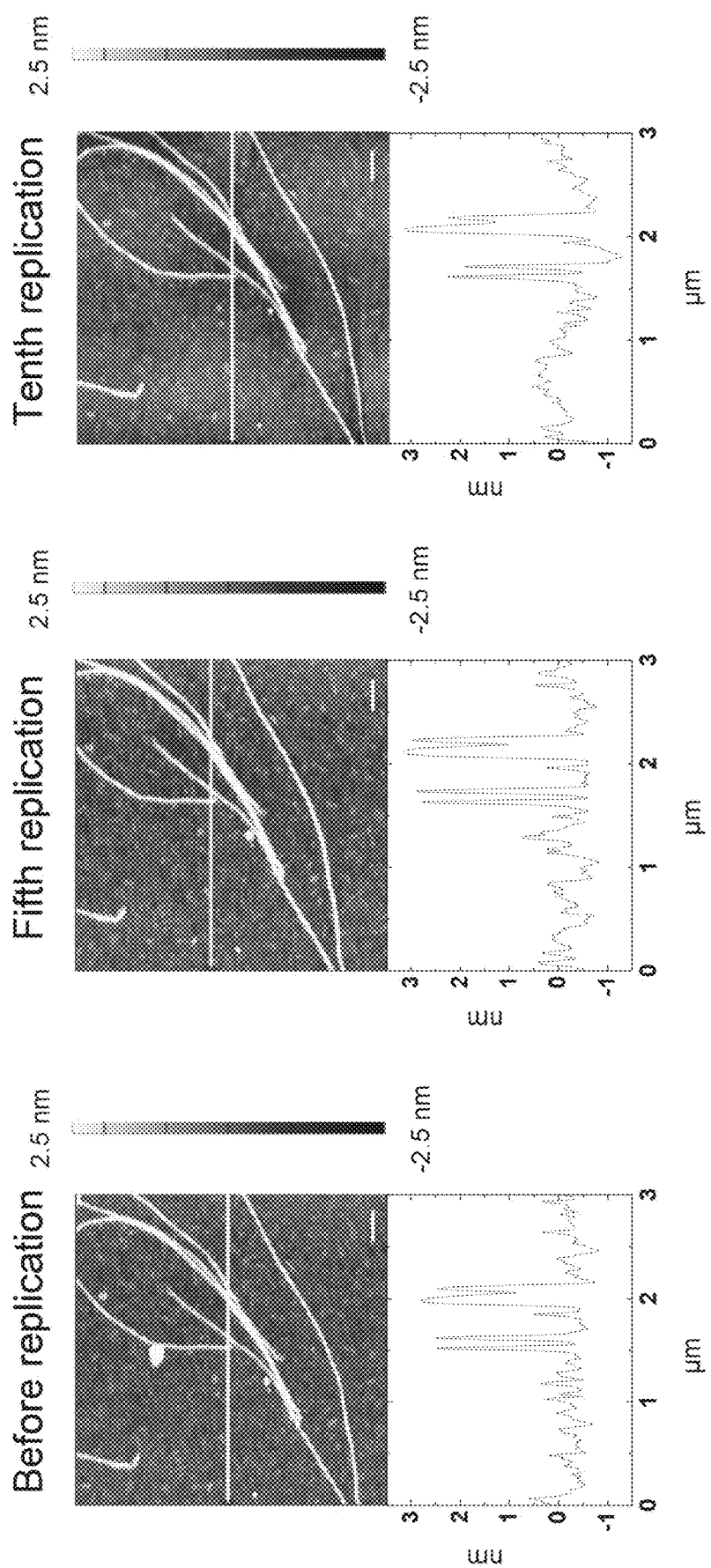
FIG. 10A illustrates AFM height images (top) and corresponding cross-section (bottom) of DNA nanotubes in a first location before the pattern transfer wherein the scale bars represents 300 nm
FIG. 10B illustrates AFM height images (top) and corresponding cross-section (bottom) of DNA nanotubes in the first location of FIG. 10A after the fifth pattern transfer to the a-PFPE (acryloxy perfluoropolyether) stamp, wherein the scale bars represents 300 nm.
FIG. 10C illustrates AFM height images (top) and corresponding cross-section (bottom) of DNA nanotubes in the first location of FIG. 10A after the tenth pattern transfer to the a-PFPE (acryloxy perfluoropolyether) stamp, wherein the scale bars represents 300 nm.
Figures 10D, 10E, 10F:
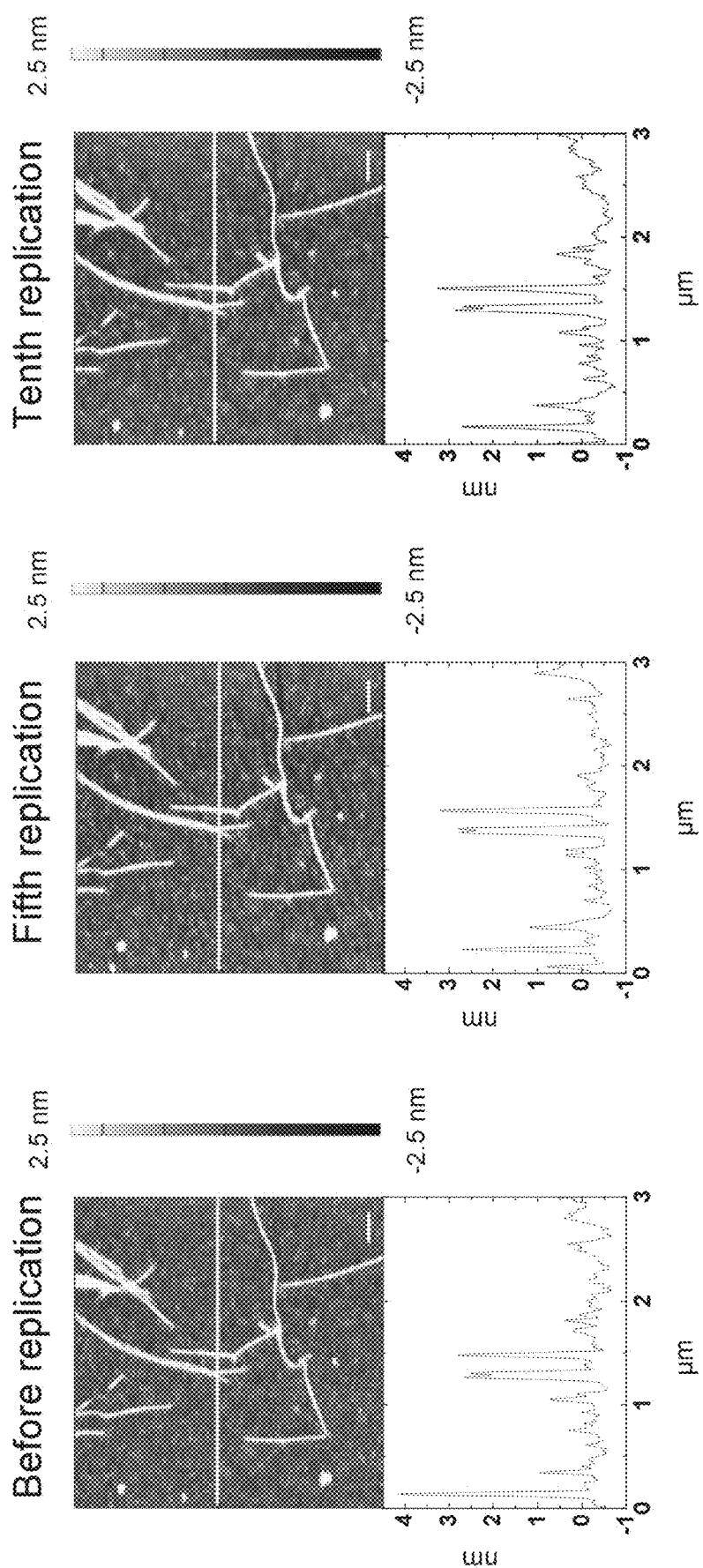
FIG. 10D illustrates AFM height images (top) and corresponding cross-section (bottom) of DNA nanotubes in a second location, different from the first location of FIG. 10A, before the pattern transfer wherein the scale bars represents 300 nm
FIG. 10E illustrates AFM height images (top) and corresponding cross-section (bottom) of DNA nanotubes in the second location of FIG. 10D after the fifth pattern transfer to the a-PFPE (acryloxy perfluoropolyether) stamp, wherein the scale bars represents 300 nm.
FIG. 10F illustrates AFM height images (top) and cross-section (bottom) of DNA nanotubes in the second location of FIG. 10D after the tenth pattern transfer to the a-PFPE (acryloxy perfluoropolyether) stamp, wherein the scale bars represents 300 nm.

Besides PMMA, other polymers such as PLLA may also be used as the first polymeric material the methods hereof (FIGS. 8A and 8B). Both DNA triangles and DNA nanotubes could be precisely replicated to the PLLA stamps. Similar to the pattern transfer from DNA triangles to the PMMA stamp, the tangling loops and the gaps between the trapezoidal domains could be also transferred to the PLLA stamp. AFM cross-sections indicate that the averaged depth and width (FWHM) of the triangular trenches on the PLLA stamps were 1.1±0.2 nm and 27.1±6.0 nm, respectively. The replication to the PLLA stamps offers a comparable resolution as observed for the PMMA stamps, demonstrating the potential for replicating DNA nanostructure patterns into a wider range of polymers.

To evaluate the yield of the replication process and its impact on the DNA master template, we imaged the DNA master templates and the polymer stamps in the same location (FIGS. 9A through 9F). FIGS. 9A and 9D show the topography and phase image of the DNA nanotubes on the silicon wafer, respectively. The corresponding negative replica on the polymer stamp (FIGS. 9C and 9F) matched well with the DNA master templates (FIGS. 9A and 9D), demonstrating a faithful pattern transfer. However, the nanotubes were partially damaged after the replication (FIGS. 9B and 9E), which may be attributable to the water used to separate the master template and the stamp. To confirm the effect of water, we first used less water and decreased the incubation time (that is, the time between adding water to the silicon wafer and peeling off the polymer stamp). As a result, less DNA damage was observed. In addition, DNA nanotubes were also replicated to the a-perfluoropolyether or a-PFPE polymer stamp (a low surface energy polymer), during which process water was not used. AFM height images indicated that the features and height of DNA nanotubes were preserved after the replication to the a-PFPE polymer (acryloxy perfluoropolyether polymer), confirming that none of the DNA materials were transferred to the stamp. In addition, an AFM phase image also showed that the DNA nanostructure template was not trapped in the polymer stamps. Since the phase image is sensitive to the chemical composition, if DNA nanostructures were trapped in the trenches, the features would be visible in the phase image but not in the height image. Therefore, the yield of the pattern transfer may be assessed by examining the consistency between AFM height and phase images. In all the figures mentioned above, the position and shape of the features in the height and phase images matched with each other, suggesting the absence of trapped DNA nanostructures in the polymer stamps.

In addition to the high yield of replication, the DNA master templates can be also used in a repeated manner to transfer the pattern to a lower surface energy polymer such as a a-PFPE stamp. FIGS. 10A through 10F show the AFM images of the DNA master templates before the replication process and after the $5^{th}$ and $10^{th}$ replication. The features of the DNA master templates were not damaged during the 10 times of replication. The repeated use of DNA master templates would greatly reduce the cost and facilitate its applications. We note that DNA master templates cannot be repeatedly used to transfer the pattern to PMMA or PLLA stamps at this stage because water, which is used to release the stamp, may damage the features of the DNA templates as mentioned above. Thus, to achieve the repeated use of the DNA master templates, polymers with low surface energy (for example, a fluoropolymer such as a-PFPE, having a surface energy of 18.5 mN·m$^{-1}$) may be employed to facilitate the separation of the stamp from the master template without the help of water. In general, a polymer with lower surface area than the substrate from which it is to be removed may be suitable.

Alternatively or additionally, it is also possible to stabilize or protect the DNA nanostructures of the master template using, for example, a thin coating of a material suitable to increase the mechanical and/or chemical stability of the DNA nanostructures of the master template. In general, any material which increases the mechanical and/or mechanical stability of the nucleic acids/DNA may be used. The material should be suitable to be deposited such than the conformation of the master template is maintained at a resolution suitable for the intended use of the final patterned device. A suitable thickness of the coating may readily be determined for a particular materials based upon the achievement of suitable mechanical and/or chemical stability while maintaining the conformation or morphology of the master template at a suitable resolution. It is typically the case, that mechanical/chemical stability will increase with increasing thickness of the coating. However, resolution of the original (uncoated) conformation or morphology will decrease with increasing thickness. Coating thickness is readily optimized for a particular device/methodology and coating material using the methodologies described herein. In general, any metal, metal oxide or inorganic oxide which may be deposited in a conformal coating process at a temperature below 250° C. is suitable for use as a coating in a stabilizing layer hereof. Above 250° C., excessive degradation of the nucleic acids/DNA may occur. As described above, the stability of the DNA master template may be increased by application of a stabilizing layer of a material having a mechanical strength greater than the DNA nanostructures. The stabilizing layer may, for example, be deposited via a conformal, thin film depositions technique such as atomic layer deposition, vacuum deposition, sputtering, chemical vapor deposition or laser assisted deposition. In a number of embodiments, the stabilizing layer material and the deposition technique for the deposition thereof are chosen such that the surface/outer surface of the stabilizing layer (that is, the surface opposite the DNA nanostructures) is generally conformational.

The stability of the stamp hereof is, for example, important in applications of soft lithography. To assess the stability of the imprinted features on a representative PMMA polymer, a DNA triangle-patterned PMMA film was imaged immediately after being peeled off and again after 10 days of aging in the air. As mentioned above, the depth and width (FWHM) of triangular trenches in the fresh PMMA film were 1.0±0.2 nm and 26.5±3.1 nm, respectively. After 10 days of aging in the air, section analysis indicated that the triangular trenches were 0.9±0.1 nm in depth and 27.8±2.8 nm in width. The 10 days of aging in the air did not change the features on the PMMA film significantly. The PMMA stamps possess sufficient stability for long-term storage.

Figure 11C:
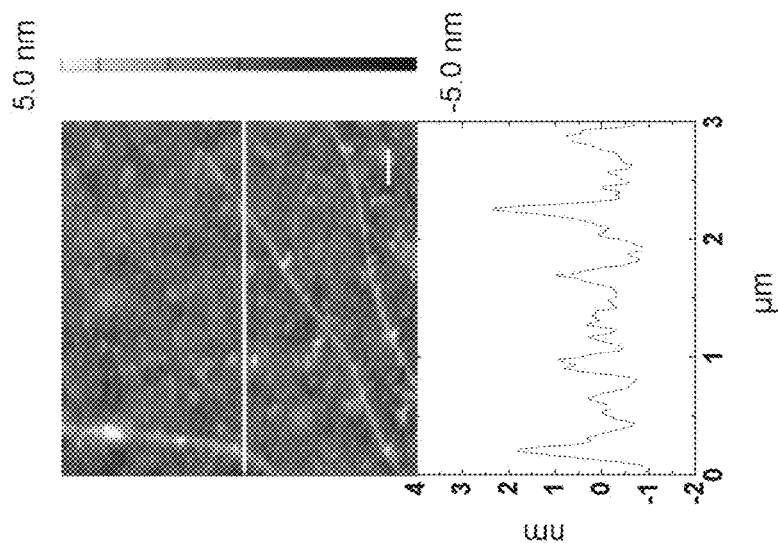
FIG. 11C illustrates AFM height images (top) and corresponding cross-section (bottom) of the DNA nanotube pattern on an a-PFPE substrate transferred from the PMMA stamp by the replica molding, wherein the scale bars represents 300 nm.
Figure 11B:
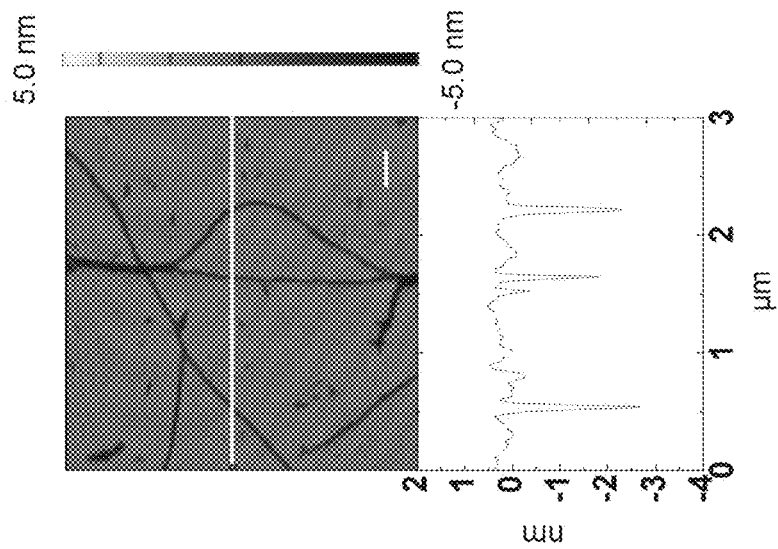
FIG. 11B illustrates AFM height images (top) and corresponding cross-section (bottom) of DNA nanotube patterns on the PMMA stamp, wherein the scale bar represents 300 nm (also shown in FIG. 3B).
Figure 11A:
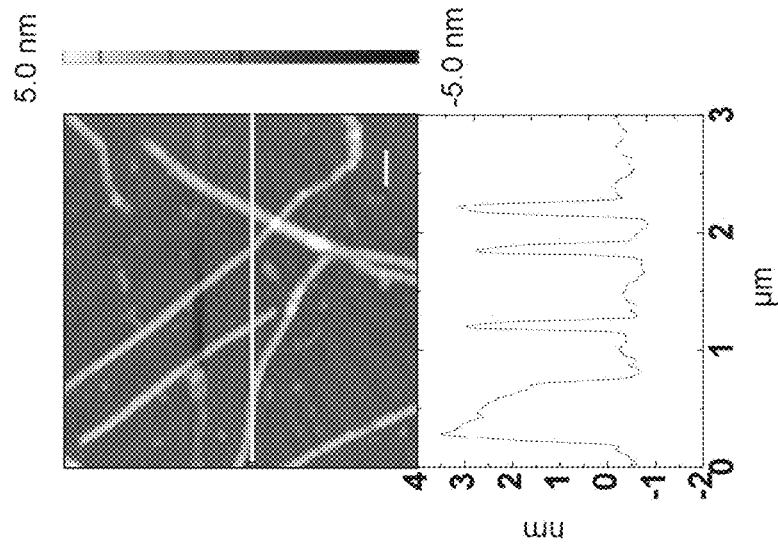
FIG. 11A illustrates AFM height images (top) and corresponding cross-section (bottom) of DNA nanotubes on a silicon wafer, wherein the scale bar represents 300 nm (also shown in FIG. 3A).

The resulting polymer stamp could serve as a mold to transfer the pattern to other materials. FIGS. 11A through 11C illustrate a positive replica or imprint molding of nanotube patterns from a representative PMMA stamp into a photo-curable a-PFPE (acryloxy perfluoropolyether). In these representative studies, the PFPE prepolymer was spin cast as a thin film on the PMMA stamps, with the DNA nanotube relief (negative imprint) and then cured under UV illumination. As a result of the low surface energy of a-PFPE, the PMMA and a-PFPE films could be readily separated. A DNA nanotube pattern was observed on the a-PFPE film with a height of 2.5±0.5 nm and a width of 41.6±6.9 nm, demonstrating a faithful pattern transfer from PMMA stamps to the a-PFPE polymer film (FIGS. 11A through 11C). Compared with the immobilized DNA nanotube master templates, both the depth/height and width of the patterns on the PMMA and a-PFPE were smaller. The average height/depth and width of DNA nanotube master templates, PMMA trenches, and nanotube patterns on the a-PFPE were 4.0 nm and 67.1 nm, 3.2 nm and 39.7 nm, and 2.5 nm and 41.6 nm, respectively. The reason for the decrease in dimensions is not clear. One possibility is that the removal of the salt residues during the fabrication of the PMMA stamp leads to the smaller size. A similar decrease in the feature size has been reported on replicating a carbon nanotube pattern to the a-PFPE and then to the polyurethane. In addition, the surface roughness of the a-PFPE film was measured to be 322.7 pm, which is much larger than that of the PMMA stamp (158.2 pm) but similar to that of the a-PFPE stamp (412.8 pm) that was produced directly from the DNA master templates. High surface roughness of a PFPE mold has been previously reported, indicating that it is likely an intrinsic property of this material and not a result from the molding process. Besides the PMMA stamp, the PLLA stamp could also serve as a mold to transfer the pattern to a polymer such as PFPE with comparable fidelity.

A number of representative studies wherein a stabilizing layer of $Al_2O_3$ was applied to DNA immobilized upon a substrate in forming a master template hereof demonstrated improved chemical and mechanical stability over multiple uses of the master template. For example, stabilizing layer thicknesses of approximately 2 nm, 5 nm, and 20 nm were studied (corresponding to 20, 50, and 200 cycles of atomic layer deposition or ALD). In the cases of the 2 nm and 5 nm stabilizing layer thicknesses, the nanoscale features of DNA nanostructures (for example, DNA nanotubes and DNA origami triangles) were well preserved. However, in case of a 20 nm stabilizing layer thickness, the resolution of the master template pattern was significantly degraded. It was determined that a stabilizing layer thickness of $Al_2O_3$ in the range of 2 nm to 15 nm or 2 nm to 10 nm was suitable. Although the 2 nm stabilizing layer thickness provided for multiple patterning used of the master template, the 5 nm stabilizing layer thickness provided further increases in mechanical stability. Further, the 5 nm stabilizing layer thickness provided increased protection of underlying DNA from $UV/O_3$ exposure as compared to the 2 nm stabilizing layer thickness. Once again, the 20 nm stabilizing layer thickness was found to significantly decrease the resolution of the morphology of the DNA nanostructures. Thus, a stabilizing layer thickness in the range of 3 nm to 10 nm in the case of $Al_2O_3$ may be optimal for both maintaining the morphology and stability of the DNA nanostructures. Such representative studies may, for example, be performed for any stabilizing material/master template combination to readily determine optimal materials and material thicknesses for a stabilizing layer.

In a number of studies of $Al_2O_3$ protective layers, DNA nanostructures were first deposited onto a silicon wafer that was cleaned by piranha solution as described above. The entire surface of the DNA nanostructure master template was coated with a layer of $Al_2O_3$ by ALD. After the ALD process, PLLA solution in dichloromethane (3 wt %) was spin-coated onto the template to prepare a PLLA film. Around the edges of the silicon wafer, the PLLA film was scraped off with a blade and the silicon wafer underneath the PLLA film was revealed. A polydimethyl siloxane (PDMS) film was placed on top of the PLLA film serving as a flexible backing to assist in the separation of the polymer film from the template. Droplets of water were added to the exposed edges of the template, separating the hydrophobic PLLA film from the hydrophilic master template by penetration into the interface between them. After one minute, the PLLA/PDMS film was peeled off and the negative replica of the positive pattern of the DNA nanostructure master template formed on the surface of the film that was in contact with the DNA.

Figure 12B:
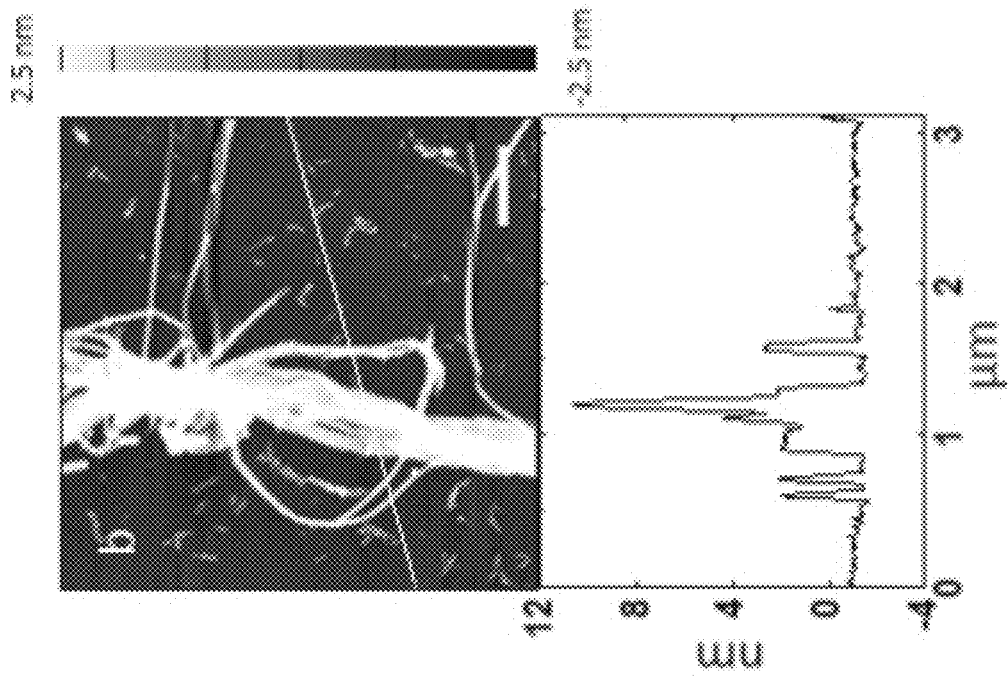
FIG. 12B illustrates an AFM height image (top) and corresponding cross-sectional analysis (bottom) of the DNA nanotubes of FIG. 12A after 20 cycles of ALD of $Al_2O_3$ (approximately 2 nm of $Al_2O_3$ film), wherein the scale bar represents 500 nm.
Figure 12A:
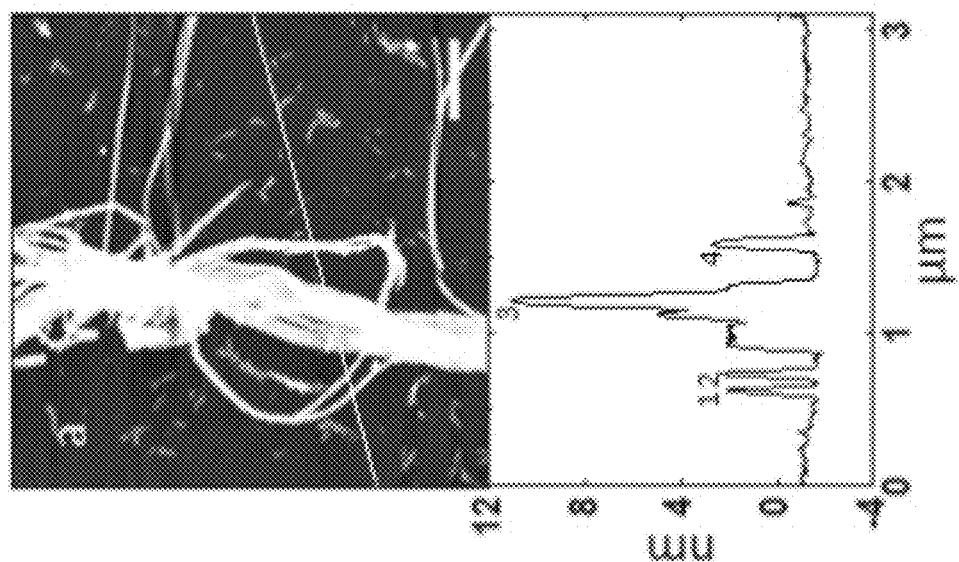
FIG. 12A an AFM height image (top) and corresponding cross-sectional analysis (bottom) of DNA nanotubes after being deposited on a silicon wafer, wherein the scale bar represents 500 nm.
Figures 12C, 12D, 12E:
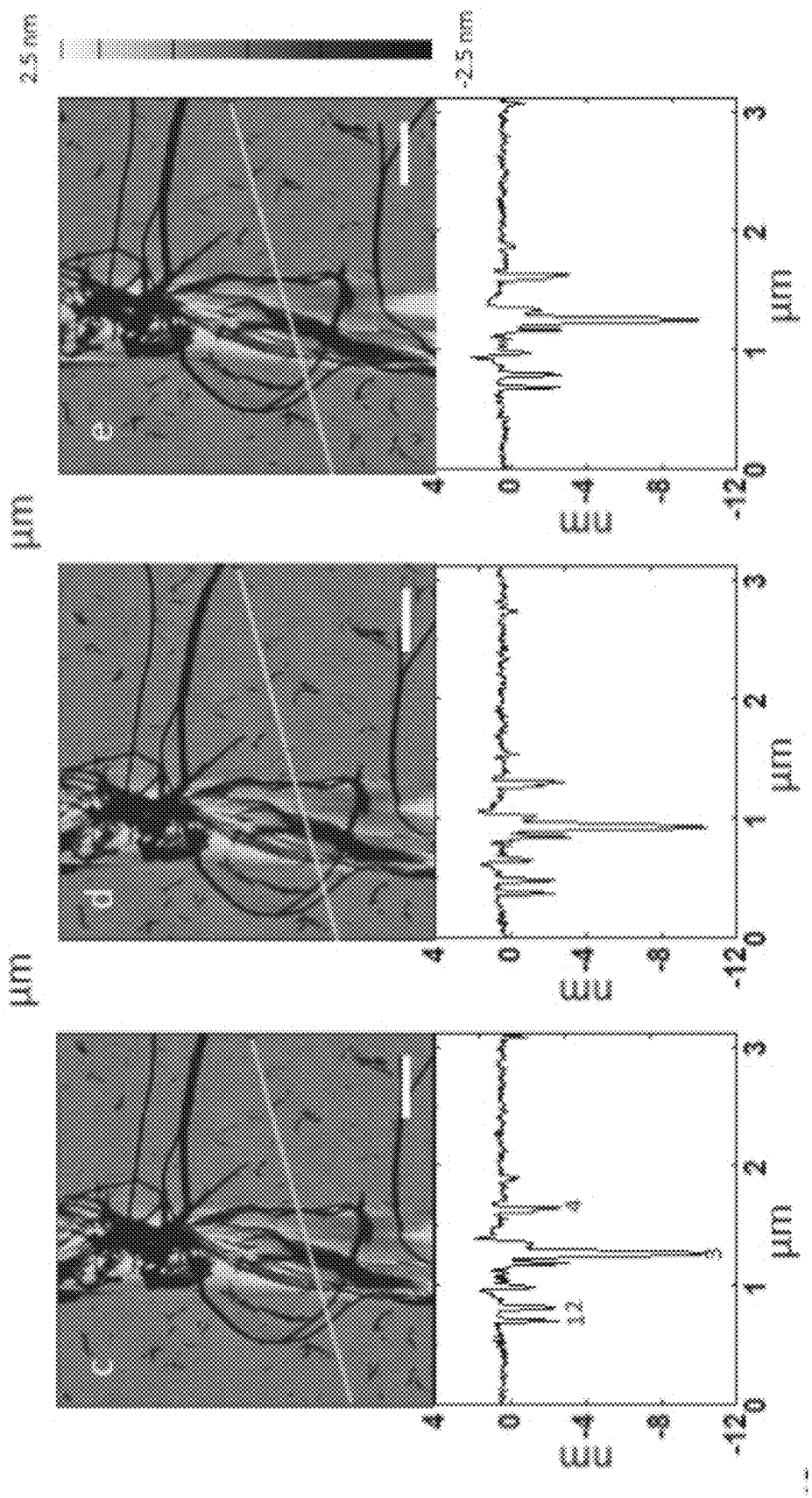
FIG. 12C illustrates a negative replica on a PLLA stamp formed from the template of FIG. 12B imaged 1 day after pattern transfer of the same area, wherein the scale bar represents 500 nm and is the image is mirror-flipped to match the orientations of the AFM images of FIGS. 12A and 12B.
FIG. 12D illustrates a negative replica on a PLLA stamp formed from the template of FIG. 12B imaged 8 days after pattern transfer of the same area, wherein the scale bar represents 500 nm and is the image is mirror-flipped to match the orientations of the AFM images of FIGS. 12A and 12B.
FIG. 12E illustrates a negative replica on a PLLA stamp formed from the template of FIG. 12B imaged 15 days after pattern transfer of the same area, wherein the scale bar represents 500 nm and is the image is mirror-flipped to match the orientations of the AFM images of FIGS. 12A and 12B.
Figure 12G:
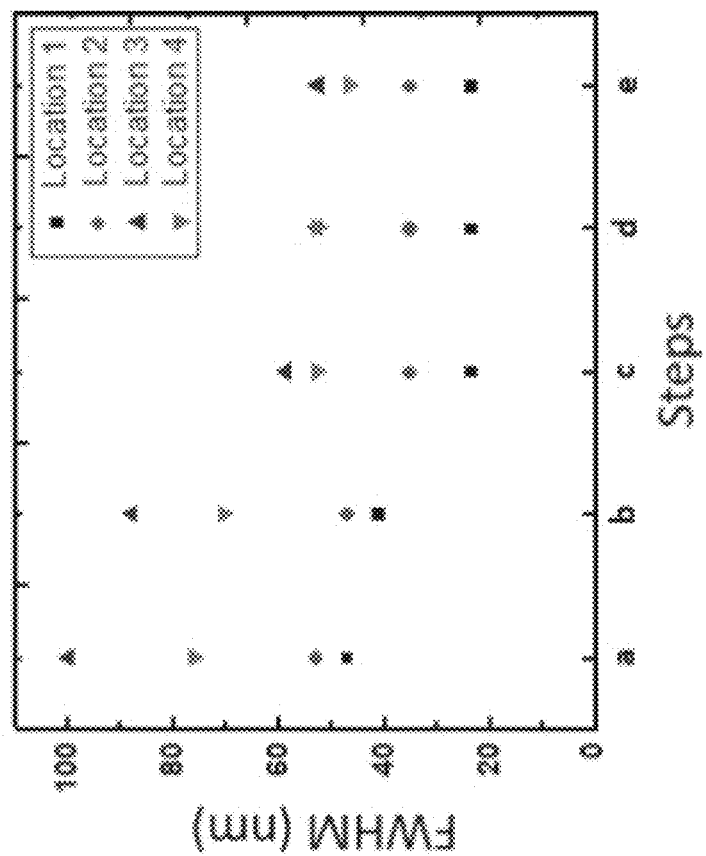
FIG. 12G illustrates FWHM of the DNA nanotubes and their replica trenches in four different locations of the AFM images from FIGS. 12A to 12E wherein locations 1, 2, 3, and 4 correspond to 1, 2, 3, and 4 in the cross-sections of the AFM images of FIGS. 12A and 12C.
Figure 12F:
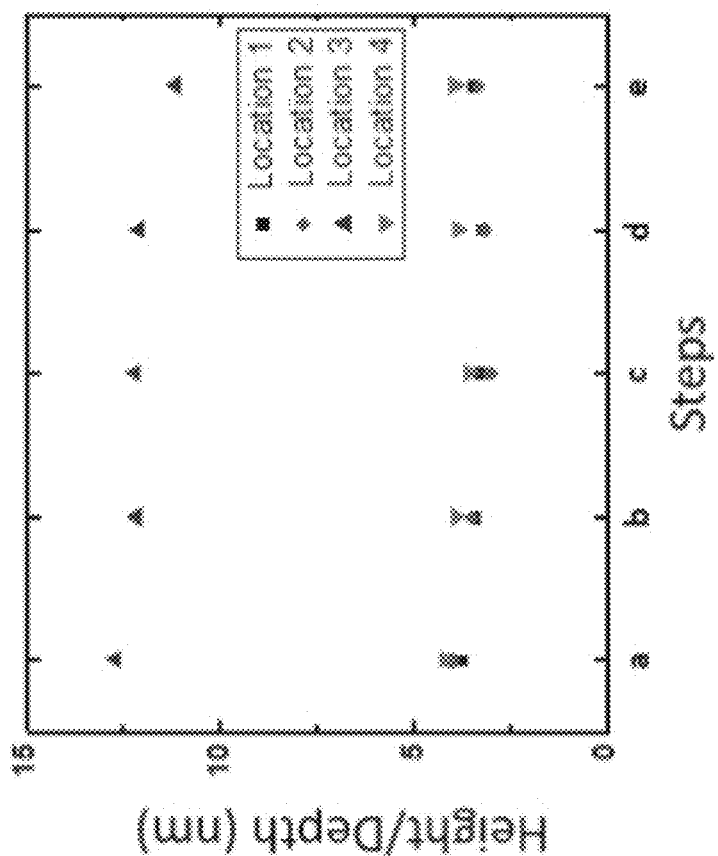
FIG. 12F illustrates height/depth of the DNA nanotubes and their replica trenches in four different locations of the AFM images from FIGS. 12A to 12E wherein locations 1, 2, 3, and 4 correspond to 1, 2, 3, and 4 in the cross-sections of the AFM images of FIGS. 12A and 12C. Scale bars represent 500 nm.

We first evaluated the fabrication process using a self-assembled DNA nanotube template. These DNA nanotubes were 30-70 nm in width and up to 60 pm in length as described above. The nanotubes were collapsed after deposition onto a silicon wafer, showing an average height (n=10) of 3.4±0.1 nm by AFM. The surface topography of the DNA nanotube master template before (FIG. 12A) and after (FIG. 12B) deposition of an approximately 2 nm thick $Al_2O_3$ layer and the corresponding PLLA film (FIG. 12C) were characterized by AFM. On the DNA nanotube master template, single DNA nanotubes were observed along with some bundles. After the PLLA stamp was peeled off, the negative replicas of the DNA nanotubes were observed on the polymer stamp, demonstrating a faithful replication process. To quantify the degree of conservation of the surface topography, height/depth and full width at half maximum (FWHM) were measured in four different locations in the AFM images and compared at the same locations throughout the fabrication process (see FIGS. 12F and 12G; after actions/steps from FIGS. 12A to 12E). Taking location 1 as an example, the height of the DNA nanotube before (3.73 nm) and after (3.39 nm) the ALD of the $Al_2O_3$ film was in good agreement with the average depth of the trench (3.32 nm, measured three times at location 1 over a 15 day period) on the PLLA stamp. The FWHM of the nanotube (46.99 nm) slightly decreased after the ALD (41.14 nm) but was significantly larger than the average FWHM of the trench (23.50 nm) on the polymer stamp. The decrease of the FWHM after the ALD is suspected to be a result of the dehydration of the nanotube during the ALD process and/or the differences in the probe-sample interactions of the individual AFM tips, which can give different measurements of the same sample. We attributed the decrease in the FWHM from the DNA nanotube master template to the PLLA stamp to the AFM probe convolution effect. These results confirm a faithful pattern transfer from the DNA nanotube master template to the PLLA stamp through the ALD of the $Al_2O_3$ layer on the template with high fidelity. Moreover, the patterned PLLA stamp was found to be stable at room temperature. We stored the stamp in a plastic petri dish and imaged it again after 1 week (FIG. 12D) and 2 weeks (FIG. 12E) at the same location. Both the depth and FWHM of the trenches along with cross-sectional analysis on the PLLA stamp at the four locations remained consistent, demonstrating the long-term stability of the PLLA stamp.

Figures 13A, 13B, 13C, 13D:
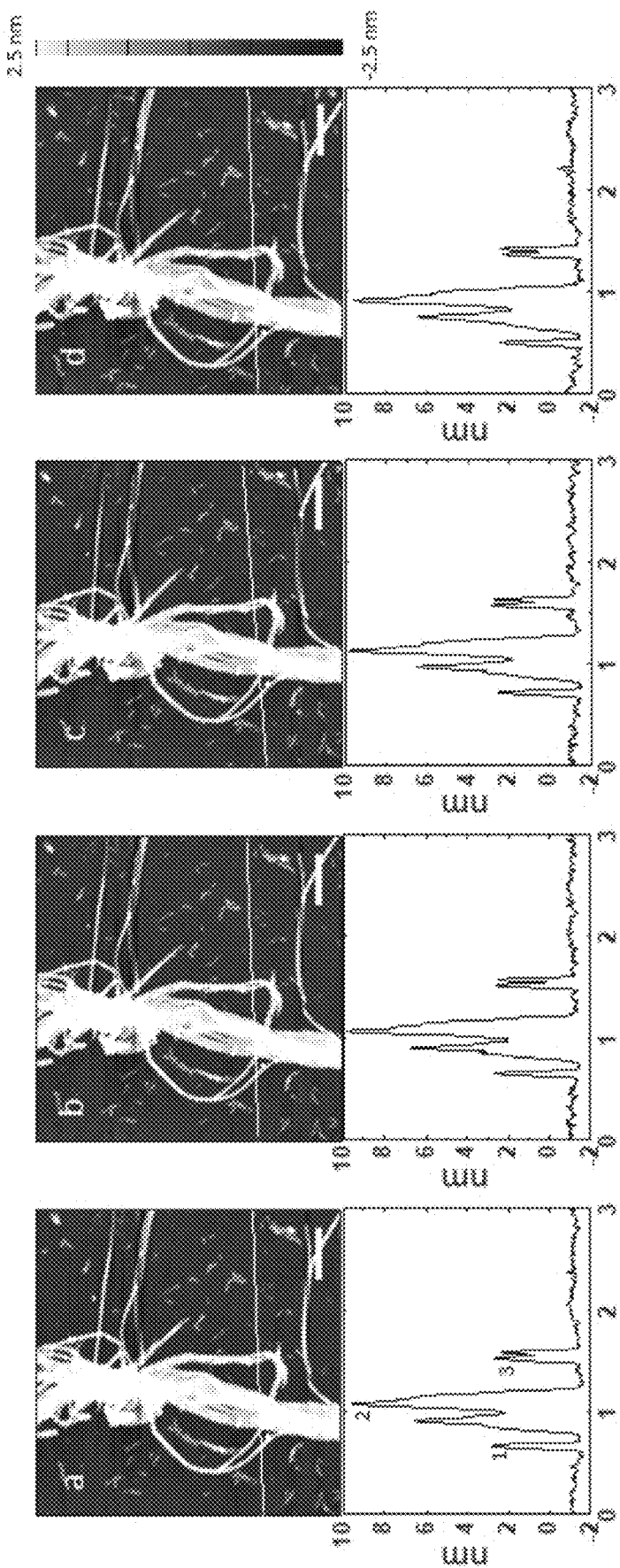
FIG. 13A illustrates an AFM height image (top) and corresponding cross-sectional analysis (bottom) of DNA nanotubes after being deposited on a silicon wafer, wherein the scale bar represents 500 nm (this image is also illustrated in FIG. 12A and is set forth again for ease of comparison with subsequent images).
FIG. 13B illustrates an AFM height image (top) and corresponding cross-sectional analysis (bottom) of the DNA nanotubes of FIG. 13A after 20 cycles of ALD of $Al_2O_3$ (approximately 2 nm of $Al_2O_3$ film), wherein the scale bar represents 500 nm (this image is also illustrated in FIG. 12B and is set forth again for ease of comparison with subsequent images).
FIG. 13C illustrates an AFM height image (top) and corresponding cross-sectional analysis (bottom) of the DNA nanotubes of FIG. 13B after a first pattern transfer to a PLLA stamp, wherein the scale bar represents 500 nm.
FIG. 13D illustrates an AFM height image (top) and corresponding cross-sectional analysis (bottom) of the DNA nanotubes of FIG. 13B after a second pattern transfer to a PLLA stamp, wherein the scale bar represents 500 nm.
Figures 13E, 13F, 13G, 13H:
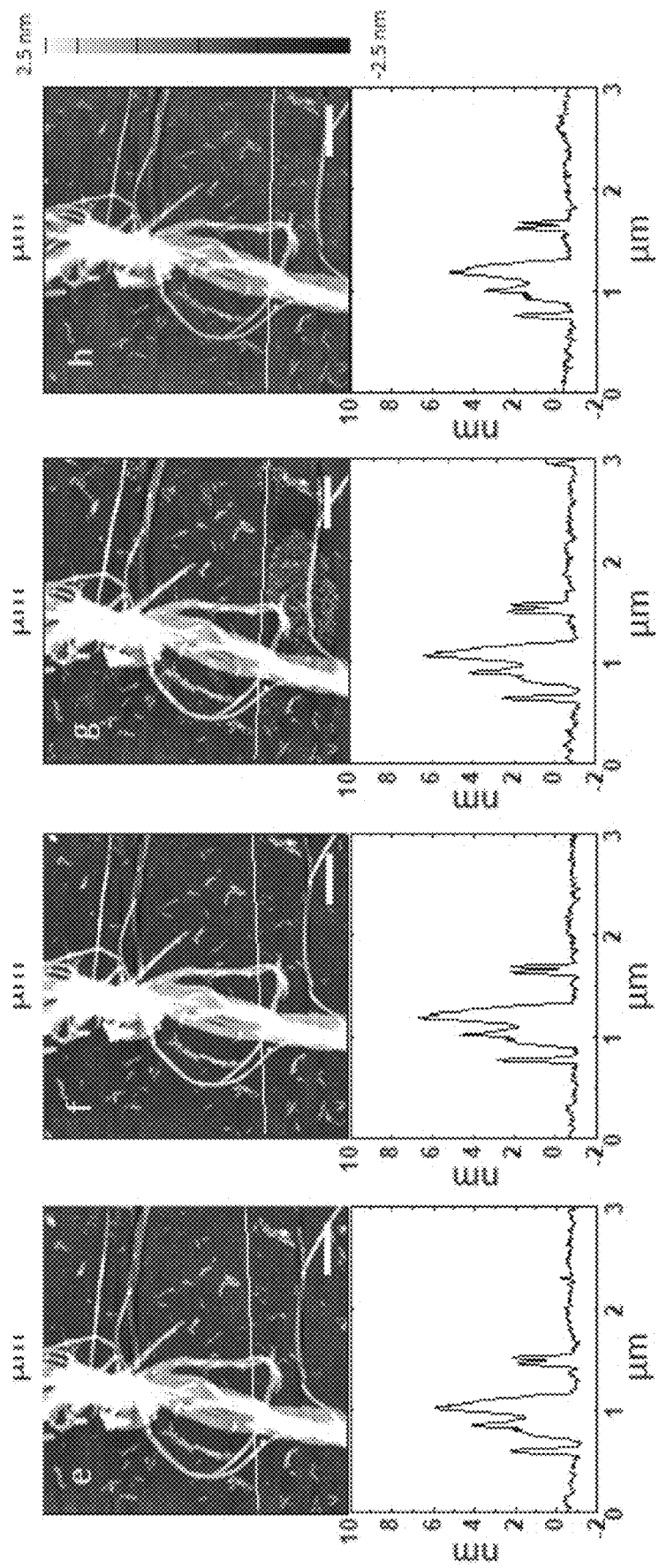
FIG. 13E illustrates an AFM height image (top) and corresponding cross-sectional analysis (bottom) of the DNA nanotubes of FIG. 13B after a third pattern transfer to a PLLA stamp, wherein the scale bar represents 500 nm.
FIG. 13F illustrates an AFM height image (top) and corresponding cross-sectional analysis (bottom) of the DNA nanotubes of FIG. 13B after a fourth pattern transfer to a PLLA stamp, wherein the scale bar represents 500 nm.
FIG. 13G illustrates an AFM height image (top) and corresponding cross-sectional analysis (bottom) of the DNA nanotubes of FIG. 13B after a fifth pattern transfer to a PLLA stamp, wherein the scale bar represents 500 nm (the DNA master template was contaminated before the fifth spin coating of PLLA in dichloromethane solution).
FIG. 13H illustrates an AFM height image (top) and corresponding cross-sectional analysis (bottom) of the DNA nanotubes of FIG. 13B after UV/$O_3$ treatment for 1 h and washing with deionized water.
Figures 13I, 13J:
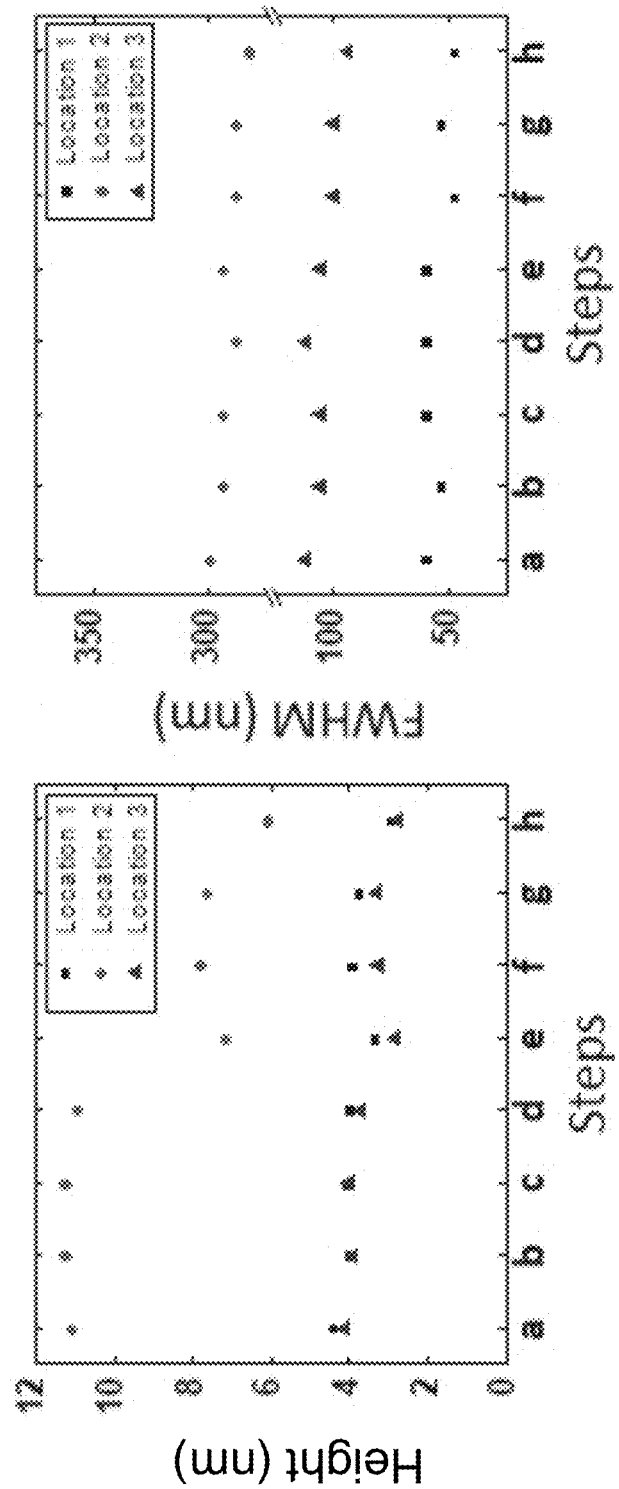
FIG. 13I illustrates height of the DNA nanotubes and their replica trenches in three different locations of the AFM images from FIGS. 13A to 13E, wherein locations 1, 2, and 3 correspond to 1, 2, and 3 in the cross-sections of the AFM images.
FIG. 13J illustrates FWHM of the DNA nanotubes and their replica trenches in three different locations of the AFM images from FIGS. 13A to 13E, wherein locations 1, 2, and 3 correspond to 1, 2, and 3 in the cross-sections of the AFM images.
Figures 14A, 14B, 14C, 14D:
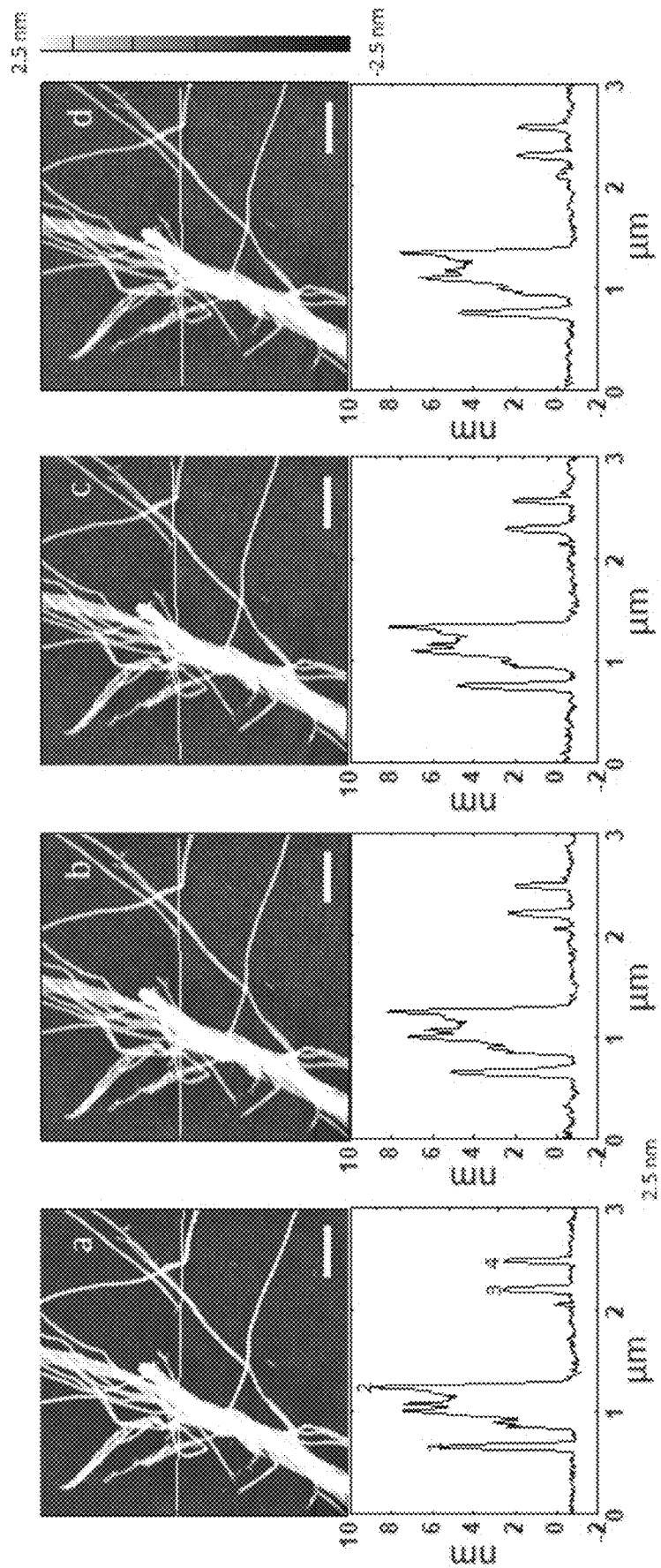
FIG. 14A an AFM height image (top) and corresponding cross-sectional analysis (bottom) of DNA nanotubes after being deposited on a silicon wafer, wherein the scale bar represents 500 nm.
FIG. 14B illustrates an AFM height image (top) and corresponding cross-sectional analysis (bottom) of the DNA nanotubes of FIG. 14A after 50 cycles of ALD of $Al_2O_3$ (approximately 5 nm of $Al_2O_3$ film), wherein the scale bar represents 500 nm.
FIG. 14C illustrates an AFM height image (top) and corresponding cross-sectional analysis (bottom) of the DNA nanotubes of FIG. 14B after a first pattern transfer to a PLLA stamp, wherein the scale bar represents 500 nm.
FIG. 14D illustrates an AFM height image (top) and corresponding cross-sectional analysis (bottom) of the DNA nanotubes of FIG. 14B after a fifth pattern transfer to a PLLA stamp, wherein the scale bar represents 500 nm.
Figures 14E, 14F:
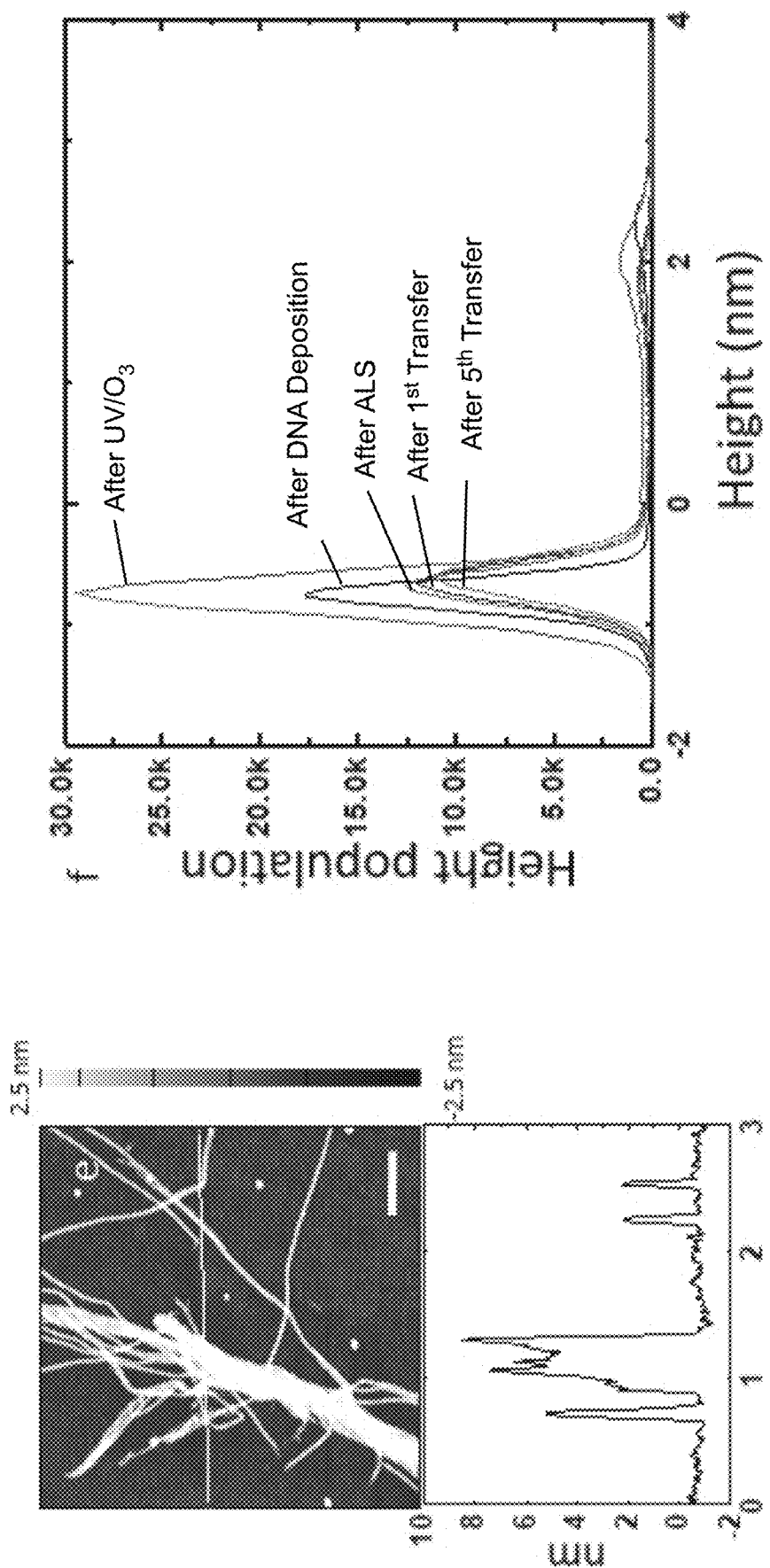
FIG. 14E illustrates an AFM height image (top) and corresponding cross-sectional analysis (bottom) of the DNA nanotubes of FIG. 14B after UV/$O_3$ treatment for 1 h and washing with deionized water.
FIG. 14F illustrates histograms of the AFM height images from FIGS. 14A to 14E.
Figure 14H:
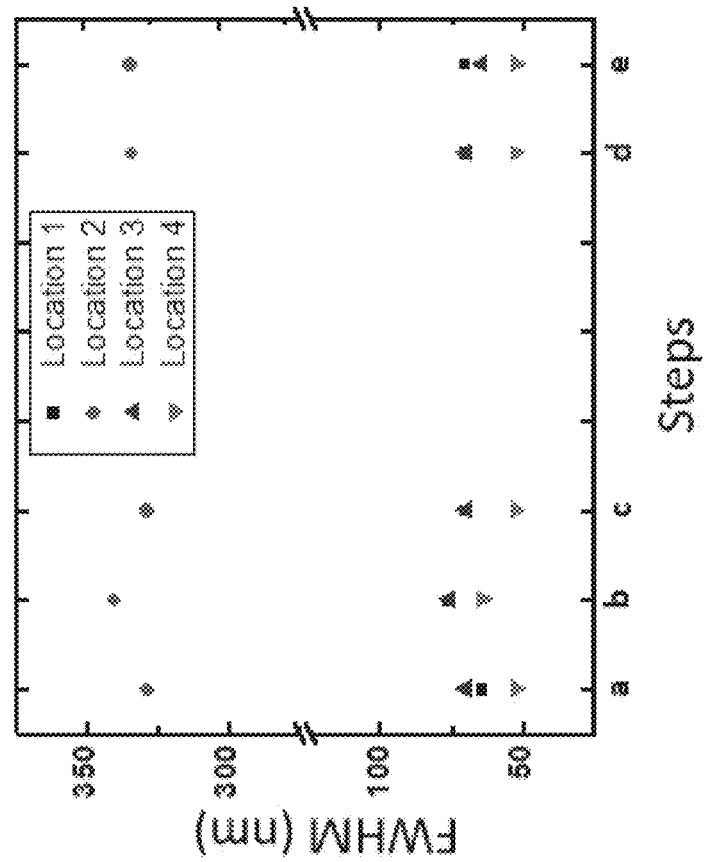
FIG. 14H illustrates FWHM of the DNA nanotubes and their replica trenches in four different locations of the AFM images from FIGS. 14A to 14E wherein locations 1, 2, 3, and 4 correspond to 1, 2, 3, and 4 in the cross-sections of the AFM image of FIG. 14A.
Figure 14G:
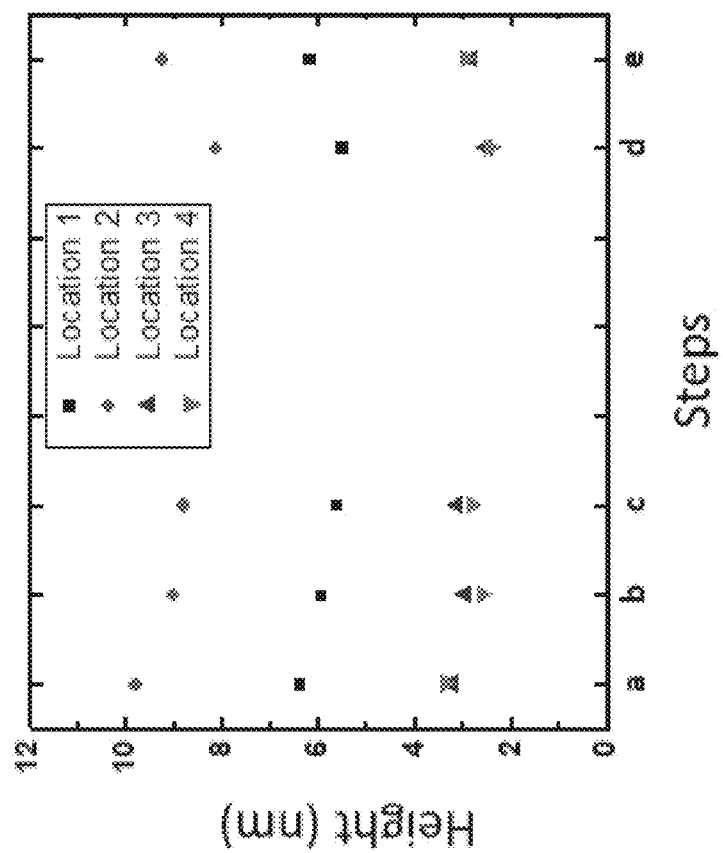
FIG. 14G illustrates height of the DNA nanotubes and their replica trenches in four different locations of the AFM images from FIGS. 14A to 14E wherein locations 1, 2, 3, and 4 correspond to 1, 2, 3, and 4 in the cross-sections of the AFM image of FIG. 14A.

As described above, an important challenge in using the DNA master template without a protective film is the damage of DNA during the separation of the polymer film from the template. We attributed such damage to the water we used to assist the separation. The DNA nanostructures were still damaged even if we replaced the water with the buffer solution that was used to synthesize and store the DNA nanostructures. To evaluate the effectiveness of the protective $Al_2O_3$ film on the DNA master template, we imaged the DNA nanostructures in the same location after deposited on a silicon wafer, after 20 cycles of ALD of $Al_2O_3$, and after 1st, 2nd, 3rd, 4th and 5th replication to PLLA stamps (see FIG. 13A-13G). As the AFM images indicate, the surface morphology of the DNA template was still well maintained after the 1st pattern transfer (FIG. 13C), showing that the stability of the nanostructures was increased by the approximately 2 nm thick $Al_2O_3$ film. However, as the replication process was repeated another four more times, the overall height of the DNA nanostructures decreased although their shape was unchanged. The height difference between the absolute maximum peak (which represents the background silicon wafer) and the next relative maximum peak (which represents the height of the DNA nanotubes) significantly decreased during the 3rd replication process. The height and FWHM with cross-sectional analysis of the DNA template at the three same locations supported the change in the height of the template (FIGS. 3I and J, respectively). The FWHM at all three locations was comparable during the 3rd replication process. The height of the DNA nanotube bundle decreased from 10.90 nm to 7.12 nm, while the height of the single DNA nanotubes decreased from 3.97 nm and 3.70 nm to 3.32 nm and 2.85 nm, respectively. These results indicate that the higher feature (decrease of approximately 35% of its initial height) on the template was less mechanically stable than the lower one (decrease of approximately 15% of its initial height). Along this direction, holes were also formed after the 2nd and 5th pattern transfer to the PLLA stamps, high-lighted by the yellow arrows. The AFM height and phase images with cross-sectional analysis of the hole after the 5th pattern transfer show that the depth of the hole matched well to the thickness of the $Al_2O_3$ layer and the bundle of the DNA nanotubes originally presented in the hole was removed, possibly by the water used during the separation of the stamp. Overall, the protective 2 nm $Al_2O_3$ layer marginally increased the stability of the DNA nanostructures.

Being able to clean the master template is also important for its repeated use. During the five times of the pattern transfer to the PLLA stamps, the surface of the DNA master template was contaminated with polymer residues (see FIG. 3G, lower middle area). To verify whether the polymer residues on the DNA master template can be removed with $UV/O_3$ treatment, the template after the 5th replication process was subjected to $UV/O_3$ cleaning for an hour, washed with deionized (DI) water, and dried with $N_2$ gas (FIG. 3H). The AFM images before and after the treatment show that the morphology of the DNA template was not altered while the polymer residues were removed. The height difference between the absolute maximum peak and the next relative maximum peak in a histogram (not shown) of the AFM image, however, significantly decreased from 2.28 nm to 1.69 nm. The height of the DNA nanotubes at three different locations decreased from 3.72 nm, 7.58 nm, and 3.29 nm to 2.87 nm, 6.07 nm, and 2.78 nm, respectively (FIG. 3I). The FWHM at these locations also decreased from 52.88 nm, 287.94 nm, and 99.89 nm to 46.98 nm, 281.87 nm, and 93.96 nm, respectively (FIG. 3J). These results suggest that although the $UV/O_3$ treatment is able to eliminate the organic residues on the surface of the master template, the DNA nanostructures beneath the 2 nm of $Al_2O_3$ coating are likely damaged by the oxidation by $O_3$.

The long-term stability of the ALD-coated template was also studied. We kept the template in a plastic petri dish that was stored in a common lab bench drawer for 40 days. AFM images with corresponding cross-sectional analysis were scanned in the same location of the template at the beginning and the end of this period. Not surprisingly, the 40 days of aging in air did not alter the surface topography of the DNA nanostructure master template. While the height of the DNA nanotubes at four different locations remained consistent, the FWHM at these locations slightly decreased. We speculate that the decrease in the FWHM results from the differences between the AFM probe convolution effects of the individual tips because the decreases are similar to the resolution limit of the AFM image (that is, one or two pixels in the AFM images). At room temperature, solid-state DNA undergoes degradation and/or aggregation within 30 days when it is exposed to atmospheric water and oxygen. Compared to DNA, which is a soft material, $Al_2O_3$ is much more stable and robust. Through the conformational coating of $Al_2O_3$, the shelf life of the DNA nanotubes is assumed to be increased while maintaining their morphology longer than the nanotubes without a protective film. Overall, the 20 cycles of ALD of $Al_2O_3$ allow the DNA nanostructure master template to possess enough chemical stability for long-term storage.

Figure 15:
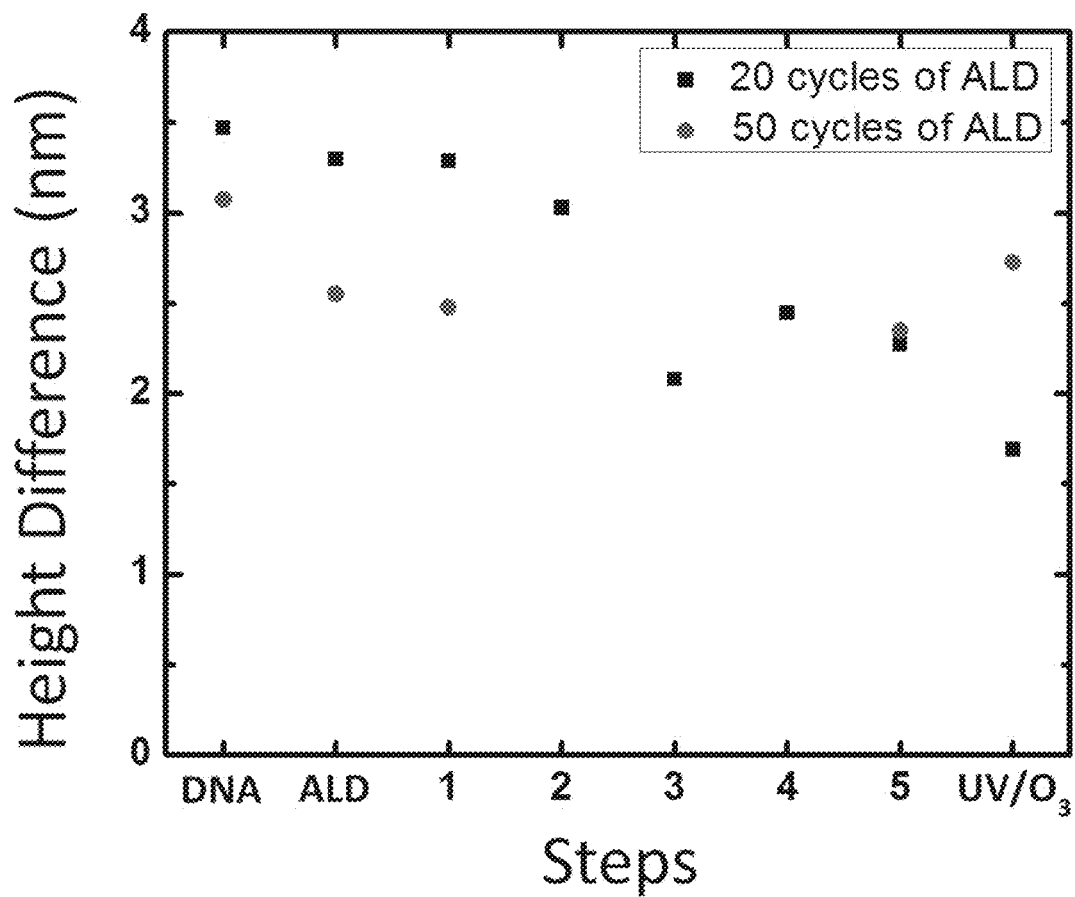
FIG. 15 illustrates a comparison of the height differences between the maximum peaks for 20 cycles of ALD and 50 cycles of ALD.

As described above, the approximately 2 nm thick $Al_2O_3$ layer increased the mechanical stability of the DNA nanotube master template to a limited extent. To verify whether the mechanical stability of the template could be strengthened with the increased thickness of the $Al_2O_3$ layer while preserving its nanoscale morphology, an approximately 5 nm thick $Al_2O_3$ layer was deposited onto a substrate/template, and the reusability and morphology conservation were evaluated. The DNA nanostructures in the same location were scanned with AFM after deposition on a silicon wafer, 50 cycles of ALD of $Al_2O_3$, 1st and 5th replication to PLLA stamps, and exposed to $UV/O_3$ treatment, washed with DI water, and dried with $N_2$ gas (FIGS. 14A-E). Throughout each stage of the fabrication process, we analyzed the height difference between the absolute maximum peak and the next relative maximum peak in the histogram and height and FWHM at four different locations. All these data showed little change throughout the fabrication process (FIGS. 4F-H). The approximately 5 nm thick $Al_2O_3$ film is impermeable to $O_3$ and protects the underlying DNA nanostructures against the $UV/O_3$ oxidation. Also, no holes arising from breakage of the protective $Al_2O_3$ film were found, demonstrating that the both chemical and mechanical stabilities of the DNA nanostructure master template improved with a thicker $Al_2O_3$ layer. The direct comparison of the height differences between the maximum peaks of the histograms of the 20 and 50 cycles of ALD of $Al_2O_3$ through the multiple pattern transfer clearly shows the increased stability of the approximately 5 nm thick $Al_2O_3$ film compared to the approximately 2 nm thick film (FIG. 15). The polymer residue was not observed on the surface of the DNA nanotube master template with the approximately 5 nm thick $Al_2O_3$ film even after the 5th replication. The surface roughness of $Al_2O_3$ film grown using ALD slowly increased as the number of cycles increased. Therefore, it does not cause the reduced polymer adsorption on the approximately 5 nm thick $Al_2O_3$ film.

The DNA nanotubes tested with $Al_2O_3$ films above were simple one-dimensional linear structures. To evaluate the effectiveness of a protective conformational coating on complex patterns, DNA origami tri-angle nanostructures as discussed above were employed as the master templates for the pattern transfer to the PLLA stamp. The DNA origami triangle was a single layer of DNA double strands and had a theoretical height of 2 nm. As described above, the triangle consists of three trapezoidal domains formed by folding an M13mp18 scaffold strand with short synthetic staple strands. Among the three trapezoidal domains, one has a dangling loop. These domains are further connected to each other by bridging the edges of the domains with the staple strands as described in connection with FIG. 7A. There are three holes at each of the vertex and one large triangular hole in the center of the DNA origami triangle. AFM images show that the three holes at the vertex, the central triangular hole, and the dangling loop were clearly visible before and after ALD, and after replication process with both approximately 2 nm and approximately 5 nm thick $Al_2O_3$ layers (FIGS. 16A, 16B and 16D). Through these actions or processes, the three holes at the vertex were frequently seen as a linear gap and the depth of the holes or the linear gap was much smaller than the height of the nanostructures as a result of the limited resolution of the AFM images. The loop might not be seen in some DNA origami triangles if the loops were folded above or beneath the DNA structures. According to the cross-sectional analysis of the AFM images, the average height, FWHM, inner length and outer length of the DNA origami tri-angles remained comparable throughout the replication process including the ALD (FIG. 17A-17D). All these results demonstrated that the protective $Al_2O_3$ film successfully preserves the surface morphology or conformation of the complex DNA nanostructures such as origami triangle nanostructures.

After the replication process, triangular trenches resembling the shape of the DNA origami triangles were formed on the PLLA films (FIG. 16C). Compared to the dimensions of the DNA triangles with the protective layers on the templates, the average depth of the trenches remained consistent with the average height of the triangles (FIG. 17A). Because of the AFM probe convolution, however, the average outer length (the edge length of the trench measured outside of the triangle) and FWHM of the triangular trenches decreased and the average inner length of the trenches increased (FIGS. 17B-17D). Both the patterns corresponding to the dangling loop and the three holes at the vertex were transferred to the PLLA stamps, but they were difficult to find in the trenches compared to the original features on the templates. On the PLLA stamps, the holes or the linear gap between the trapezoidal domains of the DNA origami triangles were replicated as a small bump at the vertex of the triangular trenches. The height of the bump, however, never reached the height of the DNA origami triangles, and the bump was frequently not observed in some trenches, as the bump on the PLLA stamp peeled off from the DNA origami triangle master template without the protective film. We attributed these observations to the mechanical instability of the bumps during the scanning with AFM and/or the intrinsic limitation of the resolution of the pattern transfer. In the latter case, the large PLLA molecule may not be able to completely fill the nanometer-sized holes in the DNA origami triangles during the spin-coating process. A decrease in the feature size of the DNA nanostructure appears to result in height decrease and/or lost features in the polymer stamp. Overall, the PLLA film is capable of replicating the overall features of the complex DNA origami triangles with high fidelity and the local features below approximately 5 nm only to some extent even with the presence of the protective approximately 2 nm or approximately 5 nm thick $Al_2O_3$ layers.

We have demonstrated how the surface morphology of the DNA nanostructures was influenced as the thickness of the protective $Al_2O_3$ film was further increased. We coated both the DNA nanotube and the DNA origami triangle master templates with an approximately 20 nm thick $Al_2O_3$ layers and compared their AFM images before and after 200 cycles of ALD. With the approximately 20 nm thick $Al_2O_3$ film, the DNA nanotubes were still visible and the FWHM stayed consistent. The height of the DNA nanotubes, however, considerably decreased from 3.83 nm, 9.36 nm, 3.85 nm, and 3.94 nm to 1.54 nm, 2.81 nm, 1.66 nm, and 1.71 nm, respectively. In case of the DNA origami triangles, the DNA nanostructures with the average height of 1.68 nm (n=10) were barely seen and the height profile along the individual DNA triangles also showed the significant increase of roughness. Although the methodologies hereof were not optimized, these results indicate that there may be a limit to the thickness of the protective $Al_2O_3$ film deposited by ALD to maintain the nanoscale feature of the DNA nanostructure on the template.

We have also demonstrated a general method of fabricating polymer stamps using DNA nanostructure master templates with high fidelity. Various DNA nanostructures, including DNA nanotubes, 1D λ-DNA, 2D DNA brick crystals with 3D features, hexagonal DNA 2D arrays, and triangular DNA origami, have been tested as master templates to replicate their features in representative polymers such as PMMA, PLLA and a-PFPE. A resulting representative PMMA (negative pattern) stamp has been applied as a mold to transfer a positive pattern to a representative, photo-crosslinked a-PFPE polymer. In addition to replica molding, the polymer stamp can be potentially used in many other applications, in particular contact printing of small molecules and proteins. Because DNA master templates with diverse features can be rationally designed and constructed, the methods, devices and systems hereof enable the fabrication of polymer stamps with varieties of nanoscale features, some of which (for example, alphabets) are inaccessible by other self-assembly methods. The integration of DNA nanotechnology with soft lithography offers alternative master templates and enriches the nanoscale features of polymer stamps to facilitate their applications.

We have further demonstrated a method to increase the stability of DNA nanostructure master templates through the conformal growth of an inorganic oxide film by ALD and demonstrated its usefulness in soft lithography patterning of polymer films. DNA nanotubes and origami triangles with $Al_2O_3$ films of approximately 2 nm, approximately 5 nm or approximately 20 nm thickness have been tested as the master templates to imprint their nanoscale features to PLLA films. As the thickness of the $Al_2O_3$ coating grows, the mechanical and/or chemical stability increases while some of the nanoscale features of the DNA nanostructures are lost. Based on our results, the representative conformational coating of the approximately 5 nm thick $Al_2O_3$ layer to the DNA nanostructures provides a good compromise between increasing the stability and maintaining the nanoscale feature of the master template for repeated use in soft lithography. In addition, the approximately 5 nm thick $Al_2O_3$ layer offered good protection to the underlying DNA nanostructures from exposure to $UV/O_3$. Although our study focused on the ALD of $Al_2O_3$, other metals, metal oxides, or inorganic oxides can also be used as long as they can be conformally coated at a temperature below 250° C. Above 250° C., the degradation of DNA nanostructures deposited onto silicon wafers starts to occur although the decomposition residue may still maintain their nanoscale features. The conformal protective film significantly improves the chemical and mechanical stabilities of DNA nanostructures, allowing them to be used in environments that are incompatible with pristine DNA nanostructures.

EXPERIMENTAL

Materials.

Silicon wafer (Si[110], with native oxide) was purchased from University Wafers (South Boston, Mass.). The scaffold strand M13mp18 for the triangular DNA origami and λ-DNA were purchased from Bayou Biolabs (Metairie, La.) and New England Biolabs (Ipswich, Mass.), respectively. Short staple strands for the triangular DNA origami and DNA strands for DNA nanotubes, two-dimensional (2D)

arrays and 2D brick crystals were synthesized by Integrated DNA Technologies (Coralville, Iowa). 2-Amino-2-(hydroxymethyl)-1,3-propanediol (Tris), ethylenediaminetetraacetic acid (EDTA), magnesium acetate tetrahydrate, sulfuric acid, hydrogen peroxide solution (30% $H_2O_2$), poly (methyl methacrylate) (PMMA), and poly(L-lactic acid) (PLLA) were purchased from Sigma-Aldrich (St. Louis, Mo.). Acetic acid (Glacial) and nickel chloride hexahydrate (ACS Certified) were purchased from Fisher Scientific (Fair Lawn, N.J.). Dichloromethane was purchased from Acros Organics (Fair Lawn, N.J.). Ethanol was purchased from Sigma-Aldrich and Decon Labs, Inc. (King of Prussia, Pa.). PDMS film was prepared with Sylgard 184 silicone elastomer kit (Dow Corning, Midland, Mich.). Fluorinated acrylate oligomer CN4002 (1400 g $mol^{-1}$) was purchased from Sartomer Americas (Exton, Pa.) and the photoinitiator Irgacure 4265 was purchased from BASF (Florham Park, N.J.). All materials were used as received. UV lamp (100 watts, 365 nm) was purchased from Cole-Parmer (Vernon Hills, Ill.). High purity water (18.3 MΩ) was produced by a water purification system (Barnstead MicroPure Standard, Thermo Scientific, Waltham, Mass.) and used throughout the entire experiment.

Preparation of a Silicon Wafer.

A silicon wafer with a native oxide layer was cleaned by hot piranha solution [7:3 (v/v) concentrated H2SO4/30% H2O2]. After H2O2 was slowly added to concentrated H2SO4 in a glass petri dish containing the silicon wafer, a glass cover was placed and a heating plate was set to 40° C. After 20 min, the heating plate was turned off and the piranha solution was allowed to cool down for an additional 10 min. The wafer was thoroughly washed with deionized water and dried with N2 gas. Warning: Piranha solution is a strong oxidizing reagent and reacts violently with organic materials. All work should be handled in a fume hood with extra caution. Proper protective equipment is required.

Preparation and Deposition of DNA Nanotubes on a Silicon Wafer.

The design of DNA nanotubes was previously reported. See, for example, Liu, H. P.; Chen, Y.; He, Y.; Ribbe, A. E.; Mao, C. D. Approaching the Limit: Can One DNA Oligonucleotide Assemble into Large Nanostructures? *Angew. Chem., Int. Ed.* 2006, 45, 1942-1945, the disclosure of which is incorporated herein by reference. The DNA single strand was diluted in TAE/$Mg^{2+}$ buffer (125 mM $Mg^{2+}$) with a final concentration of 1 µM. The DNA solution was slowly cooled from 95° C. to 23° C. in two days. Nickel chloride solution (70 µL of 2 mM) was placed on a cleaned silicon wafer and immediately blown away with nitrogen gas. Annealed DNA nanotube solution was deposited on the pretreated silicon wafer and incubated in a humid chamber for 15 minutes. The sample was dried using nitrogen gas, immersed in ethanol: water (9:1) solution for 10 seconds to remove the salts, and then dried using nitrogen gas again.

Preparation and Deposition of DNA 2D Brick Crystals on a Silicon Wafer.

Unpurified DNA strands were mixed in an equimolar stoichiometric ratio in 0.5×Tris/EDTA buffer [Tris (5 mM, pH 8.0) and EDTA (1 mM)] supplemented with 40 mM $MgCl_2$. The final concentration of each strand was 200 nM. The DNA solution was annealed in a PCR thermo-cycler using a fast linear cooling step from 80° C. to 60° C. over 1 hour and then from 60° C. to 25° C. over 72 hours. DNA solution was diluted by 10 times in 0.5×Tris/EDTA buffer with 40 mM $MgCl_2$. The diluted DNA solution (10 µL) was deposited on the cleaned silicon wafer and incubated in a humid chamber for 15 minutes. The sample was dried using nitrogen gas, immersed in ethanol:water (9:1) solution for 5 seconds, and then dried using nitrogen gas again.

Preparation and Deposition of DNA Two-Dimensional (2D) Arrays Assembled from the 3-Point-Star Motif on a Silicon Wafer.

The design of the DNA 2D array was previously reported. To increase the surface coverage, DNA 2D arrays were directly assembled on the silicon wafer. Three DNA single strands were mixed in TAE/$Mg^{2+}$ buffer at a concentration of 25 nM in terms of the 3-point-star motifs. The cleaned silicon wafer was immersed in 10×TAE/$Mg^{2+}$ buffer [Tris (400 mM, pH 8.0), acetic acid (200 mM), EDTA (10 mM), and Mg $(CH_3COO)_2$ (125 mM)] for 3 hours to increase the surface concentration of magnesium ions which were used to bind DNA on the silicon wafer. After 3 hours of incubation, the silicon wafer was directly immersed into the prepared DNA solution. The DNA solution together with the silicon wafer was slowly cooled from 95° C. to 23° C. in one day. After the annealing, the silicon wafer was taken out of the DNA solution, immediately immersed in ethanol:water (7:3) solution for 5 seconds, and then dried using nitrogen gas.

Preparation and Deposition of λ-DNA on a Silicon Wafer.

λ-DNA (500 µg/mL) was diluted in TAE/$Mg^{2+}$ buffer by three times. Since λ-DNA was difficult to attach to the silicon wafer, nickel ions were used to provide an extra binding force between DNA and the silicon wafer. Nickel chloride solution (100 µL of 1 mM) was deposited on the cleaned silicon wafer for 10 seconds and immediately dried using nitrogen gas. Then 10 µL of diluted λ-DNA solution was deposited on the silicon wafer and incubated in a humid chamber for 15 minutes. The sample was dried using nitrogen gas, immersed in ethanol:water (9:1) solution for 5 seconds, and then dried using nitrogen gas again.

Preparation and Deposition of the Triangular DNA Origami on a Silicon Wafer.

The design and assembly of the triangular DNA origami were previously reported. M13mp18 (1.6 nM) was mixed with 253 short staple strands (16 nM) in TAE/$Mg^{2+}$ buffer [Tris (40 mM, pH 8.0), acetic acid (20 mM), EDTA (1 mM), and Mg $(CH_3COO)_2$ (12.5 mM)]. The sample was cooled from 95° C. to 20° C. at the rate of 1° C./min. After the annealing, 100 µL of DNA origami solution was purified by rinsing away excess staple strands using 400 µL of TAE/$Mg^{2+}$ buffer in a 100 kDa MW centrifuge filter (Microcon YM-100, Millipore, Billerica, Mass.) on a single speed bench top microcentrifuge (VWR Galaxy Ministar). The rinsing process was repeated for another two times. The final volume of DNA origami solution was 100 µL, same as before the purification. Purified triangular DNA origami solution (10 µL) was deposited on the cleaned silicon wafer and incubated in a humid chamber for 15 minutes. The sample was dried using nitrogen gas, immersed in ethanol:water (9:1) solution for 5 seconds to remove the salts, and then dried using nitrogen gas again.

Fabrication of PMMA and PLLA Stamps Using DNA Nanostructures as Master Templates.

First, a PMMA or PLLA film was prepared by spin coating on a silicon wafer with DNA nanostructures (3% wt PMMA or PLLA dissolved in dichloromethane, 3000 rpm, 1 minute). Also, spin coating assists in providing a conformal coating of first polymer on the DNA nanostructure as describe above. Spin coating may be used to provide a generally flat surface for the surface of the spin-coated polymer that is not in contact with the master template. The spin coating was repeated three times to increase the film thickness. Second, four edges of the polymer film were scratched to remove ca. 1 mm width of the film to expose the underlying silicon substrate. Third, a polydimethylsiloxane (PDMS) film with a thickness of 1-2 mm adhered to the polymer film as a flexible backing. Fourth, several drops of water were added to one edge of the exposed silicon substrate and were allowed to penetrate into the interface between the hydrophobic polymer and hydrophilic silicon wafer. Fifth, after several seconds, as the interface was fully filled with water, the PDMS/polymer film was immediately peeled off and gently dried using nitrogen gas.

Fabrication of a-PFPE Polymer Stamps Using DNA Nanostructures as Master Templates.

a-PFPE prepolymer resin consisted of a fluorinated acrylate oligomer, CN 4002, and a photoinitiator, Irgacure 4265 (0.5 wt. %). The prepolymer resin was mixed for at least 2 hours using a Teflon magnetic stirrer on a stirring plate. This photocurable liquid resin was filtered through a 0.2 µm pore size syringe filter and spin-coated on the silicon wafer with DNA nanostructures at 4000 rpm for 30 seconds. On top of the spin-coated a-PFPE prepolymer film, the filtered a-PFPE liquid resin was pooled to make an a-PFPE film thick enough to be peeled off with a tweezer after curing. The a-PFPE prepolymer was cured with UV light (365 nm) for 2 hours under nitrogen gas. The a-PFPE composite stamp was peeled off from the wafer with a tweezer.

Replica Molding of Patterns on the PMMA or PLLA Stamps into the a-PFPE Film.

This process is similar to the one outlined above, except a PMMA or PLLA stamp was used.

Preparation of a PDMS Backing Film.

PDMS precursor was mixed with curing agent at a 9:1 (v/v) ratio. The prepolymer mixture was vigorously stirred by hand at least for 5 min and degassed in a vacuum desiccator. The mixture was poured over a piranha cleaned silicon wafer. The wafer with the mixture was placed in the vacuum desiccator for further degassing. The PDMS prepolymer on the silicon wafer was cured for 1 hour at 60° C. The thickness of the resulting PDMS layer was 1-2 mm.

Atomic Layer Deposition (ALD) of $Al_2O_3$ as a Protective Inorganic Film on a DNA Master Template.

ALD was conducted using a Fiji ALD system by Norman Gottron in Nanofabrication Facility at Carnegie Mellon University (Ultratech/CNT, Waltham, Mass., USA). Chamber and substrate heaters were set to 200° C. Total Ar gas flow was at 260 sccm and 200 mTorr. Trimethylaluminum (TMA) and $H_2O$ were used as precursors and one ALD cycle consisted of a 0.06 s long TMA pulse, a 10 s long interval, a 0.06 s long H2O pulse and a 10 s long interval. Deposition was looped 20 times, 50 times, and 200 times for the 2 nm, 5 nm, and 20 nm preset deposition thickness of the oxide films, respectively.

Fabrication of a PLLA Stamp Using a DNA Nanostructure Master Template with a Protective $Al_2O_3$ Film.

PLLA in dichloromethane solution (3 wt %) was spin-coated four times onto a DNA nanostructure master template with an $Al_2O_3$ film at 4000 rpm for 30 s. Around the border of PLLA film surface, the surface perimeter of the PLLA film with the widths of ca. 1 mm were scraped off to expose the underlying template. A PDMS stamp with a thick-ness of ca. 1-2 mm was placed on top of the PLLA film as a backing stamp. Droplets of water were added to the exposed edges of the template. If the water droplets filled out the inter-face between the PLLA film and the PDMS backing stamp, they were removed using a paper wiper to increase the adhesion between the polymer film and the backing stamp. After a minute, the PLLA/PDMS film was peeled off and the surface of the PLLA film was gently dried with $N_2$.

UV/Ozone Treatment.

DNA nanotube master template with an $Al_2O_3$ film was placed in a PSD Pro 4 Digital UV Ozone Cleaner (Novascan Technologies, Inc., Ames, Iowa, USA). Before UV irradiation, the chamber was flushed with $O_2$ for 3 min, and the sample was subjected to $UV/O_3$ treatment for 60 min at room temperature.

Atomic Force Microscopy (AFM) Analysis.

The imaging was performed by tapping-mode on an Asylum MFP-3D Atomic Force Microscope with NSC15/Al BS, RTESPA-300 or SSS-FMR-SPL AFM probes in the air. The tip—surface interaction was minimized by optimizing the scan set-point. NSC15/AL BS AFM probe (325 kHz, 40 N/m) was purchased from MikroMasch (Lady's Island, S.C.). RTESPA-300 AFM probe (300 kHz, 40 N/m) was purchased from Bruker (Camarillo, Calif.). SSS-FMR-SPL AFM probe (75 kHz, 2.8 N/m) was purchased from Nano-AndMore USA (Watsonville, Calif.) and was used for the high-resolution imaging of DNA triangles and triangular patterns on the PMMA and PLLA. The Fourier transform was carried out by ImageJ, an imaging processing software. See, Schneider, C. A.; Rasband, W. S.; Eliceiri, K. W. NIH Image to ImageJ: 25 Years of Image Analysis. *Nat. Methods* 2012, 9, 671-675, the disclosure of which is incorporated herein by reference.

Transmission Electron Micropcy (TEM).

Annealed sample of DNA brick crystals (2.5 µL) was adsorbed on a glow-discharge-treated carbon coated TEM grid for 2 minutes. The grid was then stained by a 2% aqueous uranyl formate solution containing 25 mM NaOH for 10 seconds. Imaging was performed using a JEOL JEM-1400 TEM operating at 80 kV.

Ellipsometry:

The experimental thickness of an $Al_2O_3$ film was measured by an Alpha-Spectroscopic Ellipsometer with Complete Ease Software using Cauchy model (JA Woollam Co., Lincoln, Nebr., USA). Duration time was "Standard" and the measurement angle was 70°. For each sample, the average thickness of the $Al_2O_3$ layer was obtained by measuring the thick-ness with MSE values below 5 at five different locations.

The foregoing description and accompanying drawings set forth a number of representative embodiments at the present time. Various modifications, additions and alternative designs will, of course, become apparent to those skilled in the art in light of the foregoing teachings without departing from the scope hereof, which is indicated by the following claims rather than by the foregoing description. All changes and variations that fall within the meaning and range of equivalency of the claims are to be embraced within their scope.

What is claimed is:

1. A method of forming a patterned device, comprising:
depositing at least one nanostructure comprising self-assembled nucleic acids formed into a predetermined conformation upon a surface of a substrate,
depositing a stabilizing layer having a thickness in the range of 2 nm to 15 nm of material mechanically stronger than the at least one nanostructure and selected from the group of a metal, a metal oxide or a nonmetallic, inorganic oxide over the at least one nanostructure and a remainder of the surface of the substrate to form a positive pattern template,
depositing a layer of a first polymer over the positive pattern template, and
removing the layer of the first polymer from connection with the positive pattern template, wherein the layer of the first polymer includes a surface having a negative imprint of the positive pattern template.

2. The method of claim 1 further comprising, after removal of the layer of the first polymer, depositing a layer of a second polymer over the surface of the layer of the first polymer having the negative imprint to create a positive copy of the negative imprint upon a surface of the layer of the second polymer.

3. The method of claim 1 wherein the stabilizing layer is deposited via a thin film technique.

4. The method of claim 1 wherein the stabilizing layer is deposited via atomic layer deposition, vacuum deposition, sputtering, chemical vapor deposition or laser assisted deposition.

5. The method of claim 1 wherein the stabilizing layer comprises a metal oxide or a nonmetallic, inorganic oxide.

6. The method of claim 1 wherein the stabilizing layer comprises aluminum oxide or silicon oxide.

7. The method of claim 1 wherein the stabilizing layer comprises aluminum oxide.

8. The method of claim 5 wherein the stabilizing layer has a thickness in the range of 3 nm to 15 nm.

9. The method of claim 5 wherein the stabilizing layer has a thickness in the range of 3 nm to 10 nm.

10. The method of claim 1 further comprising depositing a layer of a third polymer over the layer of the first polymer before removing the layer of the first polymer from connection with the positive pattern template.

11. The method of claim 1 wherein the nucleic acids comprise DNA.

12. The method of claim 1 wherein the layer of the first polymer is deposited upon the positive pattern template in solution.

13. The method of claim 1 wherein the layer of the first polymer is deposited upon the positive pattern template via spin casting.

14. The method of claim 1 wherein the at least one nanostructure has at least one dimension of no greater than 80 nm.

15. The method of claim 14 wherein the at least one nanostructure has at least one dimension in the range of 1 nm to 80 nm.

16. The method of claim 1 wherein the stabilizing layer has a thickness in the range of 3 nm to 15 nm.

17. The method of claim 16 wherein the at least one nanostructure has at least one dimension in the range of 1 nm to 80 nm.

18. The method of claim 16 further comprising, after removal of the layer of the first polymer which is hydrophilic, depositing a layer of a second polymer over the surface of the layer of the first polymer having the negative imprint to create a positive copy of the negative imprint upon a surface of the layer of the second polymer.

19. The method of claim 16 wherein the nucleic acids comprise DNA.

20. The method of claim 1 wherein the first polymer is a hydrophobic polymer and water is added to at least one edge of an assembly layer of the first polymer deposited over the positive pattern template before removing the layer of the first polymer from connection with the positive pattern template.

* * * * *